(12) United States Patent
Kano et al.

(10) Patent No.: US 7,279,195 B2
(45) Date of Patent: Oct. 9, 2007

(54) METHOD OF FORMING METAL FINE PARTICLE PATTERN AND METHOD OF FORMING ELECTROCONDUCTIVE PATTERN

(75) Inventors: Takeyoshi Kano, Shizuoka (JP); Koichi Kawamura, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/921,355

(22) Filed: Aug. 19, 2004

(65) Prior Publication Data

US 2005/0064108 A1 Mar. 24, 2005

(30) Foreign Application Priority Data

Aug. 20, 2003 (JP) ............................. 2003-208053
Aug. 17, 2004 (JP) ............................. 2004-237004

(51) Int. Cl.
*B05D 3/00* (2006.01)
*G03F 7/04* (2006.01)
*G03F 7/09* (2006.01)
*G03F 7/11* (2006.01)
*G03F 7/23* (2006.01)

(52) U.S. Cl. ..................... 427/229; 427/553; 427/98.5; 427/99.2; 427/126.1; 427/205; 427/261; 427/407.1; 427/419.1

(58) Field of Classification Search ............... 427/532, 427/553, 557, 558, 595, 58, 96.1, 98.4, 98.5, 427/98.6, 99.2, 126.1, 180, 202, 205, 372.2

See application file for complete search history.

(56) References Cited

U.S. PATENT DOCUMENTS

2004/0067434 A1* 4/2004 Kano et al. .............. 430/270.1

FOREIGN PATENT DOCUMENTS

| EP | 1 271 561 A2 * | 1/2005 |
| JP | 09-246716 A | 9/1997 |
| JP | 2001-53488 A | 2/2001 |
| JP | 2001-110050 A | 4/2001 |

* cited by examiner

*Primary Examiner*—William Phillip Fletcher, III
(74) *Attorney, Agent, or Firm*—Sughrue Mion Pllc.

(57) ABSTRACT

A method of forming a metal fine particle pattern including forming a polymerization initiation layer on a support, wherein a polymer which has, in its side chain, a cross-linking group and a functional group having the ability to initiate polymerization is fixed by a cross-linking reaction, forming a graft polymer region in a pattern on the surface of the polymerization initiation layer, wherein the graft polymer layer has the ability to contain a metal ion or a metal salt, adding a metal ion or a metal salt to the graft polymer layer, and thereafter reducing the metal ion or a metal ion in the metal salt to form a metal fine particle dispersion region; and a method of forming an electroconductive pattern using the method of forming a metal fine particle pattern.

23 Claims, 1 Drawing Sheet

[Fig. 1]
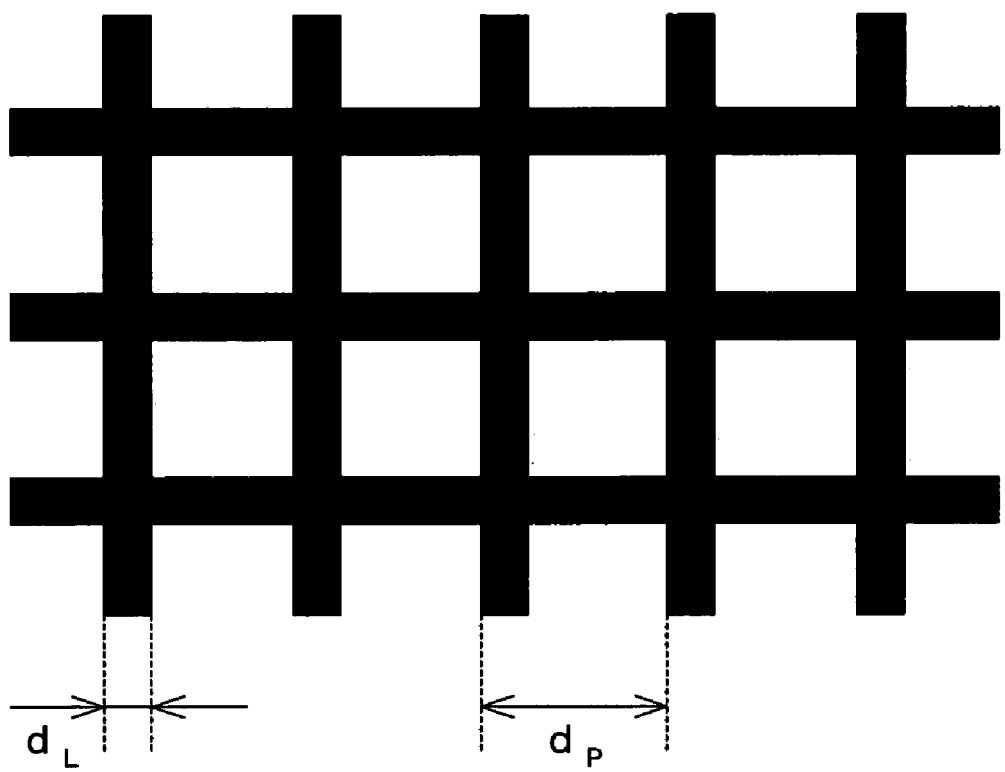

METHOD OF FORMING METAL FINE PARTICLE PATTERN AND METHOD OF FORMING ELECTROCONDUCTIVE PATTERN

CROSS-REFERENCE TO RELATED APPLICATION

This application claims priority under 35 USC 119 from Japanese Patent Application Nos. 2003-208053 and 2004-237004, the disclosures of which are incorporated by reference herein.

BACKGROUND OF THE INVENTION

1. Field of the Invention

The present invention relates to a method of forming a metal fine particle pattern and a method of forming an electroconductive pattern, and particularly relates to a method including the step of forming a thin film or fine particle region of a metal such as silver and copper so as to form a metal fine particle pattern or an electroconductive pattern which is useful for electric wiring materials, electromagnetic wave-blocking films, magnetic films, or the like and has high density and good durability and productivity.

2. Description of the Related Art

Conventionally, a variety of electroconductive pattern materials have been used to form wiring substrates and the like. A typical method of forming such patterns includes the steps of: forming a thin film of an electroconductive material on an insulating material by a known method such as vacuum deposition; subjecting it to a resist process; performing pattern exposure to remove part of the previously formed resist; and then performing etching to form the desired pattern. Such a method of forming patterns requires at least four steps. If wet etching is further performed, the step of treating its waste liquid will be required. Thus, the conventional method has to use a complicated process.

There is another known method which uses a photoresist to form an electroconductive pattern material. This method includes the steps of providing a substrate having a photoresist polymer coating or having a photoresist attached on a dry film and exposing the substrate to UV light through a certain photomask so that a pattern such as a grid pattern is formed. For example, such a method is disclosed in Japanese Patent Application Laid-Open (JP-A) No. 2001-53488. Such a method is useful in forming an electromagnetic wave shield which is required to have high electroconductivity.

In recent years, as micromachines and a smaller version of VLSI have been developed, their wiring structure has been required to be as small as nano-metric scale. However, the conventional metal etching has a limit to how fine a structure it can produce, and a small wiring part can break when worked.

Attention is focused not only on such a continuous thin metal film but also on a metal fine particle pattern which is formed by selective adsorption of metal fine particles onto a specific region.

In recent years, as an advanced information society has been developed, there have been remarkable advances in electronic instruments. Particularly, the advances in computer technology, which support the development of the advanced information society, significantly contribute to the production of high recording density magnetic disks as well as to the production of high-density semiconductor LSI. In the production of high recording density magnetic disks, there has been a demand for a defect reduction to a minimum and a demand for high flatness, with respect to the magnetic medium layer. For these purposes, a film is currently used which comprises metal fine particles with magnetic properties dispersed on the surface of a substrate. In addition, JP-A No. 2001-110050 discloses that if such metal fine particles are arranged in a pattern, the recording capacity can be increased. Thus, forming a metal fine particle adsorption region in a pattern has become more important. However, such a known method of forming a metal fine particle pattern, which can immediately lead to an improvement in recording density, also has a problem similar to that with the method of forming the thin metal film pattern. Thus, it has also been difficult to form a metal fine particle pattern of very small size at high resolution.

SUMMARY OF THE INVENTION

The present invention has been made in consideration of the above disadvantages of the prior art and has the objects below. It is an object of the invention to provide a method of forming a metal fine particle pattern, which can produce a metal fine particle pattern material at high productivity by a simple process, wherein the metal fine particle pattern material comprises a metal fine particle adsorption region which is formed in the desired pattern and in which metal fine particles are dispersed at high density with good adhesion and durability.

It is another object of the invention to provide a method of forming an electroconductive pattern, which can produce an electroconductive pattern material having high electroconductivity and wide applicability. It is yet another object of the invention to provide a method of forming an electroconductive pattern, which can produce an electroconductive pattern material suited for the production of an electromagnetic wave shield and other materials which should have high electroconductivity and desired patterns.

The present inventors have found that the above problems can be solved by the means as shown below in completing the invention.

A first aspect of the invention is to provide a method of forming a metal particle pattern, comprising: forming a polymerization initiation layer on a support, wherein a polymer which has, in its side chain, a cross-linking group and a functional group having the ability to initiate polymerization is fixed by a cross-linking reaction; forming a graft polymer region in a pattern on a surface of the polymerization initiation layer, wherein the graft polymer region has the ability to contain a metal ion or a metal salt; adding a metal ion or a metal salt to the graft polymer region; and thereafter reducing the metal ion or a metal ion in the metal salt to form a metal fine particle dispersion region.

In the method of forming the metal fine particle pattern according to the invention, for example, the means or the method as shown below is used to form the patterned graft polymer region having the ability to contain a metal ion or a metal salt on the surface of the polymerization initiation layer.

First, a graft polymer layer is formed all over the surface of the polymerization initiation layer, wherein the graft polymer layer directly chemically bonds to the surface of the polymerization initiation layer and has the ability to contain a metal ion or a metal salt. A photo-thermal conversion material is added to the polymerization initiation layer or the graft polymer layer. Pattern exposure is then performed so that heat is generated from a patterned part of the photo-thermal conversion material and that the main or side chain of the polymer compound which constituted the graft polymer layer is cleaved. In the graft polymer layer, therefore, only the exposed part loses the ability to contain a metal ion or salt so that a patterned graft polymer region is formed which keeps the ability to contain a metal ion or salt in the graft polymer layer.

The main or side chain of the polymer forming the polymerization initiation layer may also be cleaved by heat generated from a patterned part of the photo-thermal conversion material when pattern exposure is performed. In the polymerization initiation layer, therefore, the fixed polymer is cleaved and can easily be peeled off only at the exposed region. Accordingly, the exposed part of the polymerization initiation layer is removed together with the part of the graft polymer layer so that there is left a patterned part of the graft polymer layer, which has the ability to contain a metal ion or salt.

Any other means may be used to alter the polarity of the surface of the graft polymer layer or to form a graft polymer layer in a pattern. The method of forming the metal fine particle pattern using such means is described below.

A second aspect of the invention is to provide a method of forming a metal fine particle pattern, comprising: forming a polymerization initiation layer on a support, wherein a polymer which has, in its side chain, a cross-linking group and a functional group having the ability to initiate polymerization is fixed by a cross-linking reaction; forming, on a surface of the polymerization initiation layer, a graft polymer layer whose hydrophilicity or hydrophobicity can be changed by heat, acid or radiation; applying heat, acid or radiation to the graft polymer layer to form a pattern comprising a hydrophilic region and a hydrophobic region; adding a metal ion or a metal salt to the hydrophilic region or the hydrophobic region; and thereafter reducing the metal ion or a metal ion in the metal salt to form a metal fine particle dispersion region.

A third aspect of the invention is to provide a method of forming a metal fine particle pattern, comprising: forming a polymerization initiation layer on a support, wherein a polymer which has, in its side chain, a cross-linking group and a functional group having the ability to initiate polymerization is fixed by a cross-linking reaction; forming a graft polymer layer in a pattern on a surface of the polymerization initiation layer; adding a metal ion or a metal salt to the graft polymer layer; and thereafter reducing the metal ion or a metal ion in the metal salt to form a metal fine particle dispersion region.

A fourth aspect of the invention is to provide a method of forming an electroconductive pattern, comprising: forming a polymerization initiation layer on a support, wherein a polymer which has, in its side chain, a cross-linking group and a functional group having the ability to initiate polymerization is fixed by a cross-linking reaction; forming a graft polymer region in a pattern on a surface of the polymerization initiation layer, wherein the graft polymer region has the ability to contain a metal ion or a metal salt; adding a metal ion or a metal salt to the graft polymer region; and thereafter reducing the metal ion or a metal ion in the metal salt to form a metal fine particle dispersion region; and heating, to a temperature of 100 to 400° C., the patterned material that forms the metal fine particle dispersion region.

In the method of forming the electroconductive pattern according to the invention, some means may be used to eliminate (peel off) the ability to contain the metal ion or salt in a pattern, to alter the polarity of the surface of the graft polymer layer, or to form a graft polymer region in a pattern, as stated above, in the process of forming, on the surface of the polymerization initiation layer, the patterned graft polymer region having the ability to contain a metal ion or salt. Such a method of forming an electroconductive pattern is shown below, which uses the means to alter the polarity of the surface of the graft polymer layer or the means to form the patterned graft polymer layer.

A fifth aspect of the invention is to provide a method of forming an electroconductive pattern, comprising: forming a polymerization initiation layer on a support, wherein a polymer which has, in its side chain, a cross-linking group and a functional group having the ability to initiate polymerization is fixed by a cross-linking reaction; forming, on a surface of the polymerization initiation layer, a graft polymer layer whose hydrophilicity or hydrophobicity can be changed by heat, acid or radiation; applying heat, acid or radiation to the graft polymer layer to form a pattern comprising a hydrophilic region and a hydrophobic region; adding a metal ion or a metal salt to the hydrophilic region or the hydrophobic region; and thereafter reducing the metal ion or a metal ion in the metal salt to form a metal fine particle dispersion region; and heating, to a temperature of 100 to 400° C., the patterned material that forms the metal fine particle dispersion region.

A sixth aspect of the invention is to provide a method of forming an electroconductive pattern, comprising: forming a polymerization initiation layer on a support, wherein a polymer which has, in its side chain, a cross-linking group and a functional group having the ability to initiate polymerization is fixed by a cross-linking reaction; forming a graft polymer layer in a pattern on a surface of the polymerization initiation layer; adding a metal ion or a metal salt to the graft polymer layer; and thereafter reducing the metal ion or a metal ion in the metal salt to form a metal fine particle dispersion region; and heating, to a temperature of 100 to 400° C., the patterned material that forms the metal fine particle dispersion region.

In the method of forming the metal fine particle or electroconductive pattern according to the invention, the step of forming the polymerization initiation layer preferably uses a cross-linking agent in order to fix, by the cross-linking reaction, the polymer having the cross-linking group and the functional group with the ability to initiate polymerization in its side chain.

BRIEF DESCRIPTION OF THE DRAWINGS

FIG. 1 is a diagram showing Line width and Pitch width according to the present invention.

DETAILED DESCRIPTION OF THE INVENTION

The present invention is described in detail below.

[Method of Forming Metal Fine Particle Pattern]

A description is provided of the method of forming the metal fine particle pattern according to the invention.

According to the invention, the method of forming the metal fine particle pattern comprises: forming a polymerization initiation layer on a support, wherein a polymer which has, in its side chain, a cross-linking group and a functional group having the ability to initiate polymerization is fixed by a cross-linking reaction; forming a graft polymer region in a pattern on a surface of the polymerization initiation layer, wherein the graft polymer region has the ability to contain a metal ion or a metal salt; adding a metal ion or a metal salt to the graft polymer region; and thereafter reducing the metal ion or a metal ion in the metal salt to form a metal fine particle dispersion region.

In the method of forming the metal fine particle pattern according to the invention, any of the three methods as shown below may be used to form the patterned graft polymer region having the ability to contain the metal ion or salt on the surface of the polymer initiation layer, though such three methods are not intended to limit the scope of the invention.

1. A graft polymer layer is formed all over the surface of the polymerization initiation layer, wherein the graft polymer layer directly chemically bonds to the surface of the polymerization initiation layer and has the ability to contain a metal ion or a metal salt. A photo-thermal conversion material is added to the polymerization initiation layer or the graft polymer layer. Pattern exposure is then performed so that heat is generated from a patterned part of the photo-thermal conversion material and that the main or side chain of the polymer compound which constituted the graft polymer layer is cleaved. In the graft polymer layer, therefore, only the exposed part loses the ability to contain a metal ion or salt so that a patterned graft polymer region is formed which keeps the ability to contain a metal ion or salt.

The main or side chain of the polymer forming the polymerization initiation layer may also be cleaved by heat generated from the patterned part of the photo-thermal conversion material when pattern exposure is performed. In the polymerization initiation layer, therefore, the fixed polymer is cleaved and can easily be peeled off only at the exposed region. Accordingly, the exposed part of the polymerization initiation layer is removed together with the part of the graft polymer layer so that there is left a patterned part (region) of the graft polymer layer having the ability to contain a metal ion or salt.

As shown above, one of the methods of forming, on the surface of the polymerization initiation layer, the patterned graft polymer region having the ability to contain the metal ion or salt may use means to partially eliminate (in a pattern) the ability to contain the metal ion or salt from the graft polymer layer, which is formed all over the surface of the polymerization initiation layer, or may use means to peel off a part of the graft polymer layer together with a part of the polymerization initiation layer so as to allow the remaining part of the graft polymer layer to form a pattern (region).

The other two means include (2) means to alter the polarity of the surface of the graft polymer layer and (3) means to form a graft polymer layer in a pattern. The method of forming the metal fine particle pattern using each of these means is shown below.

The two methods are described in detail below, which are each suited for the method of forming the metal fine particle pattern according to the invention.

First, a description is provided of the method of forming the metal fine particle pattern using (2) means to alter the polarity of the surface of the graft polymer layer. Hereinafter, such a method is referred to as the first embodiment of the method of forming the metal fine particle pattern.

The first embodiment of the method of forming the metal fine particle pattern according to the invention comprises: forming a polymerization initiation layer on a support, wherein a polymer which has, in its side chain, a cross-linking group and a functional group having the ability to initiate polymerization is fixed by a cross-linking reaction (hereinafter referred to as the polymerization initiation layer-forming step); forming, on a surface of the polymerization initiation layer, a graft polymer layer whose hydrophilicity or hydrophobicity can be changed by heat, acid or radiation and applying heat, acid or radiation to the graft polymer layer to form a pattern comprising a hydrophilic region and a hydrophobic region (hereinafter referred to as the pattern-forming step); and adding a metal ion or a metal salt to the hydrophilic region and thereafter reducing the metal ion or a metal ion in the metal salt to form a metal fine particle dispersion region (hereinafter referred to as the metal fine particle dispersion region-forming step).

In the first embodiment of the method of forming the metal fine particle pattern according to the invention, if the graft polymer layer is changed from hydrophobic to hydrophilic by the application of heat, acid or radiation, the hydrophilic region-forming part of the graft polymer layer would have the function of adsorbing the metal ion or salt. If the graft polymer layer is changed from hydrophilic to hydrophobic by the application of heat, acid or radiation, the hydrophobic region-forming part of the graft polymer layer would have the function of adsorbing the metal ion or salt and thus would have the ability to contain the metal ion or salt.

A description is provided below of the polymerization initiation layer and the step of forming the same (the polymerization initiation layer-forming step), the graft polymer layer comprising the hydrophilic region and the hydrophobic region and the step of forming the same (the pattern-forming step), and the metal fine particle dispersion region and the step of forming the same (the metal fine particle dispersion region-forming step) in the first embodiment of the method of forming the metal fine particle pattern according to the invention.

<Polymerization Initiation Layer and the Step of Forming the Same (the Polymerization Initiation Layer-Forming Step)>

First, a description is provided of the polymer having a cross-linking group and a functional group having the ability to initiate polymerization in its side chain (hereinafter sometimes referred to as the specific polymerization initiation polymer) for use in the present step.

The specific polymerization initiation polymer is preferably a copolymer which comprises: a copolymer component with the functional group having the ability to initiate polymerization (hereafter sometimes referred to as the polymerization initiation group); and a copolymer component having the cross-linking group.

As shown above, the polymerization initiation layer formed according to the invention comprises the specific polymerization initiation polymer. In the specific polymerization initiation polymer, the polymerization initiation group is coupled to the polymer chain which is fixed by the cross-linking reaction. According to the invention, the graft polymer is produced on the surface of such a polymerization initiation layer. When a solution that contains a compound having a polymerizable group is brought into contact with the polymerization initiation layer in the graft-forming step as described below, therefore, the initiator component (the component having the ability to initiate polymerization) can be prevented from being eluted from the polymerization initiation layer to the solution. The method of forming the polymerization initiation layer may use not only a general radical cross-linking reaction but also a condensation or addition reaction between polar groups. Such a reaction can produce a more strongly cross-linked structure. Thus, the initiator component can efficiently be prevented from being eluted from the polymerization initiation layer. Such a process can also inhibit the by production of a homopolymer, which would not be directly coupled to the surface of the polymerization initiation layer, so that only a graft polymer directly coupled to the surface of the polymerization initiation layer can be produced.

Each component of the polymer of the specific polymerization initiation layer is described in detail below.

[Copolymer Component with the Functional Group Having the Ability to Initiate Polymerization]

In the specific polymerization initiation polymer, the copolymer component having the polymerization initiation group preferably comprises a radically, anionically or cationically polymerizable group and any of the structures as shown below, which has the ability to initiate polymerization and is pendent from the polymerizable group. Thus, such a copolymer component has both the polymerizable group and the functional group having the ability to initiate polymerization in its molecular structure.

Examples of the structure having the ability to initiate polymerization include (a) aromatic ketones, (b) onium salt compounds, (c) organic peroxides, (d) thio compounds, (e) hexaarylbiimidazole compounds, (f) ketoxime ester compounds, (g) borate compounds, (h) azinium compounds, (i) active ester compounds, (j) carbon-halogen bond-bearing compounds, and (k) pyridinium type compounds. Specific examples of (a) to (k) are shown below, but such examples are not intended to limit the scope of the invention.

(a) Aromatic Ketones

In the invention, preferred examples of (a) aromatic ketone for use as the structure having the ability to initiate polymerization include the compounds having a benzophenone skeleton or a thioxanthone skeleton as disclosed in J. P. Fouassier and J. F. Rabek, RADIATION CURING IN POLYMER SCIENCE AND TECHNOLOGY, pp. 77-117, 1993, such as the following compounds:

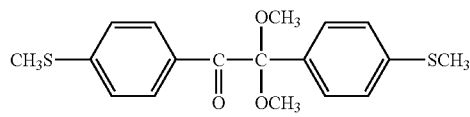
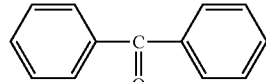
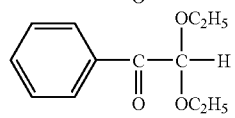
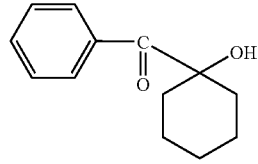
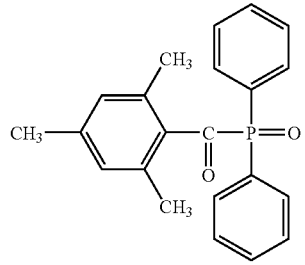
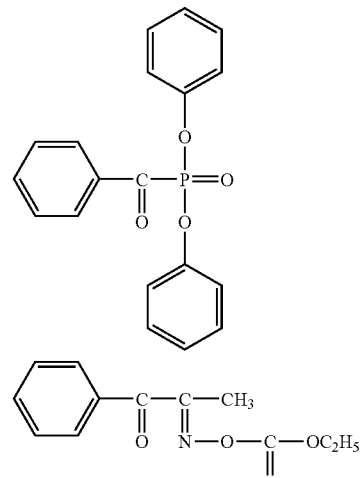
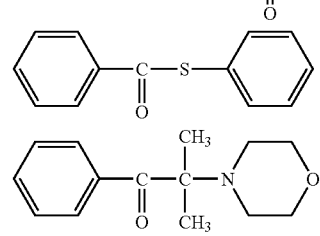
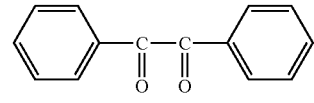
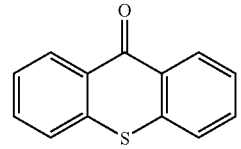
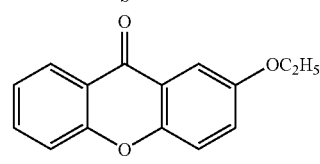
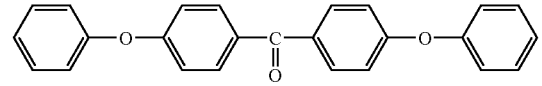

In particular, preferred examples of (a) aromatic ketones include:

α-thiobenzophenone compounds as disclosed in Japanese Patent Application Publication (JP-B) No. 47-6416 and benzoin ether compounds as disclosed in JP-B No. 47-3981, such as the following compound:

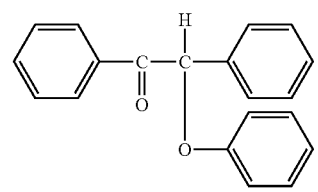

α-substituted benzoin compounds as disclosed in JP-B No. 47-22326, such as the following compound:

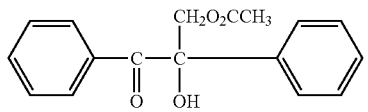

benzoin derivatives as disclosed in JP-B No. 47-23664, aroyl phosphonate esters as disclosed in JP-A No. 57-30704 and dialkoxybenzophenone as disclosed in JP-B No. 60-26483, such as the following compound:

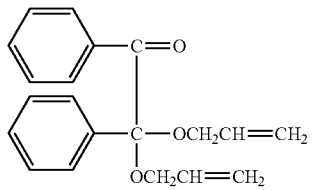

benzoin ethers as disclosed in JP-B No. 60-26403 and JP-A No. 62-81345, such as the following compound:

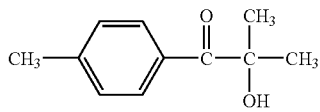

α-aminobenzophenones as disclosed in JP-B No. 01-34242, U.S. Pat. No. 4,318,791 and European Patent No. 0284561 A1, such as the following compounds:

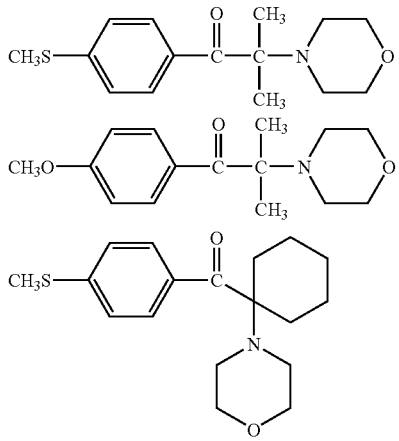

p-di(dimethylaminobenzoyl)benzene as disclosed in JP-A No. 02-211452, such as the following compound:

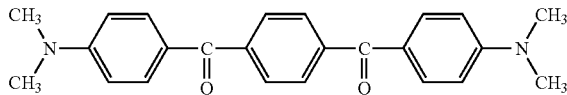

thio-substituted aromatic ketone as disclosed in JP-A No. 61-194062, such as the following compound:

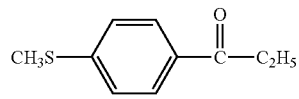

acylphosphine sulfide as disclosed in JP-B No. 02-9597, such as the following compounds:

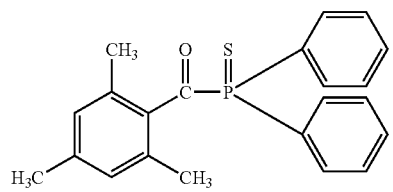

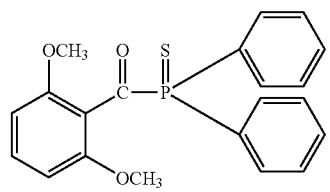

acylphosphine as disclosed in JP-B No. 02-9596, such as the following compounds:

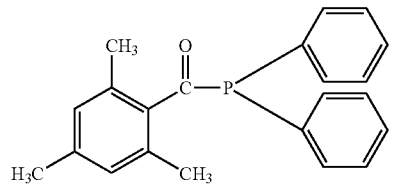

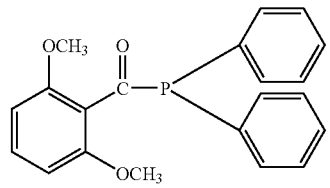

thioxanthones as disclosed in JP-B No. 63-61950, and coumarin and its analogs as disclosed in JP-B No. 59-42864.

(b) Onium Salt Compounds

In the invention, preferred examples of (b) onium salt compound for use as the structure having the ability to initiate polymerization include the compounds represented by each of Formulae (1) to (3) below.

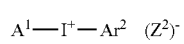  Formula (1)

  Formula (2)

-continued

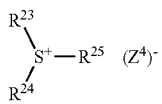

Formula (3)

In Formula (1), $Ar^1$ and $Ar^2$ each independently represent optionally substituted aryl of at most 20 carbon atoms. The substituent of the substituted aryl is preferably a halogen atom, nitro, alkyl of at most 12 carbon atoms, alkoxy of at most 12 carbon atoms, or aryloxy of at most 12 carbon atoms. $(Z^2)^-$ represents a counter ion selected from the group consisting of halogen ion, perchlorate ion, carboxylate ion, tetrafluoroborate ion, hexafluorophosphate ion, and sulfonate ion, and preferably represents perchlorate ion, hexafluorophosphate ion, or arylsulfonate ion.

In Formula (2), $Ar^3$ represents optionally substituted aryl of at most 20 carbon atoms. The substituent is preferably a halogen atom, nitro, alkyl of at most 12 carbon atoms, alkoxy of at most 12 carbon atoms, aryloxy of at most 12 carbon atoms, alkylamino of at most 12 carbon atoms, dialkylamino of at most 12 carbon atoms, arylamino of at most 12 carbon atoms, or diarylamino of at most 12 carbon atoms. $(Z^3)^-$ represents a counter ion having the same meaning as $(Z^2)^-$.

In Formula (3), $R^{23}$, $R^{24}$ and $R^{25}$ each represent an optionally substituted hydrocarbon group of at most 20 carbon atoms. $R^{23}$, $R^{24}$ and $R^{25}$ may be the same or different. The substituent is preferably a halogen atom, nitro, alkyl of at most 12 carbon atoms, alkoxy of at most 12 carbon atoms, or aryloxy of at most 12 carbon atoms. $(Z^4)^-$ represents a counter ion having the same meaning as $(Z^2)^-$.

Preferred examples of (b) onium salt compound for use in the invention include those disclosed in JP-A No. 2001-133969, paragraphs [0030]-[0033], JP-A No. 2001-305734, paragraphs [0048]-[0052] and JP-A No. 2001-343742, paragraphs [0015]-[0046].

(c) Organic Peroxides

Preferred examples of (c) organic peroxide for use as the structure having the ability to initiate polymerization include most organic compounds having at least one oxygen-oxygen bond in the molecule. Specific examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-hexanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di(tert-butylperoxy dihydrogen diphthalate), and carbonyl di(tert-hexylperoxy dihydrogen diphthalate).

Preferred are peroxide esters such as 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, and di-tert-butyl diperoxyisophthalate.

(d) Thio Compounds

In the invention, preferred examples of (d) thio compound for use as the structure having the ability to initiate polymerization include the compounds represented by Formula (4):

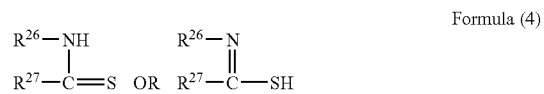

Formula (4)

wherein $R^{26}$ represents alkyl, aryl or substituted aryl; $R^{27}$ represents a hydrogen atom or alkyl; or $R^{26}$ and $R^{27}$ represent nonmetallic atomic groups which are necessary for coupling to each other and for forming a five- to seven-membered ring optionally having a hetero atom selected from oxygen atom, sulfur atom and nitrogen atom.

In Formula (4), the alkyl preferably has 1 to 4 carbon atoms, and the aryl is preferably aryl of 6 to 10 carbon atoms, such as phenyl and naphthyl. Examples of the substituted aryl include halogen atom-substituted aryl such as chlorine atom-substituted aryl, alkyl-substituted aryl such as methyl-substituted aryl, and alkoxy-substituted aryl such as methoxy-substituted aryl and ethoxy-substituted aryl. $R^{27}$ is preferably alkyl of 1 to 4 carbon atoms. Examples of the thio compound represented by Formula (4) include the following compounds:

TABLE 1

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |

TABLE 1-continued

| No. | R^26 | R^27 |
|---|---|---|
| 25 | | —(CH$_2$)$_3$—S— |
| 26 | | —(CH$_2$)$_2$—CH(CH$_3$)—S— |
| 27 | | —(CH$_2$)$_3$—O— |
| 28 | | —(CH$_2$)$_5$— |
| 29 | | —C$_6$H$_4$—O— |
| 30 | | —N=C(SCH$_3$)—S— |
| 31 | | —C$_6$H$_4$—NH— |
| 32 | 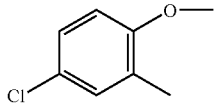 | |

(e) Hexaarylbiimidazole Compounds

In the invention, preferred examples of (e) hexaarylbiimidazole compound for use as the structure having the ability to initiate polymerization include lophine dimers as disclosed in JP-B Nos. 45-37377 and 44-86516, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenylbiimidazole.

(f) Ketoxime Ester Compounds

In the invention, preferred examples of (f) ketoxime ester compound for use as the structure having the ability to initiate polymerization include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

(g) Borate Compounds

In the invention, preferred examples of (g) borate compound for use as the structure having the ability to initiate polymerization include the compounds represented by Formula (5):

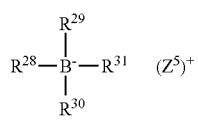

Formula (5)

wherein $R^{28}$, $R^{29}$, $R^{30}$, and $R^{31}$ each represent substituted or unsubstituted alkyl, substituted or unsubstituted aryl, substituted or unsubstituted alkenyl, substituted or unsubstituted alkynyl, or a substituted or unsubstituted heterocyclic group; $R^{28}$, $R^{29}$, $R^{30}$, and $R^{31}$ may be the same or different; two or more of $R^{28}$, $R^{29}$, $R^{30}$, and $R^{31}$ may be coupled to form a ring structure; at least one of $R^{28}$, $R^{29}$, $R^{30}$, and $R^{31}$ is substituted or unsubstituted alkyl; and $(Z^5)^+$ represents an alkali metal cation or a quaternary ammonium cation.

The alkyl of any of $R^{28}$ to $R^{31}$ may be straight-chain, branched or cyclic and preferably has 1 to 18 carbon atoms. Examples thereof include methyl, ethyl, propyl, isopropyl, butyl, pentyl, hexyl, octyl, stearyl, cyclobutyl, cyclopentyl, and cyclohexyl. On any of the above alkyl groups, for example, the substituted alkyl has a substituent such as a halogen atom (such as —Cl and —Br), cyano, nitro, aryl (preferably phenyl), hydroxyl, —COOR$^{32}$ (wherein R$^{32}$ represents a hydrogen atom, alkyl of 1 to 14 carbon atoms or aryl), —OCOR$^{33}$ or —OR$^{34}$ (wherein R$^{33}$ and R$^{34}$ each represent alkyl of 1 to 14 carbon atoms or aryl) and the substituent represented by the following formula:

wherein $R^{35}$ and $R^{36}$ each independently represent a hydrogen atom, alkyl of 1 to 14 carbon atoms or aryl.

Examples of the aryl of any of $R^{28}$ to $R^{31}$ include aryl groups of 1 to 3 rings such as phenyl and naphthyl. On any of the above aryl groups, the substituted aryl may have any of the above substituents for the substituted alkyl or an alkyl substituent of 1 to 14 carbon atoms. Examples of the alkenyl of any of $R^{28}$ to $R^{31}$ include straight-chain, branched or cyclic alkenyl groups of 2 to 18 carbon atoms. Examples of the substituent of the substituted alkenyl include those for the substituted alkyl. Examples of the alkynyl of any of $R^{28}$ to $R^{31}$ include straight-chain or branched alkynyl groups of 2 to 28 carbon atoms. Examples of the substituent of the substituted alkynyl include those for the substituted alkyl. For example, the heterocyclic group of any of $R^{28}$ to $R^{31}$ is a five- or more-membered, preferably five- to seven-membered heterocyclic group having at least one of N, S and O. Such a heterocyclic group may contain a fused ring and may have any of the above substituents for the substituted aryl. Specific examples of the compound represented by Formula (5) include the compounds disclosed in U.S. Pat. Nos. 3,567,453 and 4,343,891 and European Patent Nos. 109,772 and 109,773 and the following compounds:

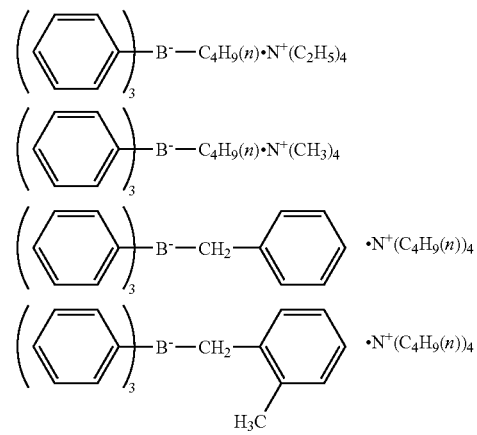

(h) Azinium Compounds

In the invention, preferred examples of (h) azinium compound for use as the structure having the ability to initiate polymerization include a group of N—O bond-bearing compounds as disclosed in JP-A Nos. 63-138345, 63-142345, 63-142346, and 63-143537, and JP-B No. 46-42363.

(i) Active Ester Compounds

In the invention, preferred examples of (i) active ester compound for use as the structure having the ability to initiate polymerization include imidosulfonate compounds as disclosed in JP-B No. 62-6223 and active sulfonate compounds as disclosed in JP-B No. 63-14340 and JP-A No. 59-174831.

(j) Carbon-Halogen Bond-Bearing Compounds

In the invention, preferred examples of (j) carbon-halogen bond-bearing compound for use as the structure having the ability to initiate polymerization include the compounds represented by Formulae (6) to (12) below, respectively.

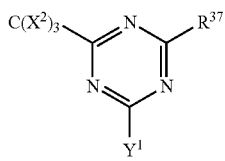

Formula (6)

wherein $X^2$ represent a halogen atom; $Y^1$ represents $—C(X^2)_3$, $—NH_2$, $—NHR^{38}$, $—NR^{38}$, or $—OR^{38}$, wherein $R^{38}$ represents alkyl, substituted alky, aryl, or substituted aryl; and $R^{37}$ represents $—C(X^2)_3$, alky, substituted alkyl, aryl, substituted aryl, or substituted alkenyl.

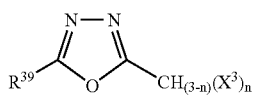

Formula (7)

wherein $R^{39}$ represents alky, substituted alkyl, alkenyl, substituted alkenyl, aryl, substituted aryl, a halogen atom, alkoxy, substituted alkoxyl, nitro, or cyano; $X^3$ represents a halogen atom; and n is an integer of 1 to 3.

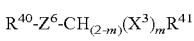

Formula (8)

wherein $R^{40}$ represents aryl or substituted aryl; $R^{41}$ represents any of the groups as shown below or halogen; $Z^6$ represents $—C(=O)—$, $—C(=S)—$ or $—SO_2—$; $X^3$ represents a halogen atom; and m is 1 or 2.

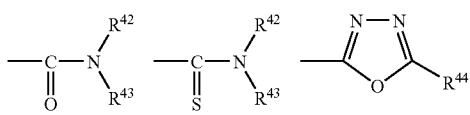

wherein $R^{42}$ and $R^{43}$ each represent alky, substituted alkyl, alkenyl, substituted alkenyl, aryl, or substituted aryl; and $R^{44}$ has the same meaning as $R^{38}$ in Formula (6).

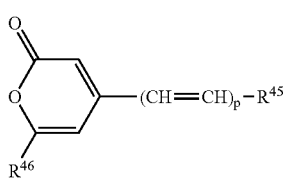

Formula (9)

wherein $R^{45}$ represents an optionally substituted aryl or heterocyclic group; $R^{46}$ represents trihaloalkyl or trihaloalkenyl having 1 to 3 carbon atoms; and p is 1, 2 or 3.

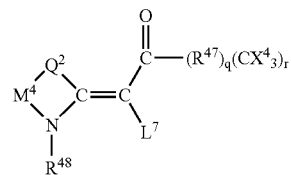

Formula (10)

Carbonyl methylene heterocyclic compounds which are represented by Formula (10) above and has a trihalogenomethyl group, wherein $L^7$ is a hydrogen atom or a substituent represented by the formula: $CO—(R^{47})q(C(X^4)_3)r$; $Q^2$ represents a sulfur atom, a selenium atom, an oxygen atom, dialkylmethylene, alkene-1,2-ylene, 1,2-phenylene, or $N—R$; $M^4$ represents substituted or unsubstituted alkylene or alkenylene, or 1,2-arylene; $R^{48}$ represents alky, aralkyl or alkoxyalkyl; $R^{47}$ represents a homocyclic or heterocyclic bivalent aromatic group; $X^4$ represents a chlorine atom, a bromine atom or an iodine atom; and q=0 and r=1 or q=1 and r=1 or 2.

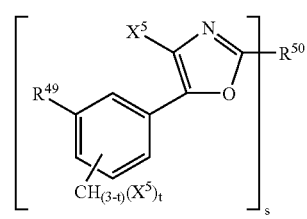

Formula (11)

4-halogeno-5-(halogenomethyl-phenyl)-oxazole derivatives represented by Formula (11) above, wherein $X^5$ represents a halogen atom; t represents an integer of 1 to 3; s represents an integer of 1 to 4; $R^{49}$ represents a hydrogen atom or $CH_{3-t}X^5_t$; and $R^{50}$ represents an optionally-substituted unsaturated organic group with a valence of s.

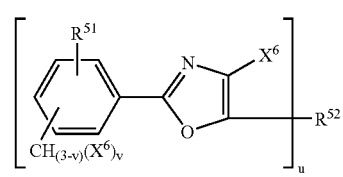

Formula (12)

2-(halogenomethyl-phenyl)-4-halogeno-oxazole derivatives represented by Formula (12) above, wherein $X^6$ represents a halogen atom; v represents an integer of 1 to 3; u represents an integer of 1 to 4; $R^{51}$ represents a hydrogen atom or $CH_{3-v}X^6_v$; and $R^{52}$ represents an optionally-substituted unsaturated organic group with a valence of u.

Specific examples of such carbon-halogen bond-bearing compounds include the compounds disclosed in Wakabayashi et al., Bull. Chem. Soc. Japan, 42, 2924 (1969) such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4, 6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, and 2-(α,α,β-trichloroethyl)-4,6-bis(trichloromethyl)-S-triazine; the compounds disclosed in U.K. Patent No. 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, and 2-(p-methoxystyryl)-4-amino-6-trichloromethyl-S-triazine; the compounds disclosed in JP-A No. 53-133428 such as 2-(4-methoxy-naphtho-1-yl)-4,6-bis-trichloromethyl-S-triazine, 2-(4-ethoxy-naphtho-1-yl)-4,6-bis(trichloromethyl)-S-triazine, 2-[4-(2-ethoxyethyl)-naphtho-1-yl]-4,6-bis(trichloromethyl)-S-triazine, 2-(4,7-dimethoxy-naphtho-1-yl]-4,6-bis-trichloromethyl-S-triazine, and 2-(acenaphtho-5-yl)-4,6-bis-trichloromethyl-S-triazine; and the compounds disclosed in German Patent No. 3,337,024 such as the following compounds:

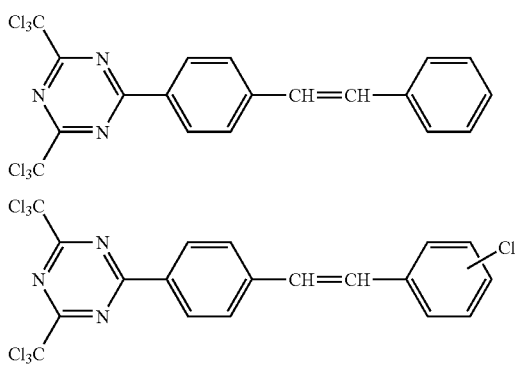

Specific examples thereof also include the compounds disclosed in F. C. Schaefer et al., J. Org. Chem., 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, and 2-methoxy-4-methyl-6-trichloromethyl-S-triazine; and the compounds disclosed in JP-A No. 62-58241 such s the following compounds:

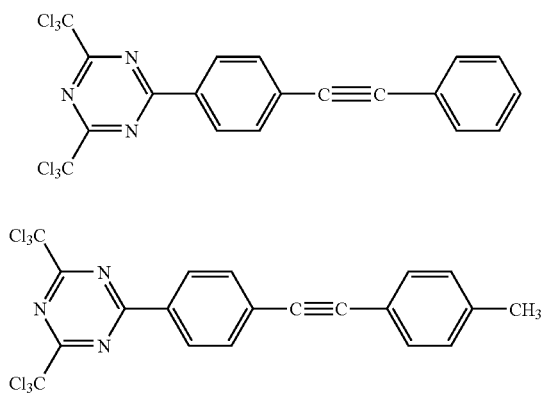

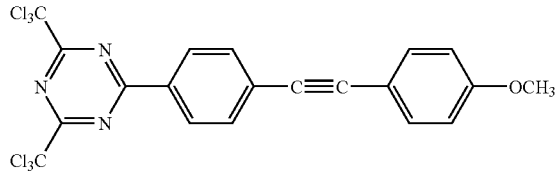

Specific examples thereof also include the compounds disclosed in JP-A No. 05-281728 such as the following compounds:

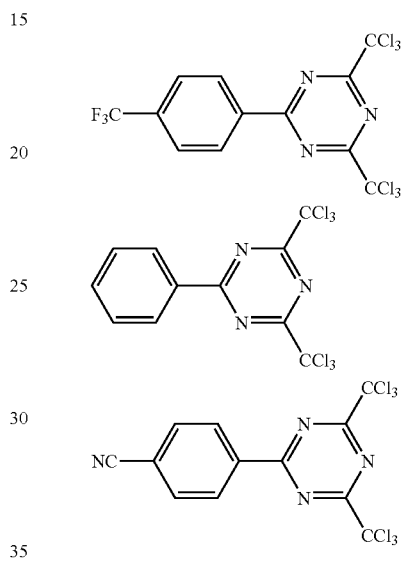

Specific examples thereof also include a group of the compounds as shown below, which can easily be synthesized by one skilled in the art according to the synthesis method described in M. P. Hutt, E. F. Elslager and L. M. Herbel, Journal of Heterocyclic Chemistry, vol. 7 (No. 3), page 511 et seq. (1970).

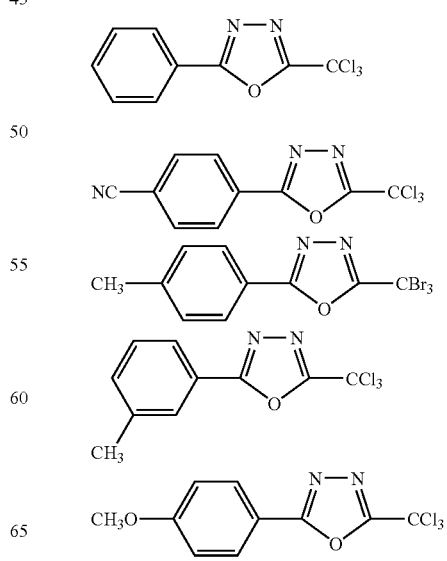

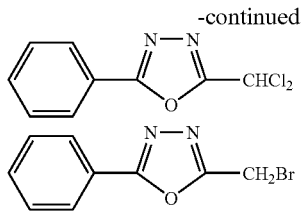

(k) Pyridinium Type Compounds

In the invention, examples of (k) pyridinium type compound for use as the structure having the ability to initiate polymerization include the compounds represented by Formula (13):

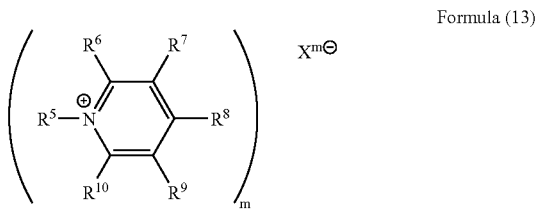

wherein $R^5$ preferably represents a hydrogen atom, alkyl, substituted alky, aryl, substituted aryl, alkenyl, substituted alkenyl, alkynyl, or substituted alkynyl; $R^6$, $R^7$, $R^8$, $R^9$, and $R^{10}$ may be the same or different and each represent a hydrogen atom, a halogen atom or a monovalent organic residue; at least one of $R^6$, $R^7$, $R^8$, $R^9$, and $R^{10}$ has a group of the structure represented by Formula (14) below; $R^5$ and $R^6$, $R^5$ and $R^{10}$, $R^6$ and $R^7$, $R^7$ and $R^8$, $R^8$ and $R^9$, or $R^9$ and $R^{10}$ may be coupled to each other to form a ring; X represents a counter anion; and m represents an integer of 1 to 4.

wherein $R^{12}$ and $R^{13}$ each independently represent a hydrogen atom, a halogen atom, alkyl, substituted alkyl, aryl, substituted aryl, alkenyl, substituted alkenyl, alkynyl, or substituted alkynyl; $R^{11}$ represents a hydrogen atom, alky, substituted alkyl, aryl, substituted aryl, alkenyl, substituted alkenyl, alkynyl, substituted alkynyl, hydroxyl, substituted oxy, mercapto, substituted thio, amino, or substituted amino; $R^{12}$ and $R^{13}$, $R^{11}$ and $R^{12}$ or $R^{11}$ and $R^{13}$ may be coupled to each other to form a ring; and L represents a hetero atom-containing bivalent linking group.

In a more preferred embodiment of Formula (13), $R^5$, $R^6$, $R^7$, $R^8$, and $R^9$ may each independently be any one of a hydrogen atom, a halogen atom, alky, substituted alkyl, aryl, substituted aryl, alkenyl, substituted alkenyl, alkynyl, substituted alkynyl, hydroxyl, substituted oxy, mercapto, substituted thio, amino, substituted amino, substituted carbonyl, sulfo, sulfonato, substituted sulfinyl, substituted sulfonyl, phosphono, substituted phosphono, phosphonato, cyano, nitro, and silyl. $R^5$ and $R^6$, $R^5$ and $R^{10}$, $R^6$ and $R^7$, $R^7$ and $R^8$, $R^8$ and $R^9$, or $R^9$ and $R^{10}$ may be coupled to each other to form a ring.

Preferred examples of $R^5$ in Formula (13) are specifically described below, including preferred examples of the alky, substituted alky, aryl, substituted aryl, alkenyl, substituted alkenyl, alkynyl, or substituted alkynyl as shown below.

The alkyl may be straight-chain, branched or cyclic alkyl of 1 to 20 carbon atoms. Examples thereof include methyl, ethyl, propyl, butyl, pentyl, hexyl, heptyl, octyl, nonyl, decyl, undecyl, dodecyl, tridecyl, hexadecyl, octadecyl, eicocyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl, and 2-norbornyl. Particularly preferred is straight-chain alkyl of 1 to 12 carbon atoms, branched alkyl of 3 to 12 carbon atoms or cyclic alkyl of 5 to 10 carbon atoms.

The substituted alkyl comprises a substituent and an alkylene group coupled thereto. The substituent may be a monovalent nonmetallic atomic group, exclusive of hydrogen. Preferred examples thereof include halogen atoms (such as —F, —Br, —Cl, and —I), hydroxyl, alkoxy, aryloxy, mercapto, alkylthio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, carboxyl and any conjugate base group thereof (hereinafter referred to as carboxylate), alkoxycarbonyl, aryloxycarbonyl, carbamoyl, N-alkylcarbamoyl, N,N-dialkylcarbamoyl, N-arylcarbamoyl, N,N-diarylcarbamoyl, N-alkyl-N-arylcarbamoyl, alkylsulfinyl, arylsulfinyl, alkylsulfonyl, arylsulfonyl, sulfo (—$SO_3H$) and any conjugate base group thereof (hereinafter referred to as sulfonato), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, N-acylsulfamoyl and any conjugate base group thereof, N-alkylsulfonylsulfamoyl (—$SO_2NHSO_2$(alkyl)) and any conjugate base group thereof, N-arylsulfonylsulfamoyl (—$SO_2NHSO_2$(aryl)) and any conjugate base group thereof, N-alkylsulfonylcarbamoyl (—$CONHSO_2$(alkyl)) and any conjugate base group thereof, N-arylsulfonylcarbamoyl (—$CONHSO_2$(aryl)) and any conjugate base group thereof, alkoxysilyl (—$Si(O\text{-alkyl})_3$), aryloxysilyl (—$Si(O\text{-aryl})_3$), hydroxysilyl (—$Si(OH)_3$) and any conjugate base group thereof, phosphono (—$PO_3H_2$) and any conjugate base group thereof (hereinafter referred to as phosphonato), dialkylphosphono (—$PO_3(\text{alkyl})_2$), diarylphosphono (—$PO_3(\text{aryl})_2$), alkylarylphosphono (—$PO_3$ (alkyl)(aryl)), monoalkylphosphono (—$PO_3H(\text{alkyl})$) and any conjugate base group thereof (hereinafter referred to as alkylphosphonato), monoarylphosphono (—$PO_3H(\text{aryl})$) and any conjugate base group thereof (hereinafter referred to as arylphosphonato), phosphonooxy (—OPO$_3$H$_2$) and any conjugate base group thereof (hereinafter referred to as phosphonatooxy), dialkylphosphonooxy (—OPO$_3$(alkyl)$_2$), diarylphosphonooxy (—OPO$_3$(aryl)$_2$), alkylarylphosphonooxy (—OPO$_3$(alkyl)(aryl)), monoalkylphosphonooxy (—OPO$_3$H(alkyl)) and any conjugate base group thereof (hereinafter referred to as alkylphosphonatooxy), monoarylphosphonooxy (—OPO$_3$H(aryl)) and any conjugate base group thereof (hereinafter referred to as arylphosphonatooxy), cyano, nitro, aryl, alkenyl, and alkynyl.

Examples of the alkyl in these substituents may be the same as shown above. Examples of the aryl group include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, nitrophenyl, cyanophenyl, sulfophenyl, sulfonatophenyl, phosphonophenyl, and phosphonatophenyl. Examples of the alkenyl include vinyl, 1-propenyl, 1-butenyl, cinnamyl, and 2-chloro-1-ethenyl. Examples of the alkynyl include ethynyl, 1-propynyl, 1-butynyl, trimethylsilylethynyl, and phenylethynyl.

In the acyl group (R$^4$CO—), R$^4$ may be a hydrogen atom, alkyl, aryl, alkenyl, or alkynyl, examples of which are as shown above.

The alkylene group of the substituted alkyl may be a bivalent organic residue which is derived by deletion of a hydrogen atom from the above alkyl group of 1 to 20 carbon atoms. The alkylene group is preferably straight-chain alkylene of 1 to 12 carbon atoms, branched alkylene of 3 to 12 carbon atoms, or cyclic alkylene of 5 to 10 carbon atoms.

Preferred examples of the substituted alkyl include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl) sulfamoyloctyl,

CH$_3$CONHSO$_2$CH$_2$CH$_2$CH$_2$CH$_2$—,

H$_2$NSO$_2$—⟨phenyl⟩—CH$_2$—,

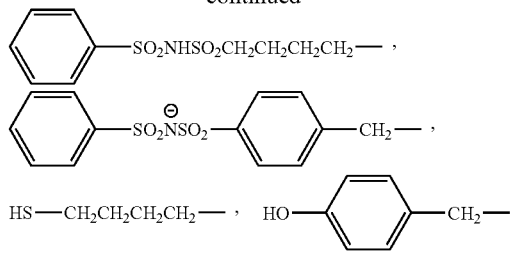

HS—CH$_2$CH$_2$CH$_2$CH$_2$—, HO—⟨phenyl⟩—CH$_2$— phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, and 3-butynyl.

The aryl group may be a fused ring formed from one to three benzene rings or a fused ring formed from a benzene ring and a five-membered unsaturated ring. Examples thereof include phenyl, naphthyl, anthryl, phenanthryl, indenyl, acenaphthenyl, and fluorenyl. Particularly preferred is phenyl or naphthyl.

The substituted aryl has a substituent which is coupled to the aryl and may have a monovalent nonmetallic atomic group, exclusive of hydrogen, as the substituent on any of the ring carbon atoms of the above aryl group. Preferred examples of the substituent include the above alkyl groups, the above substituted alkyl groups, and the above substituents for the above substituted alkyl groups.

Specifically, preferred examples of such substituted aryl include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl) carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl) sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl, and 3-butynylphenyl.

Examples of the alkenyl include those stated above. The substituted alkenyl has a substituent which replaces a hydrogen atom in the alkenyl group. Such a substituent may be the same as the substituent for the above substituted alkyl, while the alkenyl group may be the same as shown above. Preferred examples of the substituted alkenyl include the following:

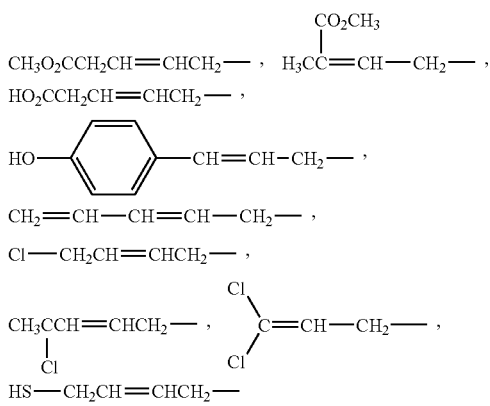

The alkynyl may be the same as shown above. The substituted alkynyl has a substituent which replaces a hydrogen atom in the alkynyl group. Such a substituent may be the same as the substituent for the above substituted alkyl. The alkynyl may be the same as shown above.

As regards $R^6$, $R^7$, $R^8$, $R^9$, or $R^{10}$ in Formula (13), a description is provided below of preferred examples of the structure other than that represented by Formula (14). The halogen atom is preferably a fluorine atom, chlorine atom, bromine atom, or iodine atom. Preferred examples of the alkyl, substituted alkyl, aryl, substituted aryl, alkenyl, and substituted alkenyl may be the same as those of $R^5$.

In the substituted oxy group ($R^{14}O$—), $R^{14}$ may be a monovalent nonmetallic atomic group, exclusive of hydrogen. Preferred examples of the substituted oxy group include alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonoxy, and phosphonatooxy. Examples of the alkyl and the aryl in the above substituted oxy groups include the above alkyl groups, the above substituted alkyl groups, the above aryl groups, and the above substituted aryl groups. In the acyl group ($R^{15}CO$—) of the acyloxy, $R^{15}$ may be the above alkyl, the above substituted alkyl, the above aryl, or the above substituted aryl. In particular, such a substituent is preferably alkoxy, aryloxy, acyloxy, or arylsulfoxy.

Specifically, preferred examples of the substituted oxy include methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonooxy, and phosphonatooxy.

In the substituted thio group ($R^{16}S$—), $R^{16}$ may be a monovalent nonmetallic atomic group, exclusive of hydrogen. Preferred examples of the substituted thio group include alkylthio, arylthio, alkyldithio, aryldithio, and acylthio. Examples of the alkyl and the aryl in such substituted thio groups include the above alkyl groups, the above substituted alkyl groups, the above aryl groups, and the above substituted aryl groups. In the acyl group ($R^{15}CO$—) of the acylthio, $R^{15}$ may be the same as shown above. Alkylthio and arylthio are particularly preferred. Specifically, preferred examples of the substituted thio group include methylthio, ethylthio, phenylthio, ethoxyethylthio, carboxyethylthio, and methoxycarbonylthio.

In the substituted amino group ($R^{17}NH$—, ($R^{18}$)($R^{19}$)N—), $R^{17}$, $R^{18}$ or $R^{19}$ may be a monovalent nonmetallic atomic group, exclusive of hydrogen. Preferred examples of the substituted amino group include N-alkylamino, N,N-dialkylamino, N-arylamino, N,N-diarylamino, N-alkyl-N-arylamino, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N'-N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N— alkoxycarbonylamino, and N-aryl-N-aryloxycarbonylamino. Examples of the alkyl and the aryl in such substituted amino groups include the above alkyl groups, the above substituted alkyl groups, the above aryl groups, and the above substituted aryl groups. In the acyl group ($R^{15}CO$—) of the acylamino, N-alkylacylamino or N-arylacylamino, $R^{15}$ may be the same as shown above.

More preferred are N-alkylamino, N,N-dialkylamino, N-arylamino, and acylamino. Specifically, preferred examples of the substituted amino include methylamino, ethylamino, diethylamino, morpholino, piperidino, piperazino, pyrrolidino, phenylamino, benzoylamino, and acetylamino.

In the substituted carbonyl group ($R^{20}$—CO—), $R^{20}$ may be a monovalent nonmetallic atomic group. Examples of the substituted carbonyl group include formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl, and N-alkyl-N-arylcarbamoyl. Examples of the alkyl and the aryl in such substituted carbonyl groups include the above alkyl groups, the above substituted alkyl groups, the above aryl groups, and the above substituted aryl groups.

More preferred are formyl, acyl, carboxyl, alkoxycarbonyl, aryloxycarbonyl, carbamoyl, N-alkylcarbamoyl, N',N-dialkylcarbamoyl, and N-arylcarbamoyl. Still more preferred are formyl, acyl, alkoxycarbonyl, and aryloxycarbonyl. Specifically, preferred examples of the substituted carbonyl group include formyl, acetyl, benzoyl, carboxyl, methoxycarbonyl, allyloxycarbonyl, N-methylcarbamoyl, N-phenylcarbamoyl, N,N-diethylcarbamoyl, and morpholinocarbonyl.

In the substituted sulfinyl group ($R^{21}$—SO—), $R^{21}$ may be a monovalent nonmetallic atomic group. Preferred examples thereof include alkylsulfinyl, arylsulfinyl, sulfinamoyl, N-alkylsulfinamoyl, N,N-dialkylsulfinamoyl, N-arylsulfinamoyl, N,N-diarylsulfinamoyl, and N-alkyl-N-arylsulfinamoyl. Examples of the alkyl and the aryl in such substituted sulfinyl groups include the above alkyl groups, the above substituted alkyl groups, the above aryl groups, and the above substituted aryl groups. More preferred are alkylsulfinyl and arylsulfinyl. Specific examples of the substituted sulfinyl group include hexylsulfinyl, benzylsulfinyl and tolylsulfinyl.

In the substituted sulfonyl group ($R^{25}$—$SO_2$—), $R^{25}$ may be a monovalent nonmetallic atomic group. For example, alkylsulfonyl or arylsulfonyl is more preferred. Examples of the alkyl and the aryl in such groups include the above alkyl groups, the above substituted alkyl groups, the above aryl groups, and the above substituted aryl groups. Specific examples of the substituted sulfonyl group include butylsulfonyl and chlorophenylsulfonyl.

The sulfonato group ($SO_3^-$) refers to a conjugate base anion group of the sulfo group ($-SO_3H$) as stated above, and in general, it is preferably used with a counter cation. Such a counter cation may be a generally known cation, and examples thereof includes various oniums (such as ammoniums, sulfoniums, phosphoniums, iodoniums, and aziniums) and metallic ions (such as $Na^+$, $K^+$, $Ca^{2+}$, and $Zn^{2+}$).

The substituted phosphono group refers to a group formed by replacing one or two hydroxyl groups on a phosphono group with any other organic oxo group(s). Preferred examples thereof include dialkylphosphono, diarylphosphono, alkylarylphosphono, monoalkylphosphono, and monoarylphosphono, as shown above. More preferred are dialkylphosphono and diarylphosphono. Specific examples thereof include diethylphosphono, dibutylphosphono, and diphenylphosphono.

The phosphonato group ($-PO_3^{2-}$, $-PO_3H^-$) refers to a conjugate base anion group derived by primary acid dissociation or secondary acid dissociation of a phosphono group ($-PO_3H_2$), as shown above. In general, it is preferably used with a counter cation. Such a counter cation may be a generally known cation, and examples thereof include various oniums (such as ammoniums, sulfoniums, phosphoniums, iodoniums, and aziniums) and metallic ions (such as $Na^+$, $K^+$, $Ca^{2+}$, and $Zn^{2+}$).

The substituted phosphonato group is a conjugate base anion group of the above substituted phosphono group formed by replacing one hydroxyl group with an organic oxo group. Examples thereof include conjugate bases of the above monoalkylphosphono group ($-PO_3H(alkyl)$) or the above monoarylphosphono group ($-PO_3H(aryl)$). In general, it is preferably used with a counter cation. Such a counter cation may be a generally known cation, and examples thereof include various oniums (such as ammoniums, sulfoniums, phosphoniums, iodoniums, and aziniums) and metallic ions (such as $Na^+$, $K^+$, $Ca^{2+}$, and $Zn^{2+}$).

In the silyl group (($R^{23}$)($R^{24}$)($R^{25}$)Si—), $R^{23}$, $R^{24}$ or $R^{25}$ may be a monovalent nonmetallic atomic group. Preferred examples of such a nonmetallic atomic group include the above alkyl groups, the above substituted alkyl groups, the above aryl groups, and the above substituted aryl groups. Preferred examples of the silyl group include trimethylsilyl, tributylsilyl, tert-butyldimethylsilyl, and dimethylphenylsilyl.

$R^6$, $R^7$, $R^8$, $R^9$, or $R^{10}$ is more preferably a hydrogen atom, a halogen atom (such as —F, —Cl, —Br, and —I), alkyl, substituted alkyl, aryl, substituted aryl, substituted oxy, substituted thio, substituted amino, substituted carbonyl, sulfo, sulfonato, or cyano, still more preferably a hydrogen atom, a halogen atom, alkyl, substituted alkyl, aryl, or substituted carbonyl.

Examples of the ring formed of the combination of $R^5$ and $R^6$, $R^5$ and $R^{10}$, $R^6$ and $R^7$, $R^7$ and $R^8$, $R^8$ and $R^9$, or $R^9$ and $R^{10}$ are as shown below. For example, $R^5$ and $R^6$, $R^5$ and $R^{10}$, $R^6$ and $R^7$, $R^7$ and $R^8$, $R^8$ and $R^9$, or $R^9$ and $R^{10}$ may be coupled to each other to form a saturated or unsaturated aliphatic ring. The linked carbon atoms preferably form a five-, six-, seven-, or eight-membered aliphatic ring, more preferably a five- or six-membered aliphatic ring. Any of the ring carbon atoms may have a substituent (examples of which include those for the substituted alkyl of $R^8$ or $R^{11}$). The ring carbon atoms may partially be replaced by a hetero atom (such as an oxygen atom, a sulfur atom and a nitrogen atom). Part of the aliphatic ring may form part of an aromatic ring. Preferred examples thereof include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring, a cyclo-1,3-dioxahexene ring, a cyclohexadiene ring, a benzocyclohexene ring, a benzocyclohexadiene ring, and a tetrahydropyranone ring.

$R^6$ and $R^7$, $R^7$ and $R^8$, $R^8$ and $R^9$, or $R^9$ and $R^{10}$ may be coupled to each other to form an aromatic ring. For example, such linked carbon atoms may form, together with the pyridine ring, a quinoline ring, an isoquinoline ring, an acridine ring, a phenanthridine ring, a benzoquinoline ring, or a benzoisoquinoline ring, more preferably a quinoline ring. Any of the ring carbon atoms may have a substituent (examples of which include those for the above substituted alkyl).

Preferred examples of $R^{12}$ or $R^{13}$ in Formula (14) are specifically described below. The halogen atom is preferably a fluorine, chlorine, bromine, or iodine atom. Preferred examples of the alkyl, substituted alkyl, aryl, substituted aryl, alkenyl, substituted alkenyl, alkynyl, and substituted alkynyl may be the same as those of $R^5$. $R^{12}$ or $R^{13}$ is more preferably a hydrogen atom or alkyl.

Preferred examples of $R^{11}$ in Formula (14) are specifically described below. Preferred examples of the alkyl, substituted alkyl, aryl, substituted aryl, alkenyl, substituted alkenyl, alkynyl, substituted alkynyl, hydroxyl, substituted oxy, mercapto, substituted thio, amino, and substituted amino may be the same as those of $R^5$, $R^6$, $R^7$, $R^8$, $R^9$, or $R^{10}$. $R^{11}$ is more preferably alkyl, substituted alkyl, aryl, substituted aryl, or alkenyl.

$R^{12}$ and $R^{13}$, $R^{11}$ and $R^{12}$ or $R^{11}$ and $R^{13}$ may be coupled to each other to form a saturated or unsaturated aliphatic ring. The linked carbon atoms preferably form a five-, six-, seven-, or eight-membered aliphatic ring, more preferably a five- or six-membered ring. Any of the ring carbon atoms may also have a substituent (examples of which include those for the above substituted alkyl). The ring carbon atoms may partially be replaced by a hetero atom (such as an oxygen atom, a sulfur atom and a nitrogen atom). Part of the aliphatic ring may also form part of an aromatic ring. Preferred examples thereof include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring, a cyclo-1,3-dioxahexene ring, a cyclohexadiene ring, a benzocyclohexene ring, a benzocyclohexadiene ring, and a perhydropyranone ring.

L in Formula (14) is described below. L represents a hetero atom-containing bivalent linking group, for example, which has any of the following partial structures:

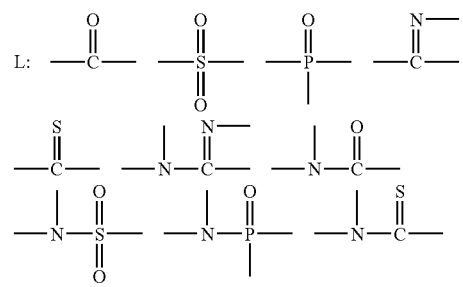

-continued

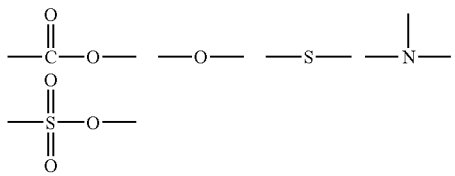

Herein, the wording "which has any of the following partial structures" means that L serving as a linking group or an end group has at least one of the above partial structures, and thus it may have a plurality of any of the above partial structures. Thus, L may only be any of the above partial structures or may be a group comprising a plurality of any of the above partial structures linked to each other or a group comprising any of the above partial structures and any other group linked thereto, such as a hydrocarbon group. In a particularly preferred embodiment, for example, L is any of the following structures:

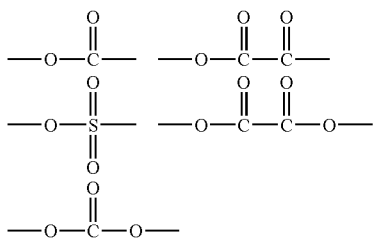

Preferred examples of the counter anion $X^{m-}$ are specifically described below. Preferred examples of the counter anion $X^{m-}$ include halide ions (such as $F^-$, $Cl^-$, $Br^-$, and $I^-$), sulfonate ions, organic boride anions, perchlorate ion ($ClO^{4-}$), and the anion represented by Formula (a) or (b):

$$MX_r \quad \text{(a)}$$

$$M_{r-1}(OH) \quad \text{(b)}$$

wherein M represents a boron atom, a phosphorus atom, an arsenic atom, or an antimony atom; X represents a halogen atom; and r represents an integer of 4 to 6.

Preferred examples of the sulfonate ions include methanesulfonate ion, benzenesulfonate ion, p-toluenesulfonate ion (TsO$^-$), p-styrenesulfonate ion, P-naphthoquinone-4-sulfonate ion, anthraquinone-1,5-disulfonate ion, anthraquinone-1,8-disulfonate ion, anthraquinone-1-sulfonate ion, anthraquinone-2-sulfonate ion, quinoline-8-sulfonate ion, hydroquinone sulfonate ion, 1,5-naphthalenedisulfonate ion, 1-naphthalenesulfonate ion, 2-naphthalenesulfonate ion, 2-amino-1-naphthalenesulfonate ion, 2-naphthol-6-sulfonate ion, dibutylnaphthalenesulfonate ion, naphthalene-1,3,6-trisulfonate ion, m-benzenedisulfonate ion, p-phenolsulfonate ion, dodecylbenzenesulfonate ion, 2-hydroxy-4-methoxybenzophenone-5-sulfonate ion, 4-acetylbenzenesulfonate ion, 4-nitrotoluene-2-sulfonate ion, o-benzaldehydesulfonate ion, diphenylamine-4-sulfonate ion, benzaldehyde-2,4-disulfonate ion, mesitylenesulfonate ion, trifluoromethanesulfonate ion, chlorosulfonate ion, fluorosulfonate ion, and 9,10-dimethoxyanthracene-2-sulfonate ion.

Preferred examples of the compound represented by Formula (13) include, but are not limited to, the following compounds:

TABLE 2

A Type

| | $R^5$ | $R^6$ | $R^7$ | $R^9$ | $R^{10}$ | $R^{13}$ | X |
|---|---|---|---|---|---|---|---|
| II-1 | Ph-CH$_2$— | H | H | H | H | Ph— | PF$_6$ |
| II-2 | H— | H | H | H | H | Ph— | Cl |
| II-3 | CH$_3$— | H | H | H | H | Ph— | TsO* |
| II-4 | C$_7$H$_{15}$— | H | H | H | H | Ph— | TsO* |
| II-5 | NO$_2$-C$_6$H$_4$— | H | H | H | H | Ph— | BF$_4$ |
| II-6 | CH$_3$—CH=CH— | H | H | H | H | CH$_3$O-C$_6$H$_4$— | BF$_4$ |

TABLE 2-continued

A Type

| | $R^5$ | $R^6$ | $R^7$ | $R^9$ | $R^{10}$ | $R^{13}$ | X |
|---|---|---|---|---|---|---|---|
| II-7 | CH₃—CH≡CH— | H | H | H | H | 4-CH₃O-C₆H₄— | PF₆ |
| II-8 | C₇H₁₅— | H | H | H | H | 4-CF₃-C₆H₄— | BF₄ |
| II-9 | C₈H₁₇— | H | H | H | H | (CH₃)₂N— | TsO* |
| II-10 | PhCH₂— | H | H | H | H | PhS—CH₂— | PF₆ |
| II-11 | PhCH₂— | H | H | H | H | PhO—CH₂— | PF₆ |
| II-12 | PhCH₂— | H | H | H | H | Ph-N(CH₃)— | BF₄ |
| II-13 | 4-CF₃-C₆H₄-CH₂— | H | H | H | H | PhS—CH₂— | BF₄ |
| II-14 | 4-CF₃-C₆H₄-CH₂— | H | CH₃ | CH₃ | H | PhS—CH₂— | BF₄ |
| II-15 | PhCH₂— | Cl | H | H | H | 2-CH₃-C₆H₄-O-CH₂— | SbF₆ |
| II-16 | C₇H₁₅— | H | H | H | H | (t)Bu—O— | TsO* |
| II-17 | C₇H₁₅— | H | H | H | H | (t)Bu— | TsO* |
| II-18 | PhCH₂— | H | H | H | H | 4-(t)Bu-C₆H₄— | BF₄ |
| II-19 | C₇H₁₅— | H | H | H | H | CH₃NH— | TsO* |

TsO* = H₃C—C₆H₄—SO₃

TABLE 3

B Type

Structure: Pyridinium with R⁵ on N⁺, R⁶, R⁷, R⁸, R¹⁰ on ring, and CH₂-O-C(=O)-R¹³ substituent; counterion X⁻.

| | R⁵ | R⁶ | R⁷ | R⁸ | R¹⁰ | R¹³ | X |
|---|---|---|---|---|---|---|---|
| II-20 | $C_7H_{15}$— | H | H | H | H | Ph— | TsO* |
| II-21 | $C_7H_{15}$— | H | H | H | H | (t)Bu— | $PF_6$ |
| II-22 | Ph-CH₂— | H | H | H | H | Ph— | $BF_4$ |
| II-23 | Ph-CH₂— | H | H | H | H | Ph-S-CH₂— | $PF_6$ |
| II-24 | $CH_3$ | H | H | H | H | Ph— | TsO* |
| II-25 | $C_7H_{15}$— | $CH_3$ | H | H | $CH_3$ | Ph— | $PF_6$ |
| II-26 | $C_7H_{15}$— | Cl | H | H | H | Ph— | $BF_4$ |

TsO* = $H_3C$—C₆H₄—$SO_3$

TABLE 4

C Type

Structure: Pyridinium with R⁵ on N⁺, R⁶, R⁷, R⁸, R⁹ on ring, and CH₂-O-C(=O)-R¹³ substituent; counterion X⁻.

| | R⁵ | R⁶ | R⁷ | R⁸ | R⁹ | R¹³ | X |
|---|---|---|---|---|---|---|---|
| II-27 | (t)Bu-C₆H₄-CH₂— | H | H | H | H | Ph-S-CH₂— | $PF_6$ |
| II-28 | (t)Bu-C₆H₄-CH₂— | Cl | H | H | (t)Bu | Ph-S-CH₂— | Br |
| II-29 | Ph-CH₂— | H | H | H | H | $CH_3$—CH=CH— | $PF_6$ |
| II-30 | Ph-CH₂— | H | H | H | H | $CH_2$=CH—$CH_2$— | $BF_4$ |

TABLE 4-continued
C Type
| | R⁵ | R⁶ | R⁷ | R⁸ | R⁹ | R¹³ | X |
|---|---|---|---|---|---|---|---|
| II-31 | CH₃ | H | H | H | H | Ph— | ClO₄ |
| II-32 | PhCH₂— | H | H | H | H | 4-NO₂-C₆H₄— | SbF₆ |
| II-33 | CH₃ | H | H | H | CH₃C(O)— | C₅H₁₁— | ClO₄ |
| II-34 | C₇H₁₅— | H | H | H | H | cyclopropyl | SbF₆ |
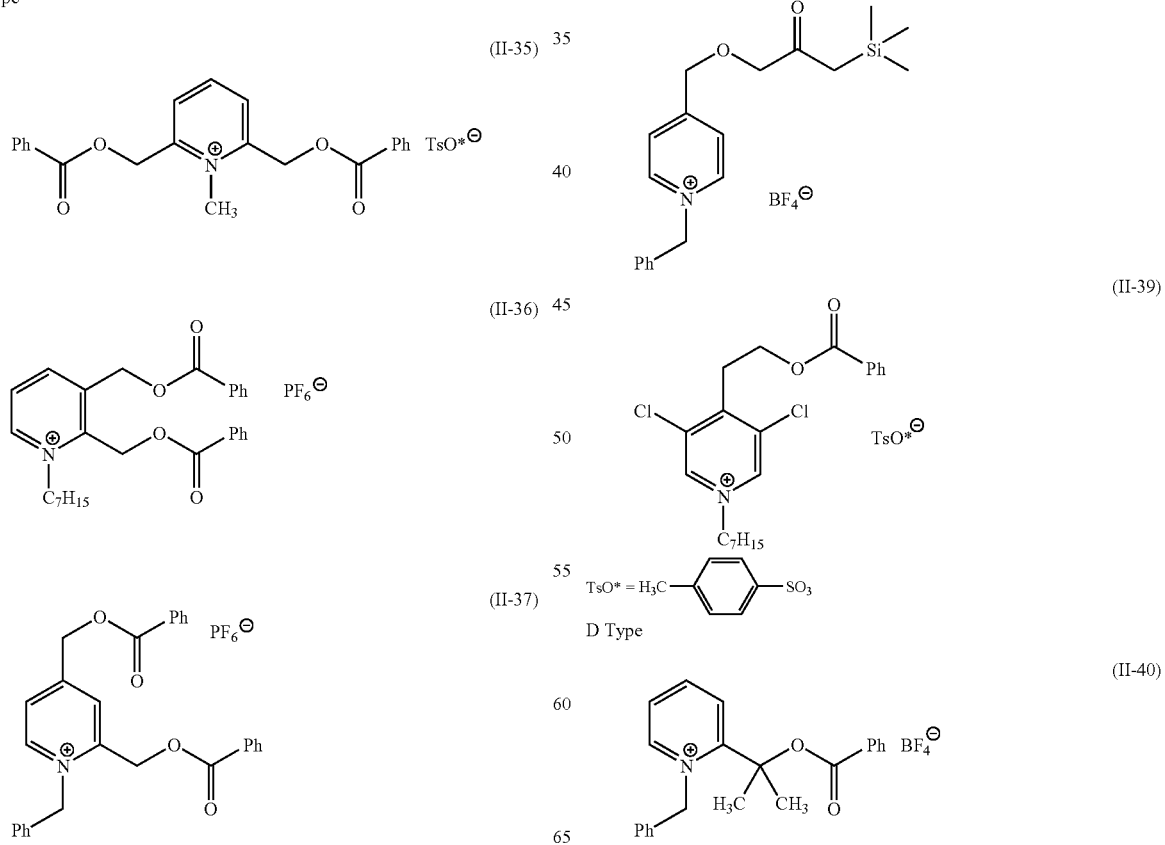
TsO* = H₃C—C₆H₄—SO₃

-continued
(II-41)
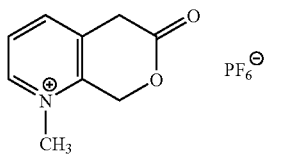
(II-42)
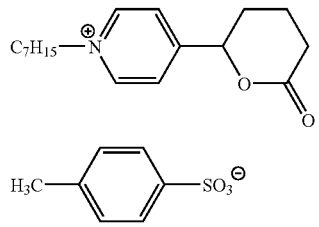
-continued
(II-43)
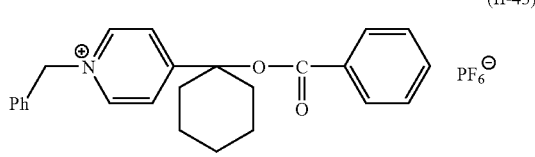
(II-44)
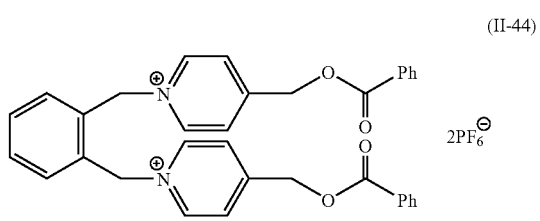
TABLE 5
E Type
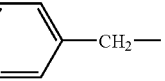
| | R⁵ | R⁶ | R⁷ | R⁸ | R⁹ | R¹⁰ | X |
|---|---|---|---|---|---|---|---|
| II-45 | PhCH₂— | H | H | —CH₂—O—C(O)—C(O)—Ph | H | H | PF₆ |
| II-46 | PhCH₂— | Cl | H | —CH₂—O—C(O)—C(O)—Ph | H | H | TsO* |
| II-47 | PhCH₂— | H | CH₃ | —CH₂—O—C(O)—C(O)—Ph | H | H | BF₄ |
| II-48 | C₇H₁₅— | H | H | —CH₂—O—C(O)—C(O)—CH₃ | H | H | PF₆ |
| II-49 | C₇H₁₅— | H | H | —CH₂—O—C(O)—C(O)—Ph | H | H | PF₆ |
| II-50 | CH₃ | H | H | —CH₂—O—C(O)—C(O)—C₇H₁₅ | H | H | TsO* |
| II-51 | C₇H₁₅— | H | H | H | —CH₂—O—C(O)—C(O)—Ph | H | PF₆ |
TsO* = 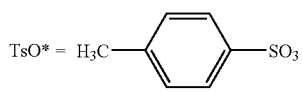

TABLE 6

E Type $$\text{R}^5-\overset{\oplus}{\text{N}}\begin{pmatrix}\text{R}^6 & \text{R}^7\\ & \text{R}^8\\ \text{R}^{10} & \text{R}^9\end{pmatrix} \quad \text{X}^{\ominus}$$

| | $R^5$ | $R^6$ | $R^7$ | $R^8$ | $R^9$ | $R^{10}$ | X |
|---|---|---|---|---|---|---|---|
| II-52 | Ph-CH₂- | CH₃ | H | H | -CH₂-O-C(O)-C(O)-Ph | H | PF₆ |
| II-53 | Ph-CH₂- | H | H | H | H | -CH₂-O-C(O)-C(O)-Ph | PF₆ |
| II-54 | CF₃-C₆H₄-CH₂- | H | H | -O-C(O)-C(O)-Ph | H | H | BF₄ |
| II-55 | CF₃-C₆H₄-CH₂- | H | H | H | H | -CH₂-O-C(O)-C(O)-Ph | PF₆ |
| II-56 | Ph-CH₂- | H | H | -CH₂-O-C(O)-C(O)-C₆H₄-OCH₃ | H | H | PF₆ |
| II-57 | Ph-CH₂- | H | H | -CH₂-O-C(O)-C(O)-C₆H₄-CF₃ | H | H | BF₄ |

TABLE 7

F Type $$\text{R}^5-\overset{\oplus}{\text{N}}\bigcirc-\text{CH}_2-\overset{O}{\underset{O}{\text{S}}}-\text{O}-\text{R}^{13} \quad \text{X}^{\ominus}$$

| | $R^5$ | $R^{13}$ | X |
|---|---|---|---|
| II-58 | Ph-CH₂- | Ph- | PF₆ |
| II-59 | Ph-CH₂- | Ph-CH₂- | TsO* |
| II-60 | C₇H₁₅- | Ph- | PF₆ |
| II-61 | C₇H₁₅- | C₅H₁₁- | PF₆ |
| II-62 | CF₃-C₆H₄-CH₂- | Ph- | TsO* |

TsO* = H₃C-C₆H₄-SO₃

TABLE 8

G Type

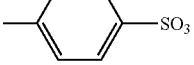

| | R⁵ | R¹³ | R | X |
|---|---|---|---|---|
| II-63 | PhCH₂— | CH₃— | H | PF₅ |
| II-64 | PhCH₂— | Ph— | H | PF₆ |
| II-65 | H | Ph— | CH₃ | TsO* |
| II-66 | C₇H₁₅— | CH₃— | H | BF₄ |
| II-67 | C₇H₁₅— | Pr— | H | PF₆ |

TsO* = H₃C—C₆H₄—SO₃

TABLE 9

H Type

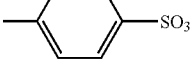

| | R⁵ | R¹³ | R | X |
|---|---|---|---|---|
| II-68 | PhCH₂— | (n)Bu— | H | PF₆ |
| II-69 | PhCH₂— | Ph— | CH₃ | PF₆ |
| II-70 | C₇H₁₅— | Ph— | H | TsO* |
| II-71 | C₇H₁₅— | CH₃O-C₆H₄- | H | PF₆ |
| II-72 | CH₃— | CH₃— | CH₃ | BF₄ |

TsO* = H₃C—C₆H₄—SO₃

These structures having the ability to initiate polymerization preferably have a pendant group such as an aromatic ketone or a triazine having the structure below on their polymerizable group. The aromatic ketone may preferably be a commercial available product such as Irgacure 184.

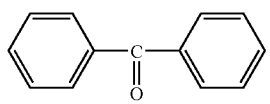

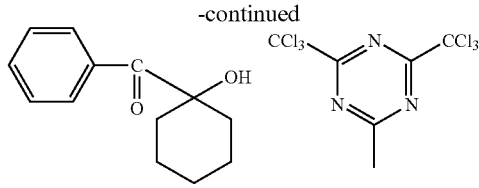

One or more of such structures having the ability to initiate polymerization may be pendent from the polymerizable group.

The polymerizable group, from which the structure having the ability to initiate polymerization can be pendent, may be a radically, anionically or cationically polymerizable group such as an acryl group, a methacryl group, an acrylamide group, a methacrylamide group, and a vinyl group. The acryl group or the methacryl group is particularly preferred in terms of easiness of synthesis.

In the invention, for example, the copolymer component having the functional group with the ability to initiate polymerization may be a monomer having any of the following structures:

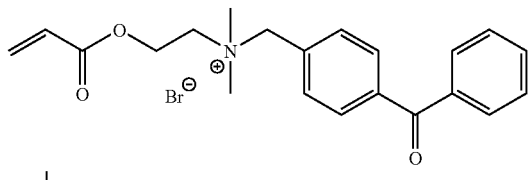

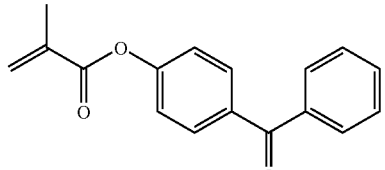

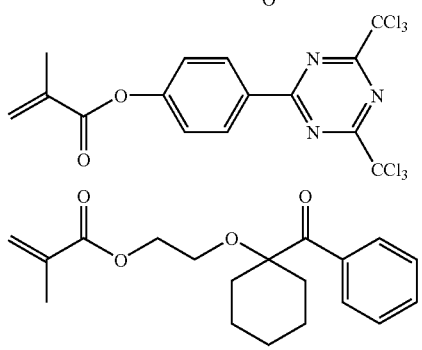

In the invention, the copolymer component having the cross-linking group and forming the specific polymerization initiation polymer preferably comprises: a known cross-linking group (a functional group having the structure for the cross-linking reaction) as described in the text "Cross-linking Agent Handbook" edited by Shinji Yamashita; and a radically, anionically or cationically polymerizable group from which the cross-linking group is pendent. Thus, such a copolymer component has both the polymerizable group and the cross-linking group in its molecular structure.

Among such known cross-linking groups, carboxyl (—COOH), hydroxyl (—OH), amino (—NH₂), or isocyanate (—NCO) is preferably pendent from the polymerizable group.

One or more of such cross-linking groups may be pendent from the polymerizable group.

The polymerizable group, from which the cross-linking group can be pendent, may be a radically, anionically or cationically polymerizable group such as an acryl group, a methacryl group, an acrylamide group, a methacrylamide group, and a vinyl group. The acryl group or the methacryl group is particularly preferred in terms of easiness of synthesis.

In the invention, for example, the copolymer component having the cross-linking group may be a monomer having any of the following structures:

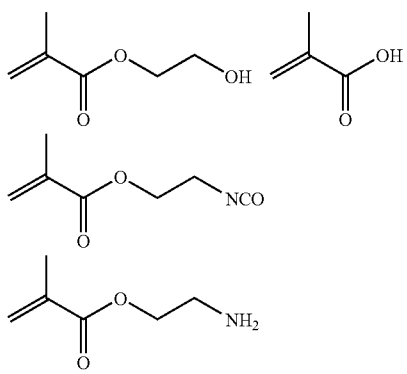

[Other Copolymer Components]

In the invention, the specific polymerization initiation polymer may comprise a third copolymer component for controlling film formability, hydrophilicity or hydrophobicity, solubility in solvent, polymerization initiation properties, or the like.

Any radically, anionically or cationically polymerizable compound may be used for such a third copolymer component. In view of polymerization properties, such a third component is preferably an acrylic or methacrylic monomer having a pendant alkyl group of 1 to 20 carbon atoms. In such a component, the alkyl group preferably has a tertiary hydrogen in order to produce a larger number of active species by UV exposure. The alkyl group may have any substituent and preferably has a substituent with a quaternary ammonium salt structure in terms of increasing the solvent resistance of the polymerization initiation layer.

In the specific polymerization initiation polymer according to the invention, the copolymerization molar ratios of (A) the copolymer component having the polymerization initiation group and (B) the copolymer component having the cross-linking group are preferably (A) from 1 to 40% by mole and (B) from 20 to 70% by mole, respectively. In terms of the film properties of the polymerization initiation layer after graft polymerization or cross-linking reaction, the molar ratios are more preferably (A) from 5 to 30% by mole and (B) from 30 to 60% by mole, respectively.

In the invention, the weight average molecular weight of the specific polymerization initiation polymer is preferably from 10,000 to 10,000,000, more preferably from 10,000 to 5,000,000, still more preferably from 100,000 to 1,000,000, in terms of the solubility of the polymerization initiation layer in the monomer solution.

The above copolymer components are copolymerized to form the specific polymerization initiation polymer according to the invention. While any polymerization method may be used for the synthesis of such a copolymer, a radical polymerization reaction is preferably used in terms of convenience of polymerization reaction. In such a case, the radical-generating agent for inducing the radical polymerization reaction is preferably a compound capable of producing radicals by heat.

The synthesis of the specific polymerization initiation polymer according to the invention is not limited to the copolymerization as described above. Alternatively, for example, a polymer having the polymerization initiation group on its side chain may be synthesized, and then a proper amount of the cross-linking group may be introduced into the polymer so that the specific polymerization initiation polymer according to the invention can be synthesized. Alternatively, the specific polymerization initiation polymer according to the invention may be synthesized by polymerization of a single monomer unit having both the polymerization initiation group and the cross-linking group.

In view of availability of monomer or the like, it is preferred that the specific polymerization initiation polymer according to the invention should be synthesized by copolymerization of different monomer units having the polymerization initiation group and the cross-linking group, respectively.

[Polymerization Initiation Layer Formed by Fixing Specific Polymerization Initiation Polymer by Cross-Linking Reaction]

In the step of forming the polymerization initiation layer, the specific polymerization initiation polymer is fixed by a cross-linking reaction. The method of such fixation may be a method using a self-condensation reaction of the specific polymerization initiation polymer or a method using a cross-linking agent in combination, and the method of using a cross-linking agent is preferred. For example, when the cross-linking group is —NCO, the method using the self-condensation reaction of the specific polymerization initiation polymer employs the property that the self-condensation reaction can proceed by application of heat. The progress of the self-condensation reaction will lead to the formation of a cross-linked structure.

A known cross-linking agent as described in the text "Cross-linking Agent Handbook" edited by Shinji Yamashita may be used in the method using the cross-linking agent in combination.

Preferred examples of the combination of the cross-linking group in the specific polymerization initiation polymer and the cross-linking agent include —COOH and a polyamine, —COOH and a polyaziridine, —COOH and a polyisocyanate, —COOH and a polyepoxy, —NH$_2$ and a polyisocyanate, —NH$_2$ and an aldehyde, —NCO and a polyamine, —NCO and a polyisocyanate, —NCO and a polyhydric alcohol, —NCO and a polyepoxy, —OH and a polyhydric alcohol, —OH and a polyhalogen compound, —OH and a polyamine, and —OH and an acid anhydride. In particular, the combination of —OH (the functional group) and a polyisocyanate (the cross-linking agent) is preferred, because such a combination can produce a urethane bond after the cross-linking and thus can form high strength cross-link.

In the invention, for example, the cross-linking agent has any of the following structures:

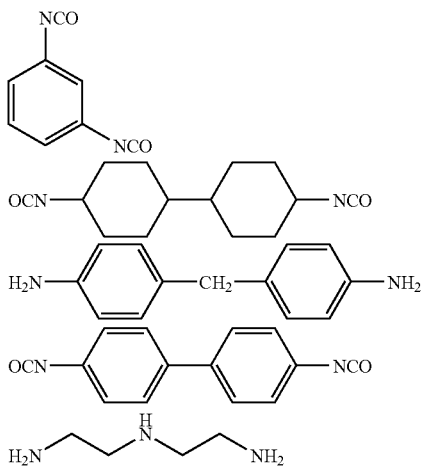

In the process of forming the polymerization initiation layer, the cross-linking agent is added to a coating liquid that contains the specific polymerization initiation polymer. Thereafter, when the coating film is heated and dried, the cross-linking reaction proceeds due to the heat so that a strongly cross-linked structure can be formed. More specifically, the cross-linking reaction proceeds through the dehydration reaction represented by Formula ex1. below or the addition reaction represented by Formula ex2. below, when the cross-linked structure is formed. The temperature of such reactions is preferably from 50° C. to 300° C., more preferably from 80° C. to 200° C.

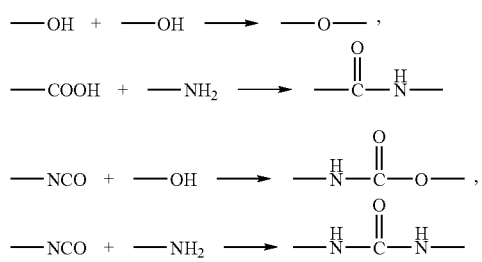

The addition amount of the cross-linking agent in the coating liquid may vary with the amount of the cross-linking group introduced in the specific polymerization initiation polymer and in general is preferably from 0.01 to 50 equivalents, more preferably from 0.01 to 10 equivalents, still more preferably from 0.5 to 3 equivalents, based on the mole number of the cross-linking group, in terms of degree of cross-linking or in terms of the effect of the unreacted cross-linking component residue on the polymerization reaction.

[Support]

The support for use in the invention is preferably a dimensionally stable, plate- or sheet-shaped material. Examples of such a material include paper, plastic-laminated paper (such as polyethylene, polypropylene or polystyrene laminated paper); a metal sheet (such as a aluminum, zinc or copper sheet); a plastic film (such as a cellulose diacetate film, a cellulose triacetate film, a cellulose propionate film, a cellulose butyrate film, a cellulose acetate butyrate film, a cellulose nitrate film, a polyethylene terephthalate film, a polyethylene film, a polystyrene film, a polypropylene film, a polycarbonate film, and a polyvinylacetal film); and a paper or plastic film which is laminated with any of the above metals or on which any of the above metals is vapor-deposited. The support for use in the invention is preferably a polyester film or an aluminum sheet. Alternatively, the polymerization initiation layer may be shaped into a film and then used as the support.

When the aluminum sheet is used as the support, any known surface treatment such as a surface roughening treatment and an anodic oxidation treatment may be performed as needed.

In the other preferred case that the plastic film such as a polyester film is used as the support, the film preferably has a roughened surface in terms of formability of the graft polymer layer or in terms of adhesion of it to the graft polymer layer.

When the polymerization initiation layer is shaped into a film and used as the support for the metal fine particle dispersion pattern material according to the invention, it is preferred that the surface of the support should be roughened, to which the polymer compound will be directly chemically coupled to form the pattern-forming layer.

[Preparation of Polymer Initiation Layer]

This process may include the steps of: dissolving the specific polymerization initiation polymer in an appropriate solvent to prepare a coating liquid; placing the coating liquid on the support by application or the like; and removing the solvent so that a cross-linking reaction proceeds to form a film.

(Solvent)

Any solvent that can dissolve the specific polymerization initiation polymer may be used for the application of the polymerization initiation layer. In terms of easiness of drying and workability, the solvent preferably has a not so high boiling point and should specifically be selected so as to have a boiling point of about 40° C. to about 150° C.

Specific examples of the solvent include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, and 3-methoxypropyl acetate.

One or more of these solvents may be used alone or in combination. The solids content of the coating solution is appropriately from 2 to 50% by weight.

In view of the ability to initiate graft polymerization and film properties, the amount of the applied polymerization initiation layer is preferably from 0.1 to 20 g/m$^2$, more preferably from 1 to 15 g/m$^2$ in terms of weight after drying.

<Graft Polymer Layer Comprising Hydrophilic Region and Hydrophobic Region and the Step of Forming the Same (the Pattern-Forming Step)>

A description is then provided of the graft polymer layer comprising the hydrophilic region and the hydrophobic region, which is formed on the surface of the polymerization initiation layer. According to the first embodiment of the method of forming the metal fine particle pattern of the invention, the graft polymer layer comprising the hydrophilic region and the hydrophobic region is formed by a process including the steps of: directly coupling a polymer compound to the surface of the polymerization initiation layer, wherein the polymer compound has a functional group whose hydrophilicity or hydrophobicity can be changed by heat, acid or radiation; and then applying heat, acid or radiation so as to form a pattern comprising a hydrophilic region and a hydrophobic region.

Such a graft polymer layer comprising the hydrophilic region and the hydrophobic region is generally produced using a technique called "surface graft polymerization".

(Surface Graft Polymerization)

Graft polymerization is a method of synthesizing a graft polymer which includes the step of providing an active species on a polymer compound so as to initiate polymerization and to further polymerize another monomer. It is specifically called "surface graft polymerization", when the polymer compound, on which the active species will be provided, forms a solid surface. In the invention, the specific polymerization polymer may be the polymer compound on which the active species will be provided, and the surface of the polymerization initiation layer may be the solid surface.

In the invention, the graft polymer may include a product of coupling a desired polymer to an active species on the chain of the polymer compound.

The surface graft polymerization method for carrying out the invention may be any known method disclosed in literatures. For example, "Shin Kobunshi Jikken-gaku" (New Polymer Experimentation) 10, edited by Society of Polymer Science, Japan, published by Kyoritsu Shuppan Co., Ltd., p. 135, 1994 discloses such a surface graft polymerization method including a photo-graft polymerization method and a plasma-application graft polymerization method. Kyuchaku Gijutu Binran (Manual of Adsorption Techniques), published by NTS Co., Ltd., supervised by Takeuchi, February 1999, pages 203 and 695 also discloses a radiation-application graft polymerization method using radiation such as γ ray and electron beam.

Specifically, the photo-graft polymerization method may be the method disclosed in JP-A No. 63-92658, 10-296895, 11-119413, or 2000-80189.

The method disclosed in the above literature or Y. Ikeda, et al., Macromolecules, vol. 19, page 1804 (1986) may be used for the plasma-application graft polymerization method or the radiation-application graft polymerization method.

In the invention, the specific polymerization initiation polymer is fixed by a cross-linking reaction as described above, so that the surface of the polymerization initiation layer formed by the fixation can form a fixed surface. Therefore, active points can easily be generated at high efficiency with low energy.

(Application of Energy for Providing Polymerization Initiation Layer with Active Species)

The polymerization initiation layer, specifically the specific polymerization initiation polymer forming the polymerization initiation layer is provided with an active species by application of energy. Any method may be used to apply such energy, as long as it can provide sufficient energy to activate the polymerization initiation group in the polymerization initiation layer and to allow a polymerizable double-bond compound to be graft-polymerized with the active species. For example, application of an active light beam such as exposure to light is preferred in terms of cost and simplicity of equipment.

The active light beam for use in the application of energy may be ultraviolet light, visible light or infrared light, preferably ultraviolet light or visible light, particularly preferably ultraviolet light in terms of high polymerization speed. The main wavelength of the active light beam is preferably from 250 nm to 800 nm.

Examples of the light source include a low-pressure mercury lamp, a high-pressure mercury lamp, a fluorescent lamp, a xenon lamp, a carbon arc lamp, a tungsten incandescent lamp, and sunlight.

The time required to apply the active light beam is generally from few seconds to 24 hours, depending on the working conditions such as the light source.

[Polymer Compound having the Functional Group Whose Hydrophilicity or Hydrophobicity can be Changed by Heat, Acid or Radiation]

A description is provided below of the polymer compound having the functional group whose hydrophilicity or hydrophobicity can be changed by heat, acid or radiation (hereinafter sometimes referred to as the polarity conversion group) for use in the first embodiment of the method of forming the metal fine particle pattern according to the invention.

In the invention, the polarity conversion group may be classified into (A) a type whose hydrophilicity or hydrophobicity can be changed by heat or acid and (B) a type whose hydrophilicity or hydrophobicity by radiation (light).

[(A) Functional Group Whose Hydrophilicity or Hydrophobicity can be Changed by Heat or Acid]

A description is provided of (A) the functional group whose hydrophilicity or hydrophobicity can be changed by heat or acid.

In the invention, the method of forming the graft polymer layer comprising the hydrophilic region and the hydrophobic region may include the steps of: directly coupling the polymer compound to the surface of the polymerization initiation layer, wherein the polymer compound has the functional group whose hydrophilicity or hydrophobicity can be changed by heat, acid or radiation; and then applying heat, acid or radiation in a pattern to form a pattern comprising the hydrophilic region and the hydrophobic region.

The metal fine particle pattern material or the electroconductive pattern material can be produced through a simple process including the steps of adding a metal ion or a metal salt to the resulting hydrophilic or hydrophobic region and reducing it.

(A) The polarity conversion group whose hydrophilicity or hydrophobicity can be changed by heat or acid may be classified into two types: (A-1) a functional group capable of changing from a hydrophobic form to a hydrophilic form and (A-2) a functional group capable of changing from a hydrophilic form to a hydrophobic form.

((A-1) Functional Group Capable of Changing from Hydrophobic Form to Hydrophilic Form can be changed by Heat or Acid)

The functional group (A-1) capable of changing from a hydrophobic form to a hydrophilic form may be a certain known functional group disclosed in literatures.

Useful examples of such a functional group and a compound having the functional group include, but are not limited to, an alkyl sulfonate group, a disulfone group and a sulfone imide group as disclosed in JP-A No. 10-282672; an alkoxyalkyl ester group as disclosed in EP 0652483 and WO 92/9934; a tert-butyl ester group as disclosed in H. Ito et al., Macromolecules, vol. 21, pp. 1477; and any other carboxylate ester group which is blocked by a certain acid-decomposable group disclosed in literatures, such as a silyl ester group and a vinyl ester group.

Examples thereof also include, but are not limited to, an iminosulfonate group as disclosed in Masahiro Tsunooka, "Hyomen (Surface)," vol. 133, p. 374 (1995), β-ketone sulfonate ester groups as disclosed in Masahiro Tsunooka, Polymer Preprints, Japan, vol. 46, pp. 2045 (1997), and a nitrobenzylsulfonate compound group as disclosed in Akio Yamaoka, JP-A No. 63-257750.

Particularly preferred are a secondary alkyl sulfonate group as shown below, a tertiary calboxylate ester group and an alkoxyalkyl ester group as shown below.

In the invention, the functional group capable of changing from a hydrophobic form to a hydrophilic form by heat or acid is particularly preferably the secondary alkyl sulfonate group represented by Formula (15):

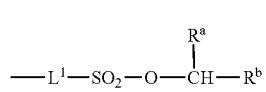

Formula (15)

wherein $L^1$ represents an organic group which comprises a nonmetallic atom or atoms necessary for coupling to a polymer skeleton; and $R^a$ and $R^b$ each represents a substituted or unsubstituted alkyl group; or $R^a$ and $R^b$ may form a ring together with the secondary carbon atom (CH) which is coupled thereto.

In Formula (15), $R^a$ and $R^b$ may each represent substituted or unsubstituted alkyl or substituted or unsubstituted aryl. $R^a$ and $R^b$ may also form a ring together with the secondary carbon atom which is coupled thereto. When $R^a$ and $R^b$ each represent substituted or unsubstituted alkyl, the alkyl may be a straight-chain, branched or cyclic alkyl group such as methyl, ethyl, isopropyl, tert-butyl, and cyclohexyl, and preferably has 1 to 25 carbon atoms. When $R^a$ and $R^b$ each represent substituted or unsubstituted aryl, the aryl may be a homocyclic or heterocyclic aryl group. The homocyclic aryl group may be a 6- to 19-carbon group such as phenyl, naphthyl, anthracenyl, and pyrenyl. The heterocyclic aryl group may be a group of 3 to 20 carbon atoms and 1 to 5 hetero atoms, such as pyridyl, furyl, and any fused benzene ring group such as quinolyl, benzofuryl, a thioxanthone group, and a carbazole group.

When $R^a$ or $R^b$ is substituted alkyl or substituted aryl, the substituent may be an alkoxy group of 1 to 10 carbon atoms, such as methoxyl and ethoxyl; a halogen atom such as a fluorine atom, a chlorine atom and a bromine atom; a halogen-substituted alkyl group such as trifluoromethyl and trichloromethyl; an alkoxycarbonyl or aryloxycarbonyl group of 2 to 15 carbon atoms, such as methoxycarbonyl, ethoxycarbonyl, tert-butyloxycarbonyl, and p-chlorophenyloxycarbonyl; hydroxyl; an acyloxy group such as acetyloxy, benzoyloxy and p-diphenylaminobenzoyloxy; a carbonate group such as tert-butyloxycarbonyloxy; an ether group such as tert-butyloxycarbonylmethyloxy and 2-pyranyloxy; a substituted or unsubstituted amino group such as amino, dimethylamino, diphenylamino, morpholino, and acetylamino; a thioether group such as methylthio and phenylthio; an alkenyl group such as vinyl and styryl; nitro; cyano; an acyl group such as formyl, acetyl and benzoyl; an aryl group such as phenyl and naphthyl; and a hetero aryl group such as pyridyl. When $R^a$ or $R^b$ is substituted aryl, the substituent may be an alkyl group such as methyl and ethyl as well as the above substituent.

$R^a$ and $R^b$ are each preferably substituted or unsubstituted alkyl in terms of good stability over time. More specifically, an alkyl group having an electron-absorbing substituent such as alkoxy, carbonyl, alkoxycarbonyl, cyano, and a halogen group is particularly preferred, or such an alkyl group as cyclohexyl and norbornyl is particularly preferred. As regards a physical property, the proton NMR chemical shift of the secondary methyne hydrogen in the compound preferably appears at 4.4 ppm or a lower magnetic field, more preferably at 4.6 ppm or a lower magnetic field, in chloroform-d. Thus, it is believed that the alkyl group having the electron-absorbing substituent would particularly be preferred, because a carbocation which could be produced as an intermediate during the pyrolysis reaction can be destabilized so that the decomposition can be suppressed. In particular, specific examples of —$CHR^aR^b$ preferably include the following structures:

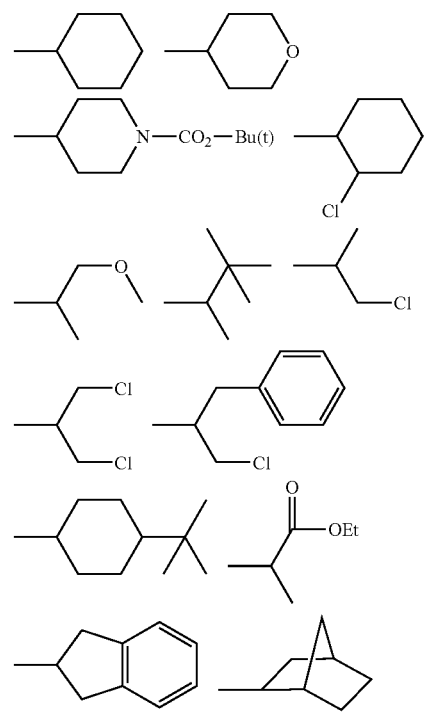

The multivalent linking group which comprises a nonmetallic atom or atoms and is represented by $L^1$ in Formula (15) may comprise 1 to 60 carbon atoms, 0 to 10 nitrogen atoms, 0 to 50 oxygen atoms, 1 to 100 hydrogen atoms, and 0 to 20 sulfur atoms. More specifically, such a linking group comprises any or any combination of the following unit structures:

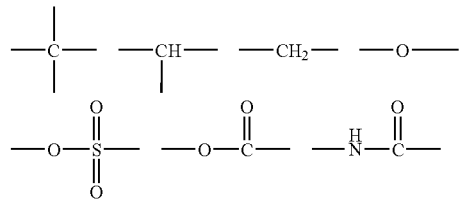

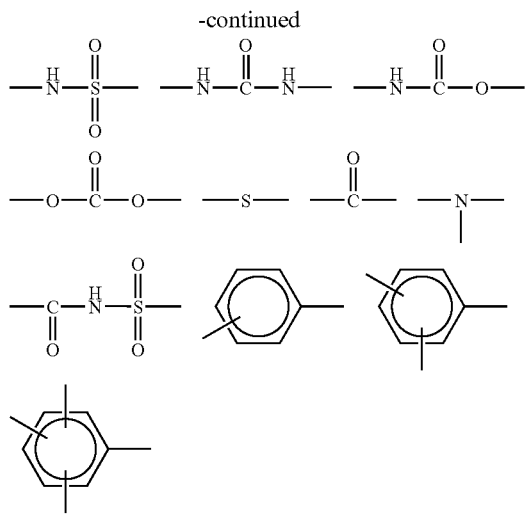

Polynaphthalene, Polyanthracene

The multivalent linking group may have a substituent. In such a case, the substituent may be an alkyl group of 1 to 20 carbon atoms, such as methyl and ethyl, an aryl group of 6 to 16 carbon atoms, such as phenyl and naphthyl, a hydroxyl group, a carboxyl group, a sulfonamide group, an N-sulfonylamide group, an acyloxy group of 1 to 6 carbon atoms, such as acetoxy, an alkoxy group of 1 to 6 carbon atoms, such as methoxyl and ethoxyl, a halogen atom such as a chlorine atom and a bromine atom, an alkoxycarbonyl group of 2 to 7 carbon atoms, such as methoxycarbonyl, ethoxycarbonyl and cyclohexyloxycarbonyl, a cyano group, or a carbonate ester group such as a tert-butyl carbonate group.

In the invention, a particularly good functional group capable of changing from a hydrophobic form to a hydrophilic form by heat or acid is the alkoxyalkyl ester group represented by Formula (16):

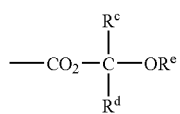

Formula (16)

wherein $R^c$ represents a hydrogen atom; $R^d$ represents a hydrogen atom or alkyl of at most 18 carbon atoms; $R^e$ represents alkyl of at most 18 carbon atoms; and any two of $R^c$, $R^d$ and $R^e$ may be coupled to form a ring. In particular, $R^d$ and $R^e$ are preferably coupled to form a five- or six-membered ring.

Under the foregoing, the secondary alkyl sulfonate group represented by Formula (15) is particularly preferred as the functional group capable of changing from a hydrophobic form to a hydrophilic form by heat or acid, in the invention.

Specific examples of the functional group and a tertiary calboxylate ester group represented by Formula (15) or (16) (Functional Groups (1) to (13)) are shown as follows:

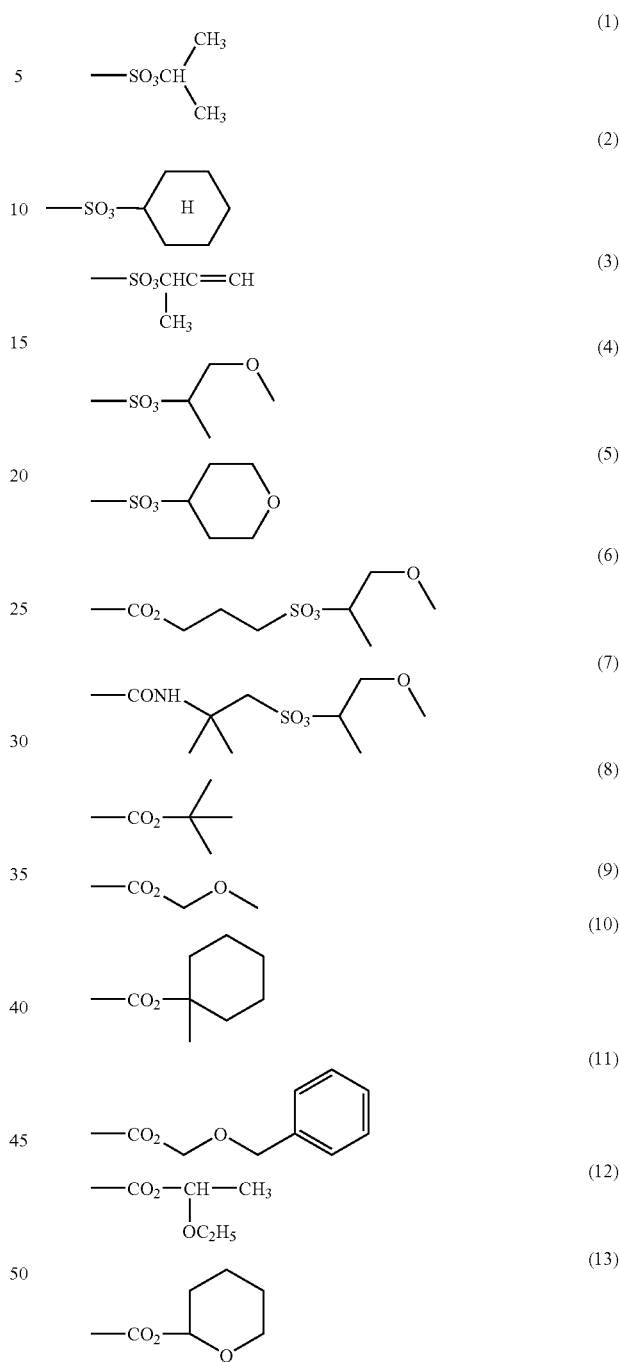

((A-2) Functional Group Capable of Changing from Hydrophilic Form to Hydrophobic Form by Heat or Acid)

In the invention, the functional group (A-2) capable of changing from a hydrophilic form to a hydrophobic form by heat or acid may be a certain known functional group such as a group of an onium base-containing polymer, specifically a group of an ammonium salt-containing polymer, as disclosed in JP-A No. 10-296895 and U.S. Pat. No. 6,190,830. Specifically, such a group may be (meth)acryloyloxyalkyltrimethylammonium. Preferred examples thereof also include, but are not limited to, the carboxylic acid group and the carboxylate group each represented by Formula (17):

Formula (17)

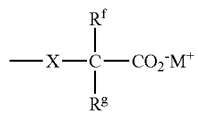

wherein X represents —O—, —S—, —Se—, —NR$^h$—, —CO—, —SO—, —SO$_2$—, —PO—, —SiR$^h$R$^i$—, or —CS—; R$^f$, R$^g$, R$^h$, and R$^i$ each independently represent a monovalent group; and M represents an ion having a positive charge.

Examples of R$^f$, R$^g$, R$^h$, or R$^i$ include —F, —Cl, —Br, —I, —CN, —R$^j$, —OR$^j$, —OCOR$^j$, —OCOOR$^j$, —OCONR$^j$R$^k$, —OSO$_2$R$^j$, —COR$^j$, —COOR$^j$, —CONR$^j$R$^k$, NR$^j$R$^k$, —NR$^j$—COR$^k$, —NR$^j$—COOR$^k$, —NR$^j$—CONR$^k$R$^l$, —SR$^j$, —SOR$^j$, —SO$_2$R$^j$, and —SO$_3$R$^j$.

R$^j$, R$^k$ and R$^l$ each represent a hydrogen atom, alkyl, aryl, alkenyl, or alkynyl.

Specifically, R$^f$, R$^g$, R$^h$, or R$^i$ is preferably a hydrogen atom, alkyl, aryl, alkynyl, or alkenyl.

Specific examples of M$^1$ include the ions having a positive charge as shown above.

The M$^+$ in the formula (17) is ion having a positive charge and may be sodium ion, potassium ion, ammonium ion lithium ion and hydrogen ion.

Specific examples of the functional group represented by Formula (17) (Functional Groups (14) to (31)) are shown as follows:

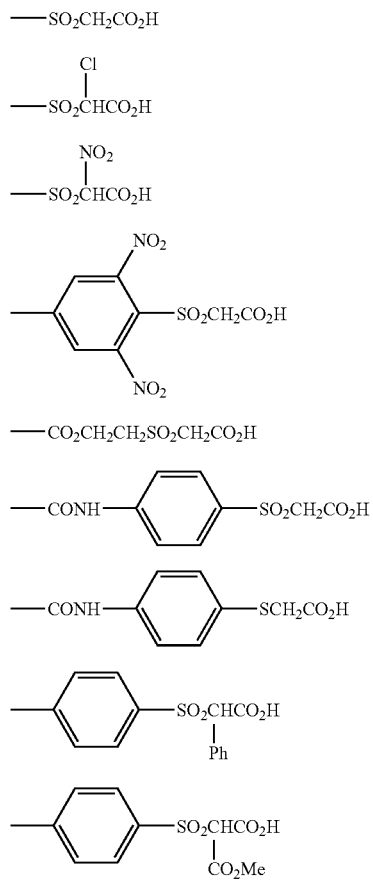

(14)
(15)
(16)
(17)
(18)
(19)
(20)
(21)
(22)

-continued

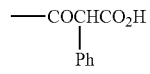 (23)

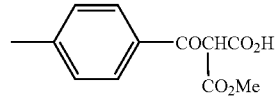 (24)

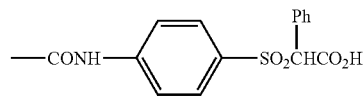 (25)

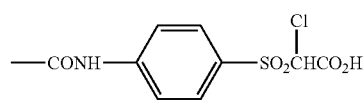 (26)

—SO$_2$CH$_2$CO$_2^-$Na$^+$ (27)

—CO$_2$CH$_2$CH$_2$SO$_2$CH$_2$CO$_2^-$Na$^+$ (28)

—SO$_2$CH$_2$CO$_2^-$NMe$_4^+$ (29)

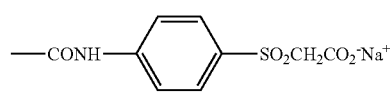 (30)

 (31)

In the invention, the polymer compound having the polarity conversion group may be a homopolymer of a single monomer having any of the above functional groups or may be a copolymer of two or more monomers having any of the above functional groups. The copolymer may comprise any other monomer within the limits of not ruining the effect of the invention.

Specific examples of the monomer having the functional group as shown above are shown below.

Specific examples of the monomer having the functional group a and tertiary calboxylate ester group represented by Formula (15) or (16) (Illustrative Monomers (M-1) to (M-15)) are shown as follows:

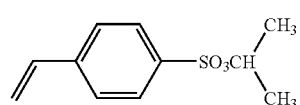 M-1

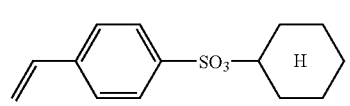 M-2

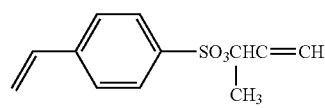 M-3

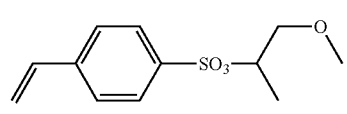 M-4

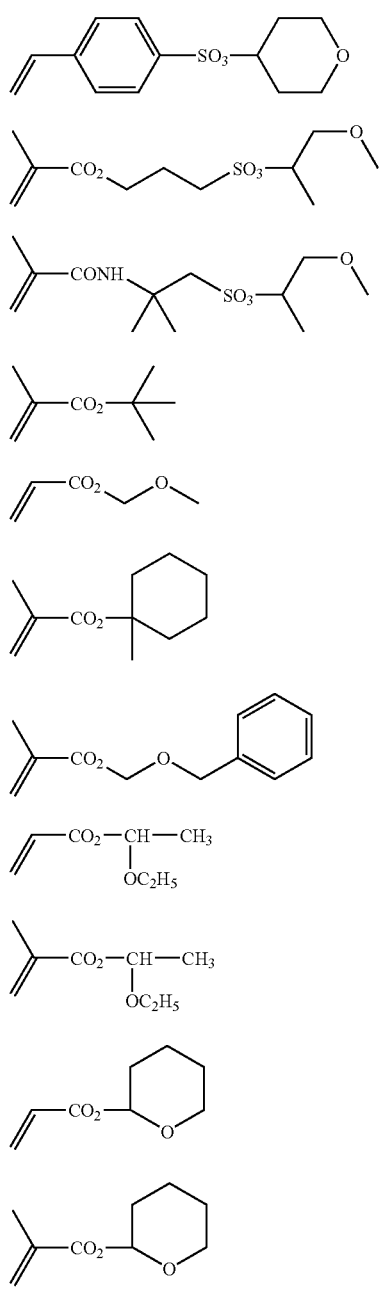
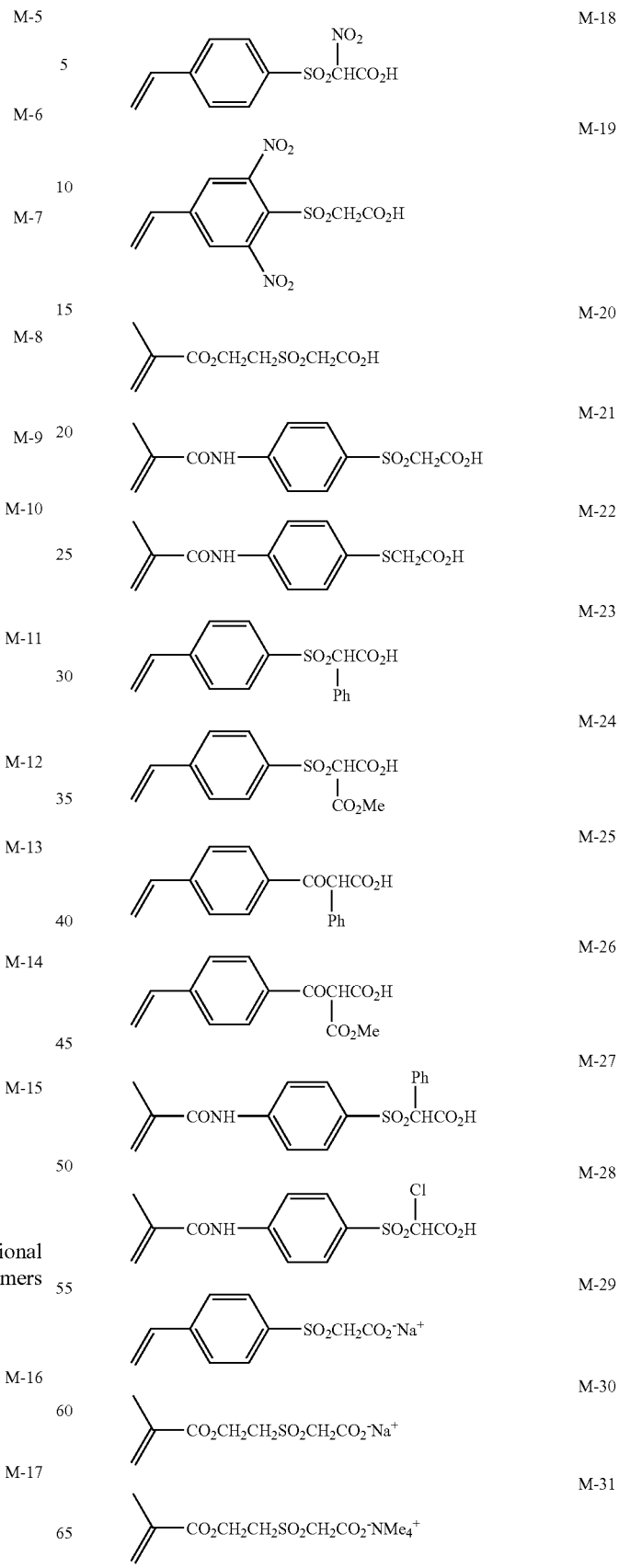
Specific examples of the monomer having the functional group represented by Formula (17) (Illustrative Monomers (M-16) to (M-33)) are shown as follows:
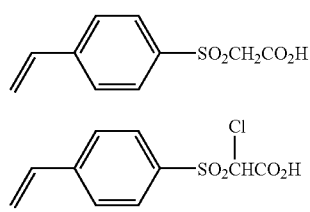

-continued

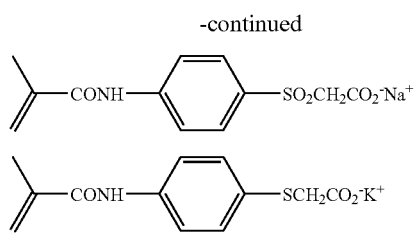

(Photo-Thermal Conversion Substance)

If light energy such as IR laser beam energy is applied in the process of forming the hydrophilic region and the hydrophobic region in the graft polymer layer which uses the polymer compound having the polarity conversion group as shown above, the desired portion should preferably contain a photo-thermal conversion substance for converting the light energy into thermal energy. For example, the photo-thermal conversion substance may be added to any of the graft polymer layer, an upper portion of the graft polymer layer, the polymerization initiation layer, and the support. A photo-thermal conversion substance-containing layer may also be provided between the polymerization initiation layer and the support.

The photo-thermal conversion substance may be any substance that can absorb light such as ultraviolet light, visible light, infrared ray, and white light, and can convert it into heat. Examples of such a substance include carbon black, carbon graphite, pigments, phthalocyanine pigments, iron powder, graphite powder, iron oxide powder, lead oxide, silver oxide, chromium oxide, iron sulfide, and chromium sulfide. Particularly preferred are metal fine particles, a dye and a pigment each having a maximum absorption wavelength in the range from 760 nm to 1200 nm, which corresponds to an exposure wavelength of an infrared laser for use in the application of the energy.

The dye may be a commercially available dye or a certain known dye as disclosed in literatures (for example, "Senryo Binran" (Manual of Dyes), edited by Society of Synthetic Organic Chemistry, Japan, 1970. Examples of the dye include an azo dye, a metal complex salt azo dye, a pyrazolone azo dye, an anthraquinone dye, a phthalocyanine dye, a carbonium dye, a quinoneimine dye, a methine dye, a cyanine dye, and a metal thiolate complex. Preferred examples of the dye include cyanine dyes as disclosed in JP-A Nos. 58-125246, 59-84356, 59-202829, and 60-78787, methine dyes as disclosed in JP-A Nos. 58-173696, 58-181690 and 58-194595, naphthoquinone dyes as disclosed in JP-A Nos. 58-112793, 58-224793, 59-48187, 59-73996, 60-52940, and 60-63744, squalirium dyes as disclosed in JP-A No. 58-112792, and cyanine dyes as disclosed in U.K. Patent No. 434,875.

A near infrared absorption sensitizer as disclosed in U.S. Pat. No. 5,156,938 is preferably used. Also preferred are a substituted arylbenzo(thio)pyrylium salt as disclosed in U.S. Pat. No. 3,881,924, a trimethine thiapyrylium salt as disclosed in JP-A No. 57-142645 (U.S. Pat. No. 4,327,169), pyrylium compounds as disclosed in JP-A Nos. 58-181051, 58-220143, 59-41363, 59-84248, 59-84249, 59-146063, and 59-146061, a cyanine dye as disclosed in JP-A No. 59-216146, a pentamethine thiopyrylium salt as disclosed in U.S. Pat. No. 4,283,475, and pyrylium compounds as disclosed in JP-B Nos. 05-13514 and 05-19702. Other preferred examples of the dye include the near infrared absorbing dyes represented by Formula (I) or (II) disclosed in U.S. Pat. No. 4,756,993. Particularly preferred are a cyanine dye, a squalirium dye, a pyrylium salt, and a nickel thiolate complex.

The pigment for use may be any of the commercially available pigments and the pigments disclosed in Color Index (C. I.) Handbook, "Saishin Ganryo Binran" (Latest Pigments Handbook) edited by Japan Society of Pigment Technology and published in 1977, "Saishin Ganryho Oyo Gijutsu" (Latest Applied Pigment Technology) published by CMC, 1986, and "Insatsu Inki Gijyutsu" (Printing Ink Technology) published by CMC, 1984. Examples of the pigment type include black pigments, yellow pigments, orange pigments, brown pigments, red pigments, violet pigments, blue pigments, green pigments, fluorescent pigments, metallic powder pigments, and other pigments such as polymer-binding pigments. Specific examples of the applicable pigment include insoluble azo pigments, azo lake pigments, condensed azo pigments, chelate azo pigments, phthalocyanine type pigments, anthraquinone type pigments, perylene or perinone type pigments, thioindigo type pigments, quinacridone type pigments, dioxazine type pigments, isoindolinone type pigments, quinophthalone type pigments, dyed lake pigments, azine pigments, nitroso pigments, nitro pigments, natural pigments, fluorescent pigments, inorganic pigments, and carbon black. In particular, carbon black is preferred.

Based on the total solids of the photo-thermal conversion substance-containing layer, the dye or the pigment may be used in an amount of 0.01 to 50% by mass, preferably in an amount of 0.1 to 10% by mass, and in particular, the dye is preferably used in an amount of 0.5 to 10% by mass, or the pigment is preferably used in an amount of 3.1 to 10% by mass. If the addition amount of the dye or the pigment is in the above range, the sensitivity can be high, and the film strength of the photo-thermal conversion substance-containing layer can be sufficient.

[(B) Functional Group Whose Hydrophilicity or Hydrophobicity by Light]

Some of the functional groups whose hydrophilicity or hydrophobicity can change its polarity by application of light with a wavelength of 700 nm or less. Such a functional group (B) whose hydrophilicity or hydrophobicity by light (the polarity conversion group responsive to light with a wavelength of 700 nm or less) can change its polarity at high sensitivity, because it can directly cause decomposition, ring opening or dimerization by application of light with a specific wavelength without heat or exposure to a long wavelength such as infrared ray. A description is provided below of the functional group whose hydrophilicity or hydrophobicity by application of light with a wavelength of 700 nm or less.

The polarity conversion group (B) whose hydrophilicity or hydrophobicity by light may be classified into two types: (B-1) a functional group capable of changing from a hydrophobic form to a hydrophilic form and (B-2) a functional group capable of changing from a hydrophilic form to a hydrophobic form.

((B-1) Functional Group Capable of Changing from Hydrophobic Form to Hydrophilic Form by Light)

The functional group (B-1) capable of changing from a hydrophobic form to a hydrophilic form by light may be any of the functional groups represented by Formulae (18) to (24) below, respectively.

In the invention, examples of the functional group capable of changing from a hydrophobic form to a hydrophilic form by light include those represented by Formula (18):

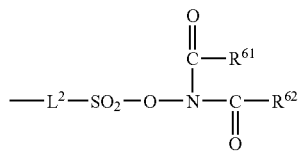

Formula (18)

wherein $L^2$ represents a multivalent organic group comprising a nonmetallic atom or atoms necessary for coupling to a polymer skeleton; and $R^{61}$ and $R^{62}$ each independently represent alkyl or an aromatic ring; or $R^{61}$ and $R^{62}$ may be coupled to each other to form a ring.

In Formula (18), $R^{61}$ and $R^{62}$ each independently represent alkyl or an aromatic ring or may be coupled to each other to form a ring.

The alkyl represented by $R^{61}$ or $R^{62}$ preferably has 1 to 8 carbon atoms. Examples of the alkyl include methyl, ethyl, propyl, butyl, pentyl, hexyl, heptyl, octyl, isopropyl, isobutyl, sec-butyl, tert-butyl, cyclohexyl, isopentyl, neopentyl, 1-methylbutyl, isohexyl, 2-ethylhexyl, 2-methylhexyl, and cyclopentyl. Alternatively, $R^{61}$ and $R^{62}$ may each represent a unit of —$(CH_2)_n$— (wherein n is from 1 to 4) and may be coupled to each other.

In a particularly preferred embodiment, $R^{61}$ and $R^{62}$ each represent a unit of —$(CH_2)_n$— (wherein n is from 1 to 4) and are coupled to each other to from a ring structure.

$R^{61}$ or $R^{62}$ may be substituted or unsubstituted alkyl. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, aryloxycarbonyl, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, and acetoxyphenyl.

The aromatic ring group represented by $R^{61}$ or $R^{62}$ preferably has 6 to 14 carbon atoms. Examples thereof include phenyl, biphenyl, naphthyl, and mesityl. Particularly preferred are phenyl and naphthyl.

$R^{61}$ or $R^{62}$ may represent a substituted or unsubstituted aromatic ring group. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, and aryloxycarbonyl.

More specifically, $R^{61}$ and $R^{62}$ particularly preferably form an end structure represented by any of the formulae below, which includes the coupled carbonyl groups and the nitrogen atom coupled thereto.

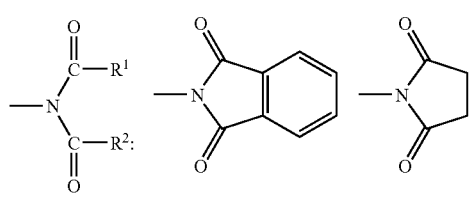

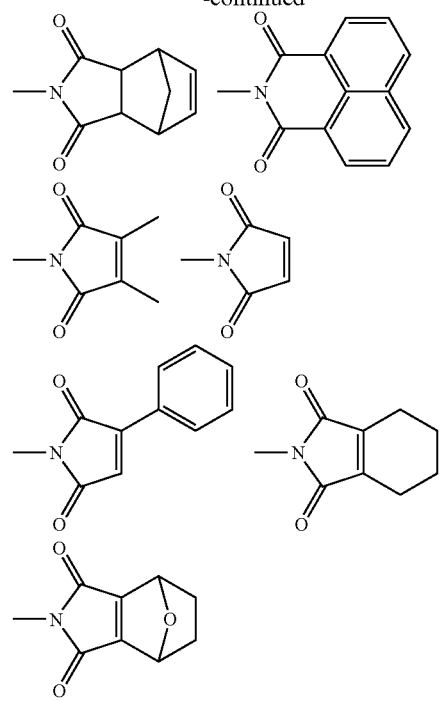

In Formula (18), $L^2$, which represents the multivalent linking group comprising a nonmetallic atom or atoms, has the same meaning as $L^1$. In particular, $L^2$ is preferably a substituted or unsubstituted bivalent benzene ring or an alkyl group of 1 to 8 carbon atoms.

The multivalent linking group may have a substituent, which may be the same as in the case of $L^1$.

In the invention, the functional group capable of changing from a hydrophobic form to a hydrophilic form by light may be represented by Formula (19):

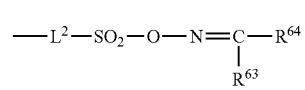

Formula (19)

wherein $L^2$ represents a multivalent organic group comprising a nonmetallic atom or atoms necessary for coupling to a polymer skeleton; and $R^{63}$ and $R^{64}$ each independently represent a monovalent substituent; or $R^{63}$ and $R^{64}$ may be coupled to each other to form a ring.

In Formula (19), $R^{63}$ and $R^{64}$ each independently represent a monovalent substituent and specifically alkyl, hydroxyl, alkoxy, amino, formyl, acyl, carboxyl, cyano, or an aromatic ring group.

The alkyl represented by $R^{63}$ or $R^{64}$ preferably has 1 to 8 carbon atoms. Examples of the alkyl include methyl, ethyl, propyl, butyl, pentyl, hexyl, heptyl, octyl, isopropyl, isobutyl, sec-butyl, tert-butyl, isopentyl, neopentyl, 1-methylbutyl, isohexyl, 2-ethylhexyl, 2-methylhexyl, and cyclopentyl. Alternatively, $R^{63}$ and $R^{64}$ may each represent a unit of —$(CH_2)_n$— (wherein n is from 1 to 4) and may be coupled to each other.

In a particularly preferred embodiment, $R^{63}$ and $R^{64}$ are each methyl or cyano, or are each a unit of —$(CH_2)_n$— (wherein n is from 1 to 4) and coupled to each other to from a ring structure.

The alkyl, hydroxyl, alkoxy, amino, formyl, acyl, carboxyl, or cyano represented by $R^{63}$ or $R^{64}$ may be substituted or unsubstituted. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, aryloxycarbonyl, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, and acetoxyphenyl.

The aromatic ring group represented by $R^{63}$ or $R^{64}$ preferably has 6 to 14 carbon atoms. Examples thereof include phenyl, biphenyl, naphthyl, and mesityl. Particularly preferred are phenyl and naphthyl.

$R^{63}$ or $R^{64}$ may represent a substituted or unsubstituted aromatic ring group. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, and aryloxycarbonyl.

In particular, $R^{63}$ or $R^{64}$ is preferably an optionally substituted or unsubstituted aromatic ring group having at least one nitro group and 6 to 14 carbon atoms.

More specifically, $R^{63}$ and $R^{64}$ particularly preferably form an end structure represented by any of the formulae below, which includes the —N=C moiety of Formula (19).

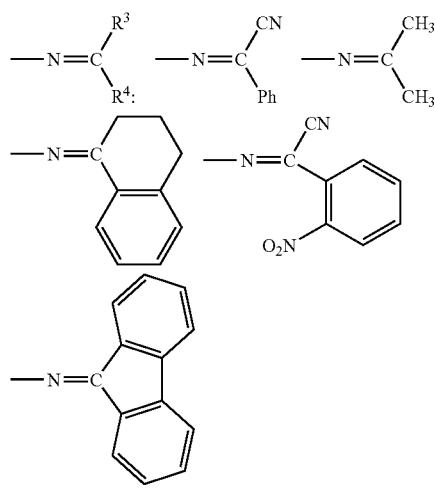

In Formula (19), $L^2$, which represents the multivalent linking group comprising a nonmetallic atom or atoms, has the same meaning as $L^2$ of Formula (18), and preferred examples thereof are also the same.

More specifically, the linking group may comprise any or any combination of the unit structures represented by Formula (18) as shown above. The multivalent linking group may have a substituent, which may be the same as the substituent for Formula (18).

In the invention, the functional group capable of changing from a hydrophobic form to a hydrophilic form by light may also be represented by Formula (20):

-$L^2$-$SO_2$—O—$NR^{66}$—$SO_2$—$R^{65}$ Formula (20)

wherein $L^2$ represents a multivalent organic group comprising a nonmetallic atom or atoms necessary for coupling to a polymer skeleton; and $R^{65}$ and $R^{66}$ each independently represent alkyl or an aromatic ring group.

In Formula (20), $R^{65}$ and $R^{66}$ each independently represent alkyl or an aromatic ring group. $L^2$ represents a multivalent organic group comprising a nonmetallic atom necessary for coupling to a polymer skeleton.

The alkyl represented by $R^{65}$ or $R^{66}$ is preferably a straight-chain alkyl group of 1 to 25 carbon atoms, such as methyl, ethyl, propyl, butyl, and pentyl, or a branched alkyl group of 1 to 8 carbon atoms, such as isopropyl, tert-butyl, sec-butyl, isopentyl, and neopentyl. Particularly preferred is methyl, ethyl, isopropyl, or tert-butyl.

$R^{65}$ or $R^{66}$ may represent a substituted or unsubstituted alkyl group. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, aryloxycarbonyl, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, and acetoxyphenyl.

Examples of the aromatic ring group represented by $R^{65}$ or $R^{66}$ include a homocyclic aromatic ring group and a heterocyclic aromatic ring group. The homocyclic aromatic ring group preferably has 6 to 19 carbon atoms. In particular, a ring group having one to four benzene rings is more preferred, such as phenyl, naphthyl, anthracenyl, pyrenyl, biphenyl, xylyl, and mesityl. The heterocyclic aromatic ring group preferably has 3 to 20 carbon atoms and 1 to 5 hetero atoms and is more preferably pyridyl, furyl, or a fused benzene ring group such as quinolyl, benzofuryl, a thioxanthone group, and a carbazole group.

$R^{65}$ or $R^{66}$ may represent a substituted or unsubstituted aromatic ring group. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, and aryloxycarbonyl.

In Formula (20), $L^2$, which represents the multivalent linking group comprising a nonmetallic atom or atoms, has the same meaning as $L^2$ of Formula (18), and preferred examples thereof are also the same.

More specifically, the linking group may comprise any or any combination of the unit structures represented by Formula (18) as shown above. The multivalent linking group may have a substituent, which may be the same as the substituent for Formula (18).

In the invention, the functional group capable of changing from a hydrophobic form to a hydrophilic form by light may also be represented by Formula (21):

-$L^2$-$SO_2$—$R^{67}$ Formula (21)

wherein $L^2$ represents a multivalent organic group comprising a nonmetallic atom or atoms necessary for coupling to a polymer skeleton; and $R^{67}$ represents alkyl or an aromatic ring group.

In Formula (21), $R^{67}$ represents alkyl or an aromatic ring group.

The alkyl represented by $R^{67}$ preferably has 1 to 8 carbon atoms. Examples of the alkyl include methyl, ethyl, propyl, butyl, pentyl, hexyl, heptyl, octyl, isopropyl, isobutyl, sec-butyl, tert-butyl, isopentyl, neopentyl, 1-methylbutyl, isohexyl, 2-ethylhexyl, 2-methylhexyl, and cyclopentyl.

$R^{67}$ may represent a substituted or unsubstituted alkyl group. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, aryloxycarbonyl, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, and acetoxyphenyl.

The aromatic ring group represented by $R^{67}$ preferably has 6 to 14 carbon atoms. Examples thereof include phenyl, biphenyl, naphthyl, and mesityl. Particularly preferred are phenyl and naphthyl.

$R^{67}$ may represent a substituted or unsubstituted aromatic ring group. The substituent to be introduced may be a monovalent nonmetallic atomic group, exclusive of hydrogen. Preferred examples thereof include a halogen atom such as F, Br, Cl, and I, hydroxyl, alkoxy, amino, formyl, acyl, carboxyl, alkoxycarbonyl, and aryloxycarbonyl.

More specifically, the structure of $R^{67}$ is particularly preferably represented by any of the following formulae:

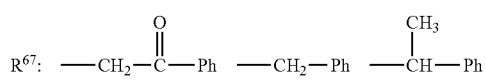

In Formula (21), $L^2$, which represents the multivalent linking group comprising a nonmetallic atom or atoms, has the same meaning as $L^2$ of Formula (18), and preferred examples thereof are also the same.

More specifically, the linking group may comprise any or any combination of the unit structures represented by Formula (18) as shown above. The multivalent linking group may have a substituent, which may be the same as the substituent for Formula (18).

In the invention, examples of the polarity conversion group also include the known functional groups represented by Formulae (22) to (24) below, respectively, which are disclosed in the literature.

Formula (22)

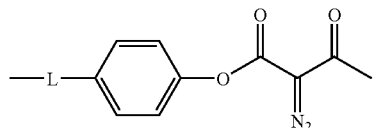

Formula (23)

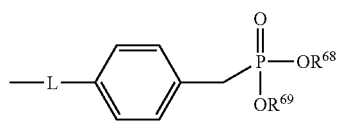

Formula (24)

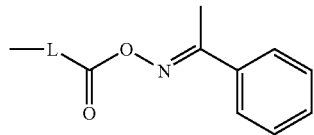

Formula (22) represents a moiety of a quinonediazide polymer as disclosed in P. Jagannathan, SPIE, 1994, page 2195.

Formula (23) represents a moiety of a phosphonic acid polymer as disclosed in M. L. Schilling, Macromol, 1995, page 110, wherein $R^{68}$ and $R^{69}$ each independently represent alkyl of 1 to 5 carbon atoms.

Formula (24) represents a moiety of an oxime ester group-containing polymer as disclosed in M. Tsunooka, J. Polym. Sci., Chem. Ed, 1996, page 2181.

Functional group represented by L in Formula (22) to (24) is same as above.

((B-2) Functional Group Capable of Changing from Hydrophilic Form to Hydrophobic Form by Light)

For example, the functional group (B-2) capable of changing from a hydrophilic form to a hydrophobic form by light may be a bis(pyridinio)ethylene group.

As shown above, the graft polymer layer is formed on the surface of the polymerization initiation layer, wherein the layer comprises the graft polymer having the polarity conversion group. The thickness of the graft polymer layer may be chosen depending on the purpose. In terms of resistance to damage and adhesion, the thickness of the graft polymer layer is generally preferably from 0.001 μm to 10 μm, more preferably from 0.01 μm to 5 μm, most preferably from 0.1 μm to 2 μm.

[Forming the Hydrophilic Region and the Hydrophobic Region]

Heat, acid or radiation is then applied to the graft polymer layer, which is formed as shown above and has the polarity conversion group, so that a pattern is formed which comprises a hydrophilic region and a hydrophobic region. In a case where application of light is used in combination with the photo-thermal conversion substance, heating by a scan with and exposure to an infrared range laser beam or the like may be used to form a pattern.

The method of forming a pattern may be a method of writing a pattern by heating, exposure to light, or application of radiation. For example, writing may be performed by application of light from an infrared laser, an ultraviolet lamp, a visible light source, or the like, or by application of an electron beam, γ ray, or the like, or writing may thermally performed using a thermal head. Examples of the light source for use include a mercury lamp, a metal halide lamp, a xenon lamp, a chemical lamp, and a carbon arc lamp. Examples of the radiation include an electron beam, X ray, an ion beam, and a far infrared ray. A g-line, an i-line, deep UV light, or a high density energy beam (laser beam) may also be used.

Specifically, preferred examples of a generally applicable technique include direct image-like writing by means of a thermal recording head or the like, scan and exposure by means of an infrared laser, high illumination flash exposure by means of a xenon discharge lamp, and infrared lamp exposure.

In the case that the polarity conversion group used in the graft polymer layer is responsive to light with a wavelength of 700 nm or less, any light application means may be used, as long as it can cause polarity conversion, specifically cause decomposition, ring opening or dimerization of the polarity conversion group so as to change the hydrophilicity or hydrophobicity. For example, light can be applied from an ultraviolet lamp, a visible light source or the like. Examples of the light source include a mercury lamp, a metal halide lamp, a xenon lamp, a chemical lamp, and a carbon arc lamp.

In order to directly form a pattern from computer digital data, laser exposure is preferably used to cause the polarity conversion. Examples of the applicable laser include a gas laser such as a carbon dioxide laser, a nitrogen laser, an Ar laser, a He/Ne laser, a He/Cd laser, and a Kr laser; a liquid (dye) laser; a solid laser such as a ruby laser and a Nd/YAG laser; a semiconductor laser such as a GaAs/GaAlAs laser and an InGaAs laser; and an excimer laser such as a KrF laser, a XeCl laser, a XeF laser, and an $Ar_2$ laser.

<Metal Fine Particle Dispersion Region and the Step of Forming the Same (Metal Fine Particle Dispersion Region-Forming Step)>

When a surface region of the graft polymer layer has changed in polarity as described above, the region becomes positively or negatively charged, regardless of whether the region is hydrophilic or hydrophobic. Thus, metal ions adsorb to the negatively charged region due to their ionic adsorption properties. The metal ions are then reduced so that metal fine particles are deposited on the region to form a metal fine particle dispersion region.

On the other hand, the positively charged region is impregnated with a metal salt-containing solution or a solution of a metal salt. The metal ions in the solution or in the metal salt are then reduced so that metal fine particles are deposited on the region to form a metal fine particle dispersion region.

The region with no change in polarity maintains the original surface state of the graft polymer layer and does not allow the adsorption of or the impregnation with the metal ion or the metal salt, and thus forms a region with no metal fine particle dispersion.

In the invention, the metal ion or the metal salt may be added by any of (1) a method of allowing the metal ion or the metal salt to adsorb to the graft polymer layer, (2) a method of impregnating the hydrophilic graft polymer layer with a solution by bringing the hydrophilic graft polymer layer into contact with the solution in which a metal salt is dispersed or dissolved, and (3) a method of performing graft polymerization of a polymerizable compound having a metal salt structure with the polymerization initiation layer. According to the method (2), the desired metal ion or salt can be added into the graft polymer layer, even if the graft polymer chain has a positive charge.

It is not clear what mechanism works in developing high adhesion of the metal fine particles in the method of forming the metal fine particle pattern or the electroconductive pattern according to the invention, while an assumption can be made as follows.

According to the invention, the graft polymer layer is formed on the surface of the polymerization initiation layer which is a product of cross-linking reaction fixation of the polymer having, in its side chain, the cross-linking group and the functional group having the ability to initiate polymerization. Thus, when the solution containing a compound (such as a monomer) for use in the graft polymer-producing step (graft polymerization) is brought into contact, the initiator component (the component having the ability to initiate polymerization) can be prevented from being eluted from the polymerization initiation layer. Consequently, by production of a homopolymer not directly binding to the surface of the polymerization layer can be suppressed, and all the terminals of the graft polymer can be directly chemically coupled to the surface of the polymerization initiation layer. Even when a mechanical process such as abrasion is added after the step of performing the reduction reaction of the metal ion or salt in the layer comprising the graft polymer (the graft polymer layer) to form the metal fine particle dispersion state, therefore, the metal fine particle dispersion pattern can be prevented from peeling off together with the graft polymer. Thus, a tough metal fine particle dispersion pattern can be formed which has improved adhesiveness of the metal fine particles.

In the invention, if the density of the metal fine particles is sufficiently high in the metal fine particle dispersion region, the region can produce electroconductivity. After the step of forming the metal fine particle dispersion region, the heating step as shown above may be performed to improve the adhesion and electroconductivity of the metal fine particles. This should be because the heating can cause the metal fine particles to fuse with each other so that adhesion between the metal fine particles can be improved and that the voids between the metal fine particles can be reduced.

A cross-cut tape adhesion test (JIS 5400) or a scratching test may be performed to examine the adhesion (durability) of the metal fine particles of the electroconductive pattern material or the metal fine particle pattern material formed by the method according to the invention.

A description is provided below of the metal fine particle pattern-forming method using (3) means to form a graft polymer layer in a pattern (hereinafter referred to as the second embodiment of the method of forming the metal fine particle pattern).

The second embodiment of the method of forming the metal fine particle pattern according to the invention comprises: forming a polymerization initiation layer on a support, wherein a polymer which has, in its side chain, a cross-linking group and a functional group having the ability to initiate polymerization is fixed by a cross-linking reaction (the polymerization initiation layer-forming step); forming a graft polymer layer in a pattern on a surface of the polymerization initiation layer (the pattern-forming step); and adding a metal ion or a metal salt to the graft polymer layer and thereafter reducing the metal ion or a metal ion in the metal salt to form a metal fine particle dispersion region (the metal fine particle dispersion region-forming step).

In the second embodiment of the method of forming the metal fine particle pattern according to the invention, the polymerization initiation layer and the step of forming the same (the polymerization initiation layer-forming step) are the same as those in the first embodiment of the method of forming the metal fine particle pattern according to the invention, and thus a detailed description thereof will be omitted.

A description is provided below of the patterned graft polymer layer, the step of forming the same (the pattern-forming step), the metal fine particle dispersion region, and the step of forming the same (the metal fine particle dispersion region-forming step).

<Patterned Graft Polymer Layer and the Step of Forming the Same (the Pattern-Forming Step)>

A description is provided of the patterned graft polymer layer formed on the polymerization initiation layer. In the second embodiment of the method of forming the metal fine particle pattern according to the invention, the patterned graft polymer layer may be formed by any of the following methods:

(1) A polymerizable compound having a hydrophilic group is brought into contact with the surface of the polymerization initiation layer, and energy is applied in a pattern, so that the polymerizable compound and the polymerization initiation layer are directly chemically coupled to each other to form a patterned graft polymer layer;

(2) A polymerizable compound having a metal salt structure is brought into contact with the surface of the polymerization initiation layer, and energy is applied in a pattern, so that the polymerizable compound and the polymerization initiation layer are directly chemically coupled to each other to form a patterned graft polymer layer;

(3) A polymerizable compound having a high affinity for a metal salt is brought into contact with the surface of the polymerization initiation layer, and energy is applied in a pattern, so that the polymerizable compound and the polymerization initiation layer are directly chemically coupled to each other to form a patterned graft polymer layer.

In the method of forming the patterned graft polymer layer by the use of the polymerizable compound having the metal salt structure, the production of the graft polymer layer and the addition of the metal salt can be made by a single-step process.

The patterned graft polymer layer may also be formed by a technique called "surface graft polymerization", which is similar to the above technique using the compound having the polarity conversion group, also called "surface graft polymerization". In the embodiment, while a composition that contains the polymerizable compound having a hydrophilic group, a metal salt structure or a structure having a high affinity for a metal salt is brought into contact with the surface of the polymerization initiation layer, the polymerizable compound is directly coupled to an active species that is produced on the surface of the polymerization initiation layer.

In this process, the "contact" may be made by the step of immersing the support with the polymerization initiation layer in a liquid composition that contains the polymerizable compound having a hydrophilic group, a metal salt structure or a structure having a high affinity for a metal salt. In terms of handleability or production efficiency of the metal fine particle pattern or electroconductive pattern material, it is preferred as described below that a method of application should be used to form a layer mainly composed of the polymerizable compound-containing composition on the surface of the polymerization initiation layer.

In the embodiment, the specific polymerization initiation polymer is fixed by a cross-linking reaction to form a fixed polymerization initiation layer surface. Thus, a large number of active points can easily be generated at high efficiency with low energy. Since only one end of the produced graft polymer can be fixed, the resulting surface can have higher hydrophilicity, a higher content of the metal salt structure or a higher affinity for a metal salt.

Another means to form a hydrophilic compound in a pattern as disclosed in T. Matsuda, Y. Nakayama, Langmuir, vol. 15, 1999, page 5560 and Macromolecules vol. 29, 1996, page 8622 may be used, wherein a hydrophilic monomer is brought into contact and exposed to light in a pattern so that surface graft polymerization occurs to form a patterned hydrophilic layer having a surface on which polyacrylic acid is fixed.

In the invention, a photo-graft method is preferably performed in which energy is applied through the application of light in order to form the surface graft.

[Polymerizable Compound Having Hydrophilic Group]

A description is provided below of the polymerizable compound having the hydrophilic group for use in the second embodiment of the method of forming the metal fine particle pattern according to the invention.

The polymerizable compound having the hydrophilic group for use in the invention may refer to a radically polymerizable group-containing hydrophilic compound that comprises: a hydrophilic monomer, a hydrophilic macromonomer or a hydrophilic homopolymer or copolymer produced with at least one of the above hydrophilic monomers; and an ethylenic addition-polymerizable unsaturated group such as vinyl, allyl and (meth)acryl, which is introduced in the monomer or the polymer and serves as a polymerizable group.

Such a radically polymerizable group-containing hydrophilic compound has a polymerizable group at least at its end or its side chain. The radically polymerizable group-containing hydrophilic compound preferably has the polymerizable group at its end, more preferably at its end and its side chain.

Such a radically polymerizable group-containing hydrophilic compound having the introduced ethylenic addition-polymerizable unsaturated group may be synthesized as shown below.

Examples of the synthesis method include a method of copolymerizing the hydrophilic monomer and a monomer having the ethylenic addition-polymerizable unsaturated group, a method including the steps of copolymerizing the hydrophilic monomer and a monomer having a double bond precursor and then introducing the double bond by a treatment with a base or the like, and a method of allowing the functional group of the hydrophilic compound to react with a monomer having the ethylenic addition-polymerizable unsaturated group. In terms of synthesis suitability, the method of allowing the functional group of the hydrophilic compound to react with a monomer having the ethylenic addition-polymerizable unsaturated group is particularly preferred.

The hydrophilic monomer for use in the synthesis of the radically polymerizable group-containing hydrophilic compound having a radically polymerizable group at an end of the main chain and/or the side chain may be a monomer having a hydrophilic group such as a carboxyl group, a sulfonic acid group, a phosphoric acid group, an amino group or a salt thereof, a hydroxyl group, an amide group, and an ether group. Specific examples of such a monomer include (meth)acrylic acid or an alkali metal or amine salt thereof, itaconic acid or an alkali metal or amine salt thereof, 2-hydroxyethyl (meth)acrylate, (meth)acrylamide, N-monomethylol (meth)acrylamide, N-dimethylol (meth)acrylamide, allylamine or a hydrohalide salt thereof, 3-vinylpropionic acid or an alkali metal or amine salt thereof, vinylsulfonic acid or an alkali metal or amine salt thereof, 2-sulfoethyl (meth)acrylate, polyoxyethylene glycol mono (meth)acrylate, 2-acrylamide-2-methylpropanesulfonic acid, acid phosphoxypolyoxyethylene glycol mono(meth) acrylate, and N-vinylpyrolidone (with the following structure).

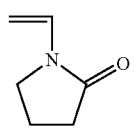

Examples of the allyl group-containing monomer to be copolymerized with the hydrophilic monomer include ally (meth)acrylate and 2-allyloxyethyl methacrylate.

Examples of the monomer having the double bond precursor include 2-(3-chloro-1-oxopropoxy)ethyl methacrylate.

The addition-polymerizable unsaturated group is used for the introduction of an unsaturated group through its reaction with a functional group in the hydrophilic monomer, such as carboxyl, amino or a salt thereof, hydroxyl, and epoxy. Examples of the monomer having such an addition-polymerizable unsaturated group include (meth)acrylic acid, glycidyl (meth)acrylate, allyl glycidyl ether, and 2-isocyanatoethyl (meth)acrylate.

A hydrophilic macromonomer is a preferred example of the radically polymerizable group-containing hydrophilic compound, which has a radically polymerizable group at its end and/or its side chain. Various types of methods for producing such a macromonomer for use in the invention are proposed, for example, in "Macromonomer no Kagaku to Kogyo" (Chemistry and Industry of Macromonomers), edited by Yamashita Yuya, published by IPC, Ltd., Sep. 20, 1989, chapter 2 "Macromonomer no Gosei" (Synthesis of Macromonomers). Examples of the hydrophilic macromonomer particularly useful in the invention include a macromonomer derived from a carboxyl-containing monomer such as acrylic acid and methacrylic acid, a sulfonic acid type macromonomer derived from a monomer such as 2-acrylamide-2-methylpropanesulfonic acid, vinylstyrenesulfonic acid and a salt thereof, an amide type macromonomer derived from a monomer such as (meth)acrylamide, N-vinylacetamide, N-vinylformamide, and N-vinylcarboxylic acid amide, a macromonomer derived from a hydroxyl-containing monomer such as hydroxyethyl methacrylate, hydroxyethyl acrylate and glycerol monomethacrylate, and a macromonomer derived from an alkoxy or ethylene oxide group-containing monomer such as methoxyethyl acrylate, methoxypolyethylene glycol acrylate and polyethylene glycol acrylate. A monomer having a polyethylene glycol chain or a polypropylene glycol chain may also be useful as the macromonomer in the invention.

Such a macromonomer conveniently has a molecular weight of 250 to 100,000, particularly preferably of 400 to 30,000.

(Useful Hydrophilic Monomer for use in Combination with the Above Hydrophilic Macromonomer)

Another hydrophilic monomer may be added to the above hydrophilic macromonomer having the polymerizable group. The rate of polymerization can be increased by the addition of such a hydrophilic monomer.

The addition amount of such a hydrophilic monomer is preferably from 0 to 60% by mass in terms of solids content in all the polymerizable compounds having the hydrophilic group. An amount of 60% by mass or more is not appropriate, because in such a case, the coating properties can be poor so that the coating cannot uniformly be made.

A certain hydrophilic monomer is useful for use in combination with the radically polymerizable group-containing hydrophilic compound, which has the radically polymerizable group at its end and/or side chain. Examples of such a hydrophilic monomer include a monomer having a positive charge such as ammonium and phosphonium; and a monomer having a negative charge or an acidic group capable of causing dissociation into a negative charge, such as a sulfonic acid group, a carboxyl group, a phosphoric acid group, and a phosphonic acid group. Any other hydrophilic monomer having a nonionic group such as a hydroxyl group, an amide group, a sulfonamide group, an alkoxy group, and a cyano group, may also be used.

In the embodiment, any of the hydrophilic monomers as shown below would be particularly useful for use in combination with the hydrophilic macromonomer.

Examples of the useful hydrophilic monomer include (meth)acrylic acid or an alkali metal or amine salt thereof, itaconic acid or an alkali metal or amine salt thereof, allylamine or a hydrohalide salt thereof, 3-vinylpropionic acid or an alkali metal or amine salt thereof, vinylsulfonic acid or an alkali metal or amine salt thereof, styrenesulfonic acid or an alkali metal or amine salt thereof, 2-sulfoethylene (meth)acrylate, 3-sulfopropylene (meth)acrylate or an alkali metal or amine salt thereof, 2-acrylamide-2-methylpropanesulfonic acid or an alkali metal or amine salt thereof, acid phosphoxypolyoxyethylene glycol mono(meth)acrylate or a salt thereof, 2-dimethylaminoethyl (meth)acrylate or a hydrohalide salt thereof, 3-trimethylammoniumpropyl (meth)acrylate, 3-trimethylammoniumpropyl (meth)acrylamide, and N,N,N-trimethyl-N-(2-hydroxy-3-methacryloyloxypropyl)ammonium chloride. Examples of the useful monomer also include 2-hydroxyethyl (meth)acrylate, (meth)acrylamide, N-monomethylol (meth)acrylamide, N-dimethylol (meth)acrylamide, N-vinylpyrrolidone, N-vinylacetamide, polyoxyethylene glycol mono(meth)acrylate, a monomer having an amino acid backbone in its molecule, such as N-methacryloyloxyethyl carbamate aspartate, and a monomer having a sugar backbone in its molecule, such as glycoxyethyl methacrylate.

Any solvent may be used for the composition containing the polymerizable compound having the hydrophilic group, as long as it can dissolve the main component, the hydrophilic macromonomer or the hydrophilic monomer, while an aqueous solvent is preferred, such as water and a water-soluble solvent. A mixture thereof is preferred, and a surfactant is preferably added to the solvent.

The water-soluble solvent refers to a solvent that is miscible with water at any ratio. Examples of such a water-soluble solvent include an alcohol solvent such as methanol, ethanol, propanol, ethylene glycol, and glycerol; an acid such as acetic acid; a ketone solvent such as acetone; and an amide solvent such as formamide.

If desired, any surfactant may be added to the solvent, as long as it is soluble in the solvent. Examples of such a surfactant include an anionic surfactant such as sodium n-dodecylbenzenesulfonate, a cationic surfactant such as n-dodecyltrimethylammonium chloride, and a nonionic surfactant such as polyoxyethylene nonylphenyl ether (for example, commercially available as Emulgen 910 manufactured by Kao Corporation), polyoxyethylene sorbitan monolaurate (for example, commercially available as Tween 20 (trade name)) and polyoxyethylene lauryl ether.

Any method may be used when an originally liquid composition is brought into contact. When a coating method is used to form a coating layer of a composition, the amount of the coating is preferably from 0.1 to 10 $g/m^2$, more preferably from 1 to 5 $g/m^2$, in terms of solids content, in view of surface hydrophilicity and uniformity of the coating film.

[Polymerizable Compound having Metal Salt Structure]

A description is provided below of the polymerizable compound having the metal salt structure for use in the second embodiment of the method of forming the metal fine particle pattern according to the invention. The polymerizable compound having the metal salt structure may be a radically polymerizable group-containing metallic compound which comprises: a monomer having a metal salt structure as shown below, a macromonomer having a metal salt structure as shown below or a polymer that is produced by polymerization of the monomer and has a metal salt structure; and an ethylenic addition-polymerizable unsaturated group such as vinyl, allyl and (meth)acryl, which is introduced in the monomer or the polymer and serves as a polymerizable group. Such a radically polymerizable group-containing metallic compound has a polymerizable group at least at its end or its side chain and preferably has the polymerizable group at its end, more preferably at its end and its side chain.

The monomer having the metal salt structure for use in the invention may be a metal salt of the above hydrophilic monomer, preferably a silver salt of (meth)acrylic acid or styrenesulfonic acid. Specific examples thereof include silver acrylate, silver methacrylate and silver styrenesulfonate.

Examples of the macromonomer having the metal salt structure for use in the invention include macromonomers derived from a silver salt of (meth)acrylic acid or a silver salt of styrenesulfonic acid.

In terms of effectiveness and polymerizability, the molecular weight of the macromonomer is preferably from 400 to 100,000, more preferably from 1,000 to 50,000, particularly preferably from 1,500 to 20,000.

[Polymerizable Compound having Structure with High Affinity for Metal Salt]

A description is provided below of the polymerizable compound having a high affinity for a metal salt for use in the second embodiment of the method of forming the metal fine particle pattern according to the invention. The polymerizable compound having a high affinity for a metal salt may be any compound that has a polymerizable group and a structure with a high affinity for a metal salt. The structure with a high affinity for a metal salt may be poly(vinylpyrrolidone), polyacrylamide, or the like.

[Method of Forming Patterned Graft Polymer Layer]

A description is then provided of how to produce the patterned graft polymer layer with the polymerizable compound as shown above.

Any method may be used to apply energy in the method of forming the patterned graft polymer layer. Any of the above methods may be used, as long as it can provide sufficient energy to produce active points on the surface of the polymerization initiation layer and to allow them to bond to the polymerizable compound having the hydrophilic group. In terms of cost and simplicity of equipment, a method of applying an active light beam is preferably used.

In the process of image like exposure using the application of an active light beam, scanning and exposure based on digital data or pattern exposure using lith film may be performed.

In a preferred embodiment, the method for forming the patterned graft polymer layer may be any of the above writing methods in the first embodiment of the method of forming the metal fine particle pattern according to the invention.

When energy is applied as shown above, the active points generated on the surface of the polymerization initiation layer are polymerized with the polymerizable compound having the hydrophilic group, so that a hydrophilic graft polymer layer is formed in a pattern, wherein the layer comprises a hydrophilic graft chain with high motility.

In a preferred embodiment, a hydrophilic compound having a polymerizable group at its end and side chain is added in the process of polymerizing the polymerizable compound having the hydrophilic group. In such a process, the hydrophilic graft polymer chain is also coupled to the polymerizable group at the side chain of the graft polymer, which is coupled to the polymerization initiation layer, so that: a branched graft chain structure can be formed; the density and motility of the formed hydrophilic graft polymer can be dramatically improved; and high hydrophilicity can be produced.

Alternatively, the active points generated on the surface of the polymerization initiation layer are polymerized with the polymerizable compound having a metal salt structure to form a highly-motile patterned graft polymer layer which comprises a graft chain having dense metal salt structures. In such a case, a branched graft chain structure can also be formed by the polymerization together with the metal salt structure-containing compound having the polymerizable group at its end and side chain, and the metal structures can be presented densely.

Alternatively, the active points generated on the surface of the polymerization initiation layer are polymerized with the polymerizable compound having a structure with a high affinity for a metal salt to form a highly-motile patterned graft polymer layer which comprises a graft chain having dense structures with a high affinity for a metal salt. In such a case, a branched graft chain structure can also be formed by the polymerization together with the compound that has the polymerizable group at its end and side chain and has the structure with a high affinity for a metal salt, and the structures with a high affinity for a metal salt can be presented densely.

<Metal Fine Particle Dispersion Region and the Step of Forming the Same (Metal Fine Particle Dispersion Region-Forming Step)>

[Step of Adding Metal Ion or Metal Salt]

In the second embodiment of the method of forming the metal fine particle pattern according to the invention, exclusive of the above method (2) of producing the patterned graft polymer layer with the polymerizable compound having the metal salt structure, the method of adding the metal salt to the graft polymer layer may include the step of applying a solution to the surface of the graft polymer layer, wherein the solution is prepared by dispersing or dissolving a metal salt in an appropriate solvent and contains the dispersed metal salt or the dissociated metal ions, or may include the step of immersing the support with the graft polymer layer in such a solution.

More specifically, the method of adding the metal salt may properly be chosen according to the properties of the formed graft polymer layer.

(a) If the graft polymer layer has a hydrophilic group comprising an acidic group, a solution of a metal salt in an appropriate solvent, which contains dissociated metal ions, may be applied to the surface of the graft polymer layer (or to the acidic group), or the support with the graft polymer layer may be immersed in such a solution. When the metal ion-containing solution is brought into contact, the metal ions can ionically adsorb to the acidic group. In terms of allowing the adsorption sufficiently, the concentration of the metal ions or the metal salt in the solution for use in contact is preferably from 1 to 50% by mass, more preferably from 10 to 30% by mass. The contact time is preferably from about 1 to about 24 hours.

(b) If the graft polymer layer is hydrophilic (a hydrophilic graft polymer layer), a solution or dispersion of a metal salt in an appropriate solvent, which contains the dispersed metal salt or dissociated metal ions, may be applied to the surface of the graft polymer layer, or the support with the graft polymer layer may be immersed in such a solution. In such a method, the layer can be impregnated with the dispersion or the solution with the aid of the high water retention of the hydrophilic graft polymer layer, so that the metal salt or the metal ions can be absorbed into the layer together with the solution. In terms of making sufficient impregnation with the dispersion or the solution, the concentration of the metal salt in the dispersion for use in contact or the metal salt content is preferably from 1 to 50% by mass, more preferably from 10 to 30% by mass. The contact time is preferably from about 1 to about 24 hours.

When the metal salt or the meal ions are absorbed into the hydrophilic graft polymer layer together with the solution, the layer can contain the desired metal ions or the desired metal salt regardless of the physical properties of the metal ions (for example, whether they have a negative charge), because of good water retention caused by the hydrophilic group.

(c) If the graft polymer layer has the structure with a high affinity for a metal salt as in the case of polyvinylpyrrolidone, the metal salt may directly be attached in the form of fine particles; or a solution may be applied to the surface of the graft polymer layer, wherein the solution is prepared by dispersing the metal salt in an appropriate solvent and contains the dispersed metal salt; or the support with the graft polymer layer may be immersed in such a solution. When the metal salt is brought into contact with the graft polymer layer as shown above, the metal salt can adsorb to the structure having a high affinity for the metal salt due to the affinity. In terms of making sufficient impregnation with the dispersion, the concentration of the metal salt in the dispersion for use in contact or the metal salt content is preferably from 1 to 50% by mass, more preferably from 10 to 30% by mass. The contact time is preferably from about 1 to about 24 hours.

[Step of Reducing Metal Ions (Forming Metal Fine Particle Dispersion Region)]

The resulting metal ion or salt-containing graft polymer layer is subsequently subjected to a reduction process in order to form a metal fine particle dispersion region.

(Metal Ions and Metal Salt)

A description is then provided of the metal ions and the metal salt.

In the invention, any metal salt may be used, as long as it can be dissolved in an appropriate solvent for the application to the hydrophilic surface and can be dissociated into a metal ion and a base (anion). Examples thereof include $M(NO_3)_n$, $MCl_n$, $M_{2/n}(SO_4)$, and $M_{3/n}(PO_4)$, wherein M represents a metal atom with a valence of n. The product of the dissociation of any of the above metal salts may preferably be used as the metal ion. Examples of the metal include Ag, Cu, Al, Ni, Co, Fe, and Pd. Ag is preferably used for an electroconductive film, and Co is preferably used for a magnetic film.

A single type of metal ion or salt may be used, and if desired, different types of metal ions or salts may be used. Different materials may be mixed in advance and used to produce the desired electroconductivity.

(Reducing Agent)

In the invention, any reducing agent may be used in the step of reducing the metal ion in the graft polymer layer or in the metal salt to form a thin layer region of the metal fine particle dispersion, as long as it has the property of reducing the metal ion or salt (compound) and depositing the metal. For example, such a reducing agent may be an aqueous solution of a hypophosphite, a tetrahydroborate, hydrazine, formalin, hydroquinone, or the like.

Any of such reducing agents may properly be selected depending on the metal salt or ion for use. For example, when an aqueous solution of silver nitrate is used as the aqueous metal salt solution for supplying metal ions or a metal salt, sodium tetrahydroborate or hydroquinone is preferably used as the reducing agent.

The method of adding the reducing agent may include the steps of washing the metal ion- or salt-containing graft polymer layer with water to remove an unnecessary part of the metal salt or the metal ions, then immersing the support with the graft polymer layer in water such as ion exchange water and adding the reducing agent thereto, or may include the step of directly applying or dropwise adding an aqueous reducing agent solution with a specific concentration onto the metal ion- or salt-containing graft polymer layer. The addition amount of the reducing agent is preferably equivalent or excessive to that of the metal ions, more preferably at least ten equivalents with respect to the metal ions.

A compound capable of producing a reducing action by heat may be used in place of the water-soluble reducing agent. The compound capable of producing a reducing action by heat may be a heat-decomposable radical-generating agent such as azobisbutyronitrile (AIBN). Alternatively, the reducing method may include the steps of: using a reducing agent such as hydroquinone and an agent capable of generating a base by heat, such as a sulfo acid salt of guanidine; and heating them to release a basic compound so that the base can activate the reducing agent.

Thus, the metal fine particle pattern material is produced by the method of forming the metal fine particle pattern according to the invention and forms a metal fine particle dispersion region, which can be recognized by visual observation of the metallic luster on the surface. However, the structure of such a region can easily and precisely be determined by observation of the surface with a transmission electron microscope or an atomic force microscope (AFM). The thickness of the metal fine particle dispersion region, which comprises metal fine particles dispersed in the graft polymer layer, may easily be determined by a conventional method such as an observation of a cut surface by an electron microscope.

<Method of Forming Electroconductive Pattern>

The metal fine particle pattern material produced by the method of forming the metal fine particle pattern according to the invention may be used as an electroconductive pattern material as it is or after the pattern material having the metal fine particle dispersion region (the metal fine particle pattern material) is subjected to heat treatment. When the metal fine particles are densely adsorbed in the metal fine particle dispersion region and appear to form a thin metal film, the pattern material may be used as it is. In terms of ensuring efficient electroconductivity, the formed metal fine particle dispersion region is preferably further subjected to heat treatment.

More specifically, the electroconductive pattern material according to the invention may be a product of heat-treating the metal fine particle pattern material at a temperature of 100 to 400° C., wherein the metal fine particle pattern material is produced by any of the above different methods for forming the metal fine particle pattern according to the invention.

The heating temperature in the heat treatment (heating step) is preferably 100° C. or higher, more preferably 150° C. or higher, particularly preferably about 200° C. The heating temperature is preferably 400° C. or lower in view of treatment efficiency and dimensional stability of the base material of the support. The heating time is preferably at least 10 minutes, more preferably from about 30 minutes to about 60 minutes. It is not clear what mechanism works to improve the electroconductivity in the heat treatment (heating step), while it is believed that adjacent metal fine particles can partially fuse with each other by the heat treatment so that the electroconductivity can be improved through improvement in adhesion between the metal fine particles and a reduction in voids between the metal fine particles, which can lead to an increase in the contact area.

The metal fine particle pattern material according to the invention may be used to form a variety of circuits, as it is or after subjected to heat treatment. The electroconductive pattern material according to the invention may also be used to form a variety of circuits, as it is. A nano-scale electroconductive region can be formed by a selected pattern-forming technique. Thus, a wide range of applications will be expected, including the production of circuits for micro-machines, VLSI or the like.

In a case where a transparent film such as PET is used as the support, the pattern material may be used as a transparent electroconductive patterned film. Examples of the uses of such a transparent electroconductive film include a transparent electrode for use in displays, a dimmer device, a solar cell, a touch panel, and other transparent electroconductive films, and it is particularly useful as an electromagnetic wave-shielding filter to be attached to a CRT or a plasma display. Since such an electromagnetic wave-shielding filter is required to have high conductivity and high transparency, it is preferred that the thin metal film should be provided in the form of a grid. The grid line width is preferably about from 20 to about 100 μm, and the opening is preferably about from 50 to about 600 μm. The grid does not always have to be formed of regularly arranged straight lines and may be formed of curves.

According to the invention, metal wiring can easily be formed in any pattern as shown above, and thus a variety of designs may be made depending on purposes.

EXAMPLES

The present invention is more specifically described by way of examples below. However, these examples are not intended to limit the scope of the invention.

Example 1

(Synthesis of Specific Polymerization Initiation Polymer A)

30 g of propylene glycol monomethyl ether (MFG) was poured into a 300 ml three-neck flask and heated to 75° C. A solution of 8.1 g of [2-(acryloyloxy)ethyl](4-benzoylbenzyl) dimethylammonium bromide, 9.9 g of 2-hydroxyethyl methacrylate, 13.5 g of isopropyl methacrylate, 0.43 g of dimethyl-2,2'-azobis(2-methylpropionate), and 30 g of MFG was added dropwise thereto over 2.5 hours. Thereafter, the reaction temperature was raised to 80° C., and then the reaction was performed for two hours so that a polymer as shown below was obtained, which is referred to as specific polymerization initiation polymer A. The numerical values shown in the following structures show the molar copolymerization ratio of respective repeating units.

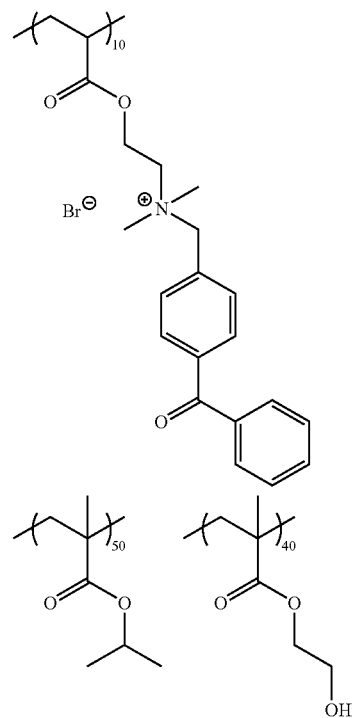

Synthesis Example 2

(Synthesis of Specific Polymerization Initiation Polymer B)

30 g of propylene glycol monomethyl ether (MFG) was poured into a 300 ml three-neck flask and heated to 75° C. Thereto, a solution of 5.1 g of 4-methacryloyloxy-benzophenone, 9.9 g of 2-hydroxyethyl methacrylate, 9.8 g of isopropyl methacrylate, 3.97 g of [2-(methacryloyloxy)ethyl] trimethylammonium bromide, 0.43 g of dimethyl-2,2'-azobis(2-methyl propionate) and 30 g of propylene glycol monomethyl ether (MFG) was added dropwise over 2.5 hours. Then, the reaction temperature was raised to 80° C., and further reaction was made for 2 hours to obtain the specific polymerization initiation polymer B described below. The numerical values shown in the following structures show the molar copolymerization ratio of respective repeating units.

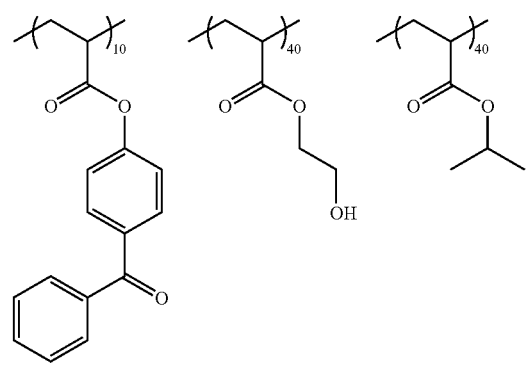

-continued

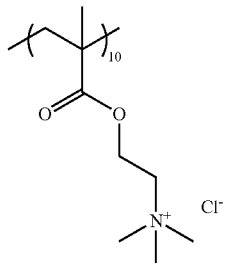

Synthesis Example 3

(Synthesis of Specific Polymerization Initiation Polymer C)

30 g of propylene glycol monomethyl ether (MFG) was poured into a 300 ml three-neck flask and heated to 75° C. Thereto, a solution of 8.1 g of [2-(acryloyloxy)ethyl](4-benzoylbenzyl)dimethylammonium bromide, 9.9 g of 2-aminoethyl methacrylate, 13.5 g of isopropyl methacrylate, 0.43 g of dimethyl-2,2'-azobis(2-methyl propionate) and 30 g of propylene glycol monomethyl ether (MFG) was added dropwise over 2.5 hours. Then, the reaction temperature was raised to 80° C., and further reaction was made for 2 hours to obtain the specific polymerization initiation polymer C described below. The numerical values shown in the following structures show the molar copolymerization ratio of respective repeating units.

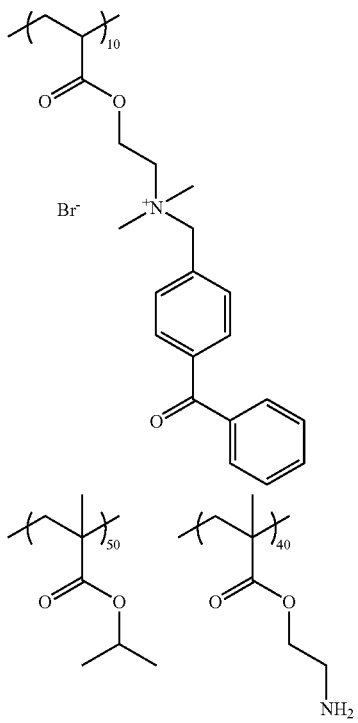

(Formation of Polymerization Initiation Layer)

A polyethylene terephthalate film with a thickness of 0.188 mm (trade name: M4100, manufactured by TOYOBO CO., LTD.) was used as a support, and a coating liquid for a polymerization initiation layer as shown below was applied to the surface of the support using a rod bar No. 18. The coating was then dried and subjected to a cross-linking reaction at 110° C. for 10 minutes. The resulting polymerization initiation layer had a thickness of 9.3 μm.

| (Coating Liquid for Polymerization Initiation Layer) | |
|---|---|
| The specific polymerization initiation polymer A | 0.4 g |
| TDI (tolylene-2,4-diisocyanate) | 0.16 g |
| Infrared-absorbing agent (trade name: IR125, manufactured by Wako Pure Chemical Industries, Ltd.) | 0.2 g |
| Methyl ethyl ketone (MEK) | 1.6 g |

(Graft Polymerization)

The support having the polymerization initiation layer was immersed in an aqueous solution of 30% by mass α(styrene-4-sulfonyl)acetic acid Na salt, while argon gas was bubbled into the solution for 15 minutes. Thereafter, light was irradiated thereto from a 1.5 kW high-pressure mercury-vapor lamp for 10 minutes. After the irradiation of light, the support was immersed in 3000 ml of ion exchange water so that homopolymers other than the graft polymer were removed. Thus, a pattern-forming material of Example 1 (referred to as pattern-forming material A) was obtained in which the α(styrene-4-sulfonyl)acetic acid Na salt was graft-polymerized.

(Formation of Pattern Comprising Hydrophilic Region and Hydrophobic Region)

The resulting pattern-forming material A was imagewise exposed to an infrared beam with a wavelength of 830 nm from an infrared laser (with a beam diameter of 20 μm) so that a hydrophilic region and a hydrophobic region were formed.

(Formation of Metal Fine Particle Dispersion Region)

The material A (10 cm×10 cm) having a pattern comprising the hydrophilic region and the hydrophobic region formed by the exposure was immersed in an aqueous solution of 15% by mass silver nitrate (manufactured by Wako Pure Chemical Industries, Ltd.) for 12 hours and then washed with distilled water. Thereafter, the material A was immersed in 100 ml of distilled water, and 30 ml of 0.2 mol/l (M) sodium tetrahydroborate was added dropwise thereto so that the silver ions adsorbing to the hydrophilic region were reduced to form a metal fine particle dispersion region. Thus, a metal fine particle pattern material was obtained (which is referred to as metal fine particle pattern material A).

The resulting metal fine particle pattern material A was cut, and the cut surface was observed with an electron microscope, whereby it was confirmed that the metal fine particle dispersion region (film) was formed with a thickness of 0.1 μm.

[Evaluation of Electroconductivity]

The surface electroconductivity of the pattern part of the resulting metal fine particle pattern material A was measured with a LORESTA-FP (manufactured by Mitsubishi Chemical Corporation) by the four-point probe method and determined to be $1.0 \times 10^1$ Ω/square.

[Evaluation of Metal Fine Particle Dispersion Region (Film)]

1. Film Strength (Adhesiveness)

The pattern part of the resulting metal fine particle pattern material A was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the metal fine particle dispersion region (film) has good adhesiveness.

2. Durability

The pattern surface of the resulting metal fine particle pattern material A was reciprocatingly rubbed 50 times manually with a cloth (trade name: BEMCOT, manufactured by Asahi Kasei Corporation) moistened with water. After rubbing, the surface was visually observed. As a result, peeling or the like was not observed in the metal fine particle dispersion region (film). The rubbed sample was then subjected to a cross-cut adhesion test with a tape in the same manner above for the purpose of evaluating the film strength. As a result, no square was peeled off, and it was demonstrated that the metal fine particle dispersion region (film) dose not exhibit reduced in adhesiveness after rubbing and has high durability.

Example 2

(Formation of Polymerization Initiation Layer)

An aluminum sheet in accordance with JIS A 1050 with a thickness of 0.3 mm was used as a support, and a coating liquid for a polymerization initiation layer as shown below was applied to the surface of the support using a rod bar No. 18. The coating was then dried and subjected to a cross-linking reaction at 110° C. for 10 minutes. The resulting polymerization initiation layer had a thickness of 9.3 µm.

| (Coating Liquid for Polymerization Initiation Layer) | |
|---|---|
| The specific polymerization initiation polymer A | 0.4 g |
| TDI (tolylene-2,4-diisocyanate) | 0.16 g |
| Methyl ethyl ketone (MEK) | 1.6 g |

The support having the polymerization initiation layer was immersed in an aqueous solution containing acrylic acid (10% by mass) and sodium periodate ($NaIO_4$, 0.01% by weight), and light was irradiated thereto from the 1.5 kW high-pressure mercury-vapor lamp for 10 minutes under an argon atmosphere. After the irradiation of light, the support was thoroughly washed with ion exchange water so that homopolymers other than the graft polymer were removed. Thus, a support was obtained on which the acrylic acid was graft-polymerized.

An aqueous solution was then prepared which comprised 1 liter of water, 40 g of N-ethyl-N' (3-dimethylaminopropyl) carbodiimide hydrochloride and 6 g of N-hydroxysuccinimide. The support having the graft polymer of the acrylic acid was immersed in the solution for one hour so that transesterification was performed. Thereafter, 6 g of 2-nitrobenzylphenol was further added and allowed to react so that a pattern-forming material having a polymer with a photo-decomposable functional group (referred to as pattern-forming material B) was obtained.

(Formation of Pattern Comprising Hydrophilic Region and Hydrophobic Region)

The resulting pattern-forming material B was exposed to blue light with a wavelength of 400 nm from a laser (with a beam diameter of 20 µm) so that a hydrophilic region and a hydrophobic region were formed.

(Formation of Metal Fine Particle Dispersion Region)

The material B (10 cm×10 cm) having a pattern comprising the hydrophilic region and the hydrophobic region formed by the exposure was immersed in an aqueous solution of 15% by mass silver nitrate (manufactured by Wako Pure Chemical Industries, Ltd.) for 12 hours and then washed with distilled water. Thereafter, the material B was immersed in 100 ml of distilled water, and 30 ml of an aqueous 0.2 mol/l (M) hydroquinone solution (pH=10) was added dropwise thereto so that the silver ions adsorbing to the hydrophilic region were reduced to form a metal fine particle dispersion region. Thus, a metal fine particle pattern material was obtained (which is referred to as metal fine particle pattern material B).

The resulting metal fine particle pattern material B was cut, and the cut surface was observed with an electron microscope, whereby it was confirmed that the metal fine particle dispersion region (film) was formed with a thickness of 0.1 µm.

(Heat Treatment)

The metal fine particle dispersion region (film) of the resulting metal fine particle pattern material B was heated at 300° C. for two hours so that an electroconductive pattern material having a patterned film of silver fine particles was obtained (which is referred to as electroconductive pattern material B).

[Evaluation of Electroconductivity]

The surface electroconductivity of the pattern part of the resulting electroconductive pattern material B was measured with a LORESTA-FP (manufactured by Mitsubishi Chemical Corporation) by the four-point probe method and determined to be $1.0×10^0$ Ω/square.

[Evaluation of Silver Fine Particle Film]

1. Film Strength (Adhesiveness)

The pattern part of the resulting electroconductive pattern material B was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the silver fine particle film has good adhesiveness.

2. Durability

The pattern surface of the resulting electroconductive pattern material B was reciprocatingly rubbed 50 times manually with a cloth (trade name: BEMCOT, manufactured by Asahi Kasei Corporation) moistened with water. After rubbing, the surface was visually observed. As a result, peeling or the like was not observed in the silver fine particle film. The rubbed sample was then subjected to a cross-cut adhesion test with a tape in the same manner above for the purpose of evaluating the film strength. As a result, no square was peeled off, and it was demonstrated that the silver fine particle film dose not exhibit reduced in adhesiveness after rubbing and has high durability.

Example 3

Using a rod bar #6, an aqueous solution of acrylic acid (10% by mass) was applied onto the support having the polymerization initiation layer produced by the method of Example 2. The surface of the coating was then laminated with a 25 µm PET film.

(Formation of Patterned Graft Polymer Layer)

A patterned mask with vapor-deposited chromium was superposed on the PET film, and UV light was irradiated from above (400 W high-pressure mercury-vapor lamp: trade name UVL-400P manufactured by Riko Kagaku Sangyo Co., Ltd., for an irradiation time of 30 seconds). After the irradiation of light, the mask and the laminate film were removed, and washing with water was performed, so that a pattern-forming material (referred to as pattern-forming material C) was obtained which had a patterned hydrophilic layer of a graft polymer of poly(acrylic acid).

(Formation of Metal Fine Particle Dispersion Region)

The pattern-forming material C (10 cm×10 cm) having the patterned hydrophilic graft polymer layer was immersed in an aqueous solution of 15% by mass silver nitrate (manufactured by Wako Pure Chemical Industries, Ltd.) for 12 hours and then washed with distilled water. Thereafter, the pattern-forming material C was immersed in 100 ml of distilled water, and 30 ml of 0.2 mol/l (M) sodium tetrahydroborate was added dropwise thereto so that the silver ions adsorbing to the hydrophilic graft polymer were reduced to form a metal fine particle dispersion region. Thus, a metal fine particle pattern material was obtained (which is referred to as metal fine particle pattern material C).

The resulting metal fine particle pattern material C was cut, and the cut surface was observed with an electron microscope, whereby it was confirmed that the metal fine particle dispersion region (film) was formed with a thickness of 0.2 μm.

(Heat Treatment)

The metal fine particle dispersion region (film) of the resulting metal fine particle pattern material C was heated at 300° C. for two hours so that an electroconductive pattern material having a patterned film of silver fine particles was obtained (which is referred to as electroconductive pattern material C).

[Evaluation of Electroconductivity]

The surface electroconductivity of the pattern part of the resulting electroconductive pattern material C was measured with a LORESTA-FP (manufactured by Mitsubishi Chemical Corporation) by the four-point probe method and determined to be $1.0 \times 10^1$ Ω/square.

[Evaluation of Silver Fine Particle Film]

1. Film Strength (Adhesiveness)

The pattern part of the resulting electroconductive pattern material C was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the silver fine particle film has good adhesiveness.

2. Durability

The pattern surface of the resulting electroconductive pattern material C was reciprocatingly rubbed 50 times manually with a cloth (trade name:BEMCOT, manufactured by Asahi Kasei Corporation) moistened with water. After rubbing, the surface was visually observed. As a result, peeling or the like was not observed in the silver fine particle film. The rubbed sample was then subjected to a cross-cut adhesion test with a tape in the same manner above for the purpose of evaluating the film strength. As a result, no square was peeled off, and it was demonstrated that the silver fine particle film dose not exhibit reduced in adhesiveness after rubbing and has high durability.

Example 4

The support having the polymerization initiation layer produced by the method of Example 2 was immersed in a tert-butyl acrylate solution (30% by mass, solvent: propylene glycol monomethyl ether). The support was then exposed to light from a 400 W high-pressure mercury-vapor lamp for 30 minutes under an argon atmosphere. After the irradiation of light, the resulting support was thoroughly washed with propylene glycol monomethyl ether. Thus, the support was obtained on which the tert-butyl acrylate was graft-polymerized. Thereafter, solution A having the composition shown below was applied to the support so that a pattern-forming material of Example 4 was obtained (which is referred to as pattern-forming material D). The resulting film (the polymer compound layer) had a thickness of 0.5 μm.

| Solution A | |
| --- | --- |
| Triphenylsulfonium triflate | 0.05 g |
| Methyl ethyl ketone | 1 g |

(Formation of Pattern Comprising Hydrophilic Region and Hydrophobic Region)

The resulting pattern-forming material D was exposed through a pattern to light from a 400 W high-pressure mercury-vapor lamp for one minute and then subjected to post-heating at 90° C. for two minutes. The resulting film was then washed with methyl ethyl ketone so that a graft polymer pattern (a hydrophilic region and a hydrophobic region) was obtained in which the exposed part was made hydrophilic.

(Formation of Metal Fine Particle Dispersion Region)

The pattern-forming material D (10 cm×10 cm) having the pattern comprising the hydrophilic region and the hydrophobic region formed by the exposure was immersed in an aqueous solution of 15% by mass silver nitrate (manufactured by Wako Pure Chemical Industries, Ltd.) for 12 hours and then washed with distilled water. Thereafter, the pattern-forming material D was immersed in 100 ml of distilled water, and 30 ml of 0.2 mol/l (M) sodium tetrahydroborate was added dropwise thereto so that the silver ions adsorbing to the hydrophilic region were reduced to form a metal fine particle dispersion region. Thus, a metal fine particle pattern material was obtained (which is referred to as metal fine particle pattern material D).

The resulting metal fine particle pattern material D was cut, and the cut surface was observed with an electron microscope, whereby it was confirmed that the metal fine particle dispersion region (film) was formed with a thickness of 0.1 μm.

(Heat Treatment)

The metal fine particle dispersion region (film) of the resulting material D was heated at 300° C. for two hours so that an electroconductive pattern material having a patterned film of silver fine particles was obtained (which is referred to as electroconductive pattern material D).

[Evaluation of Electroconductivity]

The surface electroconductivity of the pattern part of the resulting electroconductive pattern material D was measured with a LORESTA-FP (manufactured by Mitsubishi Chemical Corporation) by the four-point probe method and determined to be $1.0 \times 10^0$ Ω/square.

[Evaluation of Silver Fine Particle Film]

1. Film Strength (Adhesiveness)

The pattern part of the resulting electroconductive pattern material D was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the silver fine particle film has good adhesiveness.

2. Durability

The pattern surface of the resulting electroconductive pattern material D was reciprocatingly rubbed 50 times manually with a cloth (trade name:BEMCOT, manufactured by Asahi Kasei Corporation) moistened with water. After rubbing, the surface was visually observed. As a result, peeling or the like was not observed in the silver fine particle film. The rubbed sample was then subjected to a cross-cut adhesion test with a tape in the same manner above for the purpose of evaluating the film strength. As a result, no square was peeled off, and it was demonstrated that the silver fine particle film dose not exhibit reduced in adhesiveness after rubbing and has high durability.

Example 5

Using a rod bar No. 6, liquid coating composition 1 as shown below was applied onto the support having the polymerization initiation layer produced by the method of Example 2 and dried at 80° C. for two minutes to form an upper layer. The surface of the coating of liquid coating composition 1 had a uniform state.

| (Liquid Coating Composition 1) | |
| --- | --- |
| Hydrophilic polymer (P-1) having a polymerizable group in its side chain | 2 g |
| Water | 18 g |

The hydrophilic polymer (P-1) having a polymerizable group in its side chain, which is a component of liquid coating composition 1, was synthesized as described below.

18 g of poly(acrylic acid) (with an average molecular weight of 25,000) was dissolved in 300 g of dimethylacetamide (DMAC), and 0.41 g of hydroquinone, 19.4 g of 2-methacryloyloxyethyl isocyanate and 0.25 g of dibutyltin dilaurate were added thereto and allowed to react at 65° C. for four hours to form a polymer with an acid value of 7.02 meq/g. Thereafter, the carboxyl group was neutralized with an aqueous solution of 1 mol/l (1N) sodium hydroxide. The polymer was then precipitated by addition of ethyl acetate and thoroughly washed to obtain 18.4 g of hydrophilic polymer (P-1) having a polymerizable group in its side chain.

(Formation of Patterned Graft Polymer Layer)

Energy was applied imagewise to the resulting upper layer under the conditions described below so that a pattern-forming material of Example 5 (referred to as pattern-forming material E) was obtained in which the hydrophilic polymer (P-1) was graft-polymerized in a pattern.

The energy was applied through imagewise irradiation of light from a 400 W high-pressure mercury-vapor lamp (trade name:UVL-400P manufactured by Riko Kagaku Sangyo Co., Ltd.) under an argon atmosphere for one minute. After the irradiation of light, the support was thoroughly washed with ion exchange water.

(Formation of Metal Fine Particle Dispersion Region)

The pattern-forming material E (10 cm×10 cm) having the patterned hydrophilic graft polymer layer was immersed in an aqueous solution of 15% by mass silver nitrate (manufactured by Wako Pure Chemical Industries, Ltd.) for 12 hours and then washed with distilled water. Thereafter, the pattern-forming material E was immersed in 100 ml of distilled water, and 30 ml of 0.2 mol/l (M) sodium tetrahydroborate was added dropwise thereto so that the silver ions adsorbing to the hydrophilic graft polymer were reduced to form a metal fine particle dispersion region. Thus, a metal fine particle pattern material was obtained (which is referred to as metal fine particle pattern material E).

The resulting metal fine particle pattern material E was cut, and the cut surface was observed with an electron microscope, whereby it was confirmed that the metal fine particle dispersion region (film) was formed with a thickness of 0.5 μm.

(Heat Treatment)

The metal fine particle dispersion region (film) of the resulting metal fine particle pattern material E was heated at 300° C. for two hours so that an electroconductive pattern material having a patterned film of silver fine particles was obtained (which is referred to as electroconductive pattern material E).

[Evaluation of Electroconductivity]

The surface electroconductivity of the pattern part of the resulting electroconductive pattern material E was measured with a LORESTA-FP (manufactured by Mitsubishi Chemical Corporation) by the four-point probe method and determined to be $1.0 \times 10^1$ Ω/square.

[Evaluation of Silver Fine Particle Film]

1. Film Strength (Adhesiveness)

The pattern part of the resulting electroconductive pattern material E was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the silver fine particle film has good adhesiveness.

2. Durability

The pattern surface of the resulting electroconductive pattern material E was reciprocatingly rubbed 50 times manually with a cloth (trade name:BEMCOT, manufactured by Asahi Kasei Corporation) moistened with water. After rubbing, the surface was visually observed. As a result, peeling or the like was not observed in the silver fine particle film. The rubbed sample was then subjected to a cross-cut adhesion test with a tape in the same manner above for the purpose of evaluating the film strength. As a result, no square was peeled off, and it was demonstrated that the silver fine particle film dose not exhibit reduced in adhesiveness after rubbing and has high durability.

According to the invention, there is provided a method of forming a metal fine particle pattern, which can produce a metal fine particle pattern material at high productivity by a simple process, wherein the metal fine particle pattern material comprises a metal fine particle adsorption region which is formed in the desired pattern and in which metal fine particles are dispersed at high density with good adhesion and durability.

According to the invention, there is also provided a method of forming an electroconductive pattern, which can produce an electroconductive pattern material having high electroconductivity and wide applicability. According to the invention, there is also provided a method of forming an electroconductive pattern, which can produce an electroconductive pattern material suited for the production of an electromagnetic wave shield and other materials which require high electroconductivity and arbitarary patterns.

Example 6

(Formation of Polymerization Initiation Layer)

A polyimide film (trade name: Kapton manufactured by TORAY-Du Pont Co., Ltd.) was used as a support, and the polymerization initiation layer coating solution C described below was coated on the surface using a rod bar No. 18 to be dried and cross-linked at 110° C. for 10 minutes. The film thickness of the polymerization initiation layer obtained was 8.7 μm.

| [Polymerization initiation layer coating solution C] | |
| --- | --- |
| The aforementioned specific polymerization initiation polymer B | 0.4 g |
| TDI (tolylene-2,4-diisocyanate) | 0.16 g |
| Methylethyl ketone(MEK) | 1.6 g |

(Formation of upper layer)

The coating liquid composition 2 described below was coated on the polymerization initiation layer of the support using a rod bar No. 6, and it was dried at 80° C. for 2 minutes to form an upper layer. The coating face of the aforementioned coating liquid composition 2 was uniform.

| [Coating liquid composition 2] | |
| --- | --- |
| Polymer having a polymerizable | 0.25 g |
| cyclohexanone | 8.0 g |

(Synthesis of the Polymer having a Polymerizable)

-Synthesis of Monomer A-

To a 500 ml three necked flask, 58.6 g of 2-hydroxyethyl methacrylate was charged and 250 ml of acetone was added to be stirred. After 39.2 g of pyridine and 0.1 g of p-methoxyphenol were added, the mixture was cooled by an ice bath in which ice water was charged. After the temperature of the solution mixture became 5° C. or less, 114.9 g of 2-bromoisobutanic acid bromide was added dropwise using a dropping funnel over 3 hours. After termination of the dropwise addition, the ice bath was removed and the solution mixture was further stirred for 3 hours. The reaction solution mixture was charged in 750 ml of water to be stirred for one hour. The aqueous solution mixture was extracted 3 times with 500 ml of ethyl acetate using a separatory funnel. The organic layer was successively washed with 500 ml of 1M (mol/l) hydrochloric acid, 500 ml of a saturated sodium bicarbonate aqueous solution and 500 ml of saturated saline. To the organic layer, 100 g of magnesium sulfate was charged and dried by dehydration, and then filtered. The solvent was distilled off under reduced pressure to obtain 120.3 g of a monomer A.

Then, 40 g of N,N-dimethylacetamide was charged to a 1000 ml three necked flask and heated to 70° C. under nitrogen flow. Thereto, 40 g of N,N-dimethylacetamide solution of 12.58 g of the monomer A, 27.52 g of methacrylic acid and 0.921 g of V-601 (manufactured by Wako Pure Chemical Industries, Ltd.) was added dropwise over 2.5 hours. After termination of the dropwise addition, the mixture was heated to 90° C. to be further stirred for 2 hours. After the reaction solution was cooled to room temperature, 3.5 liter of water was charged to precipitate a polymer compound. The polymer compound precipitated was obtained by filtration, washed with water and dried to obtain 30.5 g of a polymer compound. The mass average molecular weight of the polymer compound obtained was measured by a gel permeation chromatography method (GPC) in which a polystyrene was used as a standard substance, and, as a result, it was 124000.

To a 200 ml three necked flask, 26.0 g of the polymer compound obtained and 0.1 g of p-methoxyphenol were charged, the mixture was dissolved in 60 g of N,N-dimethylacetamide and 60 g of acetone and cooled on an ice bath in which ice water was charged. After the temperature of the solution mixture became 5° C. or less, 60.4 g of 1,8-diazabicyclo[5,4,0]-7-undecene (DBU) was added dropwise over one hour using a dropping funnel. After termination of the dropwise addition, the ice bath was removed and the solution mixture was further stirred for 8 hours. The reaction solution was charged in 2 liter of water in which 17 ml of concentrated hydrochloric acid was dissolved to precipitate a hydrophilic polymer (P-2) having a polymerizable group at side chains. The polymer having a polymerizable was obtained by filtration, washed with water and dried to obtain 15.6 g.

(Formation of Patterned Graft Polymer Layer)

Energy was applied imagewise to the resulting upper layer under the conditions described below so that a pattern-forming material of Example 6 (referred to as pattern-forming material F) was obtained in which the exposure portion was graft-polymerized and was changed into a hydrophilic region in a pattern.

The energy was applied through imagewise irradiation of light from a 1.5 kW high-pressure mercury-vapor lamp (manufactured by USHIO INC.All rights reserved) using patterned mask with vapor-deposited chromium for one minute. After the irradiation of light, the obtained layer was washed with saturated sodium bicarbonate.

(Formation of Metal Fine Particle Dispersion Region)

The pattern-forming material F (10 cm×10 cm) having the patterned hydrophilic graft polymer layer was immersed in an aqueous solution of 15% by mass silver nitrate (manufactured by Wako Pure Chemical Industries, Ltd.) for 12 hours and then washed with distilled water. Thereafter, the pattern-forming material F was immersed in 100 ml of distilled water, and 30 ml of 0.2 mol/l (M) sodium tetrahydroborate was added dropwise thereto so that the silver ions adsorbing to the hydrophilic graft polymer were reduced to form a metal fine particle dispersion region. Thus, a metal fine particle pattern material was obtained (which is referred to as metal fine particle pattern material F).

The resulting metal fine particle pattern material F was cut, and the cut surface was observed with an electron microscope, whereby it was confirmed that the metal fine particle dispersion region (film) was formed with a thickness of 0.8 μm.

(Heat Treatment)

The metal fine particle dispersion region (film) of the resulting metal fine particle pattern material F was heated at 300° C. for two hours so that an electroconductive pattern material having a patterned film of silver fine particles was obtained (which is referred to as electroconductive pattern material F).

[Evaluation of Electroconductivity]

The surface electroconductivity of the pattern part of the resulting electroconductive pattern material F was measured with a LORESTA-FP (manufactured by Mitsubishi Chemical Corporation) by the four-point probe method and determined to be $0.8 \times 10^1$ Ω/square.

[Evaluation of Silver Fine Particle Film]

1. Film Strength (Adhesiveness)

The pattern part of the resulting electroconductive pattern material F was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the silver fine particle film has good adhesiveness.

2. Durability

The pattern surface of the resulting electroconductive pattern material F was reciprocatingly rubbed 50 times manually with a cloth (trade name:BEMCOT, manufactured by Asahi Kasei Corporation) moistened with water. After rubbing, the surface was visually observed. As a result, peeling or the like was not observed in the silver fine particle film. The rubbed sample was then subjected to a cross-cut adhesion test with a tape in the same manner above for the purpose of evaluating the film strength. As a result, no square was peeled off, and it was demonstrated that the silver fine particle film dose not exhibit reduced in adhesiveness after rubbing and has high durability.

Example 7

(Formation of Polymerization Initiation Layer)

A polyimide film (trade name: Kapton manufactured by TORAY-Du Pont Co., Ltd.) was used as a support, and the polymerization initiation layer coating solution D described below was coated on the surface using a rod bar No. 18 to be dried and cross-linked at 110° C. for 10 minutes. The film thickness of the polymerization initiation layer obtained was 8.7 μm.

| [Polymerization initiation layer coating solution D] | |
|---|---|
| The aforementioned specific polymerization initiation polymer C | 0.4 g |
| TDI (tolylene-2,4-diisocyanate) | 0.16 g |
| Methylethyl ketone(MEK) | 1.6 g |

(Formation of Upper Layer)

The coating liquid composition 2 used in example 6 was coated on the polymerization initiation layer of the support using a rod bar No. 6, and it was dried at 80° C. for 2 minutes to form an upper layer. The coating face of the aforementioned coating liquid composition 2 was uniform.

(Formation of Patterned Graft Polymer Layer)

Energy was applied imagewise to the resulting upper layer under the conditions described below so that a pattern-forming material of Example 7 (referred to as pattern-forming material G) was obtained in which the exposure portion was graft-polymerized and was changed into a hydrophilic region in a pattern.

The energy was applied through imagewise irradiation of light from a 1.5 kW high-pressure mercury-vapor lamp (manufactured by USHIO INC.All rights reserved) using patterned mask with vapor-deposited chromium for one minute. After the irradiation of light, the obtained layer was washed with saturated sodium bicarbonate.

(Formation of Metal Fine Particle Dispersion Region)

The pattern-forming material G (10 cm×10 cm) having the patterned hydrophilic graft polymer layer was immersed in an aqueous solution of 15% by mass silver nitrate (manufactured by Wako Pure Chemical Industries, Ltd.) for 12 hours and then washed with distilled water. Thereafter, the pattern-forming material G was immersed in 100 ml of distilled water, and 30 ml of 0.2 mol/l (M) sodium tetrahydroborate was added dropwise thereto so that the silver ions adsorbing to the hydrophilic graft polymer were reduced to form a metal fine particle dispersion region. Thus, a metal fine particle pattern material was obtained (which is referred to as metal fine particle pattern material G).

The resulting metal fine particle pattern material G was cut, and the cut surface was observed with an electron microscope, whereby it was confirmed that the metal fine particle dispersion region (film) was formed with a thickness of 0.8 μm.

(Heat Treatment)

The metal fine particle dispersion region (film) of the resulting metal fine particle pattern material G was heated at 300° C. for two hours so that an electroconductive pattern material having a patterned film of silver fine particles was obtained (which is referred to as electroconductive pattern material G).

[Evaluation of Electroconductivity]

The surface electroconductivity of the pattern part of the resulting electroconductive pattern material G was measured with a LORESTA-FP (manufactured by Mitsubishi Chemical Corporation) by the four-point probe method and determined to be $0.5 \times 10^1$ Ω/square.

[Evaluation of Silver Fine Particle Film]

1. Film Strength (Adhesiveness)

The pattern part of the resulting electroconductive pattern material G was evaluated with respect to film adhesiveness by a cross-cut adhesion test with a tape according to JIS 5400. The peeling test in which the tape was peeled off from the cut lattice pattern was repeated twice. As a result, no square was peeled off, and it was demonstrated that the silver fine particle film has good adhesiveness.

2. Durability

The pattern surface of the resulting electroconductive pattern material G was reciprocatingly rubbed 50 times manually with a cloth (trade name:BEMCOT, manufactured by Asahi Kasei Corporation) moistened with water. After rubbing, the surface was visually observed. As a result, peeling or the like was not observed in the silver fine particle film. The rubbed sample was then subjected to a cross-cut adhesion test with a tape in the same manner above for the purpose of evaluating the film strength. As a result, no square was peeled off, and it was demonstrated that the silver fine particle film dose not exhibit reduced in adhesiveness after rubbing and has high durability.

<Evaluation of the Metal Fine Particle Pattern>

The pattern of the metal fine particle pattern material A to G obtained in example 1 to 7 was observed using an optical microscope (trade name: OPTI PHOTO-2 manufactured by Nikon CO, Ltd.). It was confirmed the state where the metal fine particle had adhered to the metal fine particle pattern material A to G in the shape of a lattice. Line width and Pitch width of the shape of a lattice are shown in Table 10 below. In Table 10, "Line width" is $d_L$ described in FIG. 1 and "Pitch width" is $d_p$ described in FIG. 1. FIG. 1 is a diagram showing Line width and Pitch width according to the present invention.

TABLE 10

|  |  | Line width ($d_L$) | Pitch width ($d_P$) |
|---|---|---|---|
| Example 1 | metal fine particle pattern material A | 24 μm | 200 μm |
| Example 2 | metal fine particle pattern material B | 21 μm | 200 μm |
| Example 3 | metal fine particle pattern material C | 15 μm | 200 μm |
| Example 4 | metal fine particle pattern material D | 14 μm | 200 μm |
| Example 5 | metal fine particle pattern material E | 12 μm | 200 μm |
| Example 6 | metal fine particle pattern material F | 14 μm | 200 μm |
| Example 7 | metal fine particle pattern material G | 13 μm | 200 μm |

Table 10 shows that it was confirmed that a high detailed metal fine particle pattern was formed on the metal fine particle pattern material A to G obtained in example 1 to 7.

What is claimed is:

1. A method of forming a metal particle pattern, comprising:
   forming a polymerization initiation layer on a support, the polymerization initiation layer comprising copolymer that comprises a copolymer component A having a functional group having the ability to initiate polymerization in an amount of 1-40% by mole and a copolymer component B having a cross-linking group in an amount of 20-70% by mole, wherein the copolymer is fixed by a cross-linking reaction to form the polymerization initiation layer;
   pattern-wise forming a graft polymer region on a surface of the polymerization initiation layer, wherein the graft polymer region has the ability to contain a metal ion or a metal salt;
   adding a metal ion or a metal salt to the graft polymer region; and
   thereafter reducing the metal ion or a metal ion in the metal salt to form a metal particle dispersion region.

2. A method of forming a metal particle pattern of claim 1, wherein the copolymer comprises the copolymer component A having a functional group having the ability to initiate polymerization in an amount of 5-30% by mole and the copolymer component B having a cross-linking group in an amount of 30-60% by mole.

3. A method of forming a metal particle pattern, comprising:
   forming a polymerization initiation layer on a support, the polymerization initiation layer comprising a copolymer that comprises a copolymer component A having a functional group having the ability to initiate polymerization in an amount of 1-40% by mole and a copolymer component B having a cross-linking group in an amount of 20-70% by mole, wherein the copolymer is fixed by a cross-linking reaction to form the polymerization initiation layer;
   forming, on a surface of the polymerization initiation layer, a graft polymer layer whose hydrophilicity or hydrophobicity can be changed by heat, acid or radiation of light;
   applying heat, acid or radiation of light to the graft polymer layer to form a pattern comprising a hydrophilic region and a hydrophobic region;
   adding a metal ion or a metal salt to the hydrophilic region or the hydrophobic region; and
   thereafter reducing the metal ion or a metal ion in the metal salt to form a metal particle dispersion region.

4. A method of forming a metal particle pattern of claim 3, wherein the graft polymer layer comprises a polymer compound having a functional group whose hydrophilicity or hydrophobicity can be changed by application of heat or acid.

5. A method of forming a metal particle pattern of claim 3, wherein the graft polymer layer comprises a polymer compound having a functional group whose hydrophilicity or hydrophobicity can be changed by application of radiation of light.

6. A method of forming a metal particle pattern, comprising:
   forming a polymerization initiation layer on a support, the polymerization initiation layer comprising a copolymer that comprises a copolymer component A having a functional group having the ability to initiate polymerization in an amount of 1-40% by mole and a copolymer component B having a cross-linking group in an amount of 20-70% by mole, wherein the copolymer is fixed by a cross-linking reaction to form the polymerization initiation layer;
   pattern-wise forming a graft polymer layer on a surface of the polymerization initiation layer;
   adding a metal ion or a metal salt to the graft polymer layer; and
   thereafter reducing the metal ion or a metal ion in the metal salt to form a metal particle dispersion region.

7. A method of forming a metal particle pattern of claim 6, wherein the graft polymer layer is formed by a process including bringing a polymerizable compound having a hydrophilic group into contact with the surface of the polymerization initiation layer and pattern-wise applying light or heat.

8. A method of forming a metal particle pattern of claim 6, wherein the graft polymer layer is formed by a process including bringing a polymerizable compound having a metal salt structure into contact with the surface of the polymerization initiation layer and pattern-wise applying light or heat.

9. A method of forming a metal particle pattern of claim 6, wherein the graft polymer layer is formed by a process including bringing a polymerizable compound having affinity for a metal salt into contact with the surface of the polymerization initiation layer and pattern-wise applying light or heat.

10. A method of forming an electroconductive pattern, comprising:
    forming a polymerization initiation layer on a support, the polymerization initiation layer comprising a copolymer that comprises a copolymer component A having a functional group having the ability to initiate polymerization in an amount of 1-40% by mole and a copolymer component B having a cross-linking group in an amount of 20-70% by mole, wherein the copolymer is fixed by a cross-linking reaction to form the polymerization initiation layer;

pattern-wise forming a graft polymer region on a surface of the polymerization initiation layer, wherein the graft polymer region has the ability to contain a metal ion or a metal salt;

adding a metal ion or a metal salt to the graft polymer region; and thereafter reducing the metal ion or a metal ion in the metal salt to form a metal particle dispersion region; and heating, to a temperature of 100° C. to 400° C., a patterned material that forms the metal particle dispersion region.

11. A method of forming an electroconductive pattern of claim 10, wherein the temperature of the heating is from 150° C. to 400° C.

12. A method of forming an electroconductive pattern of claim 10, wherein the heating is performed for 30 to 60 minutes.

13. A method of forming an electroconductive pattern, comprising:

forming a polymerization initiation layer on a support, the polymerization initiation layer comprising a copolymer that comprises a copolymer component A having a functional group having the ability to initiate polymerization in an amount of 1-40% by mole and a copolymer component B having a cross-linking group in an amount of 20-70% by mole, wherein the copolymer is fixed by a cross-linking reaction to form the polymerization initiation layer;

forming, on a surface of the polymerization initiation layer, a graft polymer layer whose hydrophilicity or hydrophobicity can be changed by heat, acid or radiation of light;

applying heat, acid or radiation of light to the graft polymer layer to form a pattern comprising a hydrophilic region and a hydrophobic region;

adding a metal ion or a metal salt to the hydrophilic region or the hydrophobic region; and thereafter reducing the metal ion or a metal ion in the metal salt to form a metal particle dispersion region; and heating, to a temperature of 100° C. to 400° C., a patterned material that forms the metal particle dispersion region.

14. A method of forming an electroconductive pattern of claim 13, wherein the temperature of the heating is from 150° C. to 400° C.

15. A method of forming an electroconductive pattern of claim 13, wherein the heating is performed for 30 to 60 minutes.

16. A method of forming an electroconductive pattern of claim 13, wherein the graft polymer layer comprises a polymer compound having a functional group whose hydrophilicity or hydrophobicity can be changed by application of heat or acid.

17. A method of forming an electroconductive pattern of claim 13, wherein the graft polymer layer comprises a polymer compound having a functional group whose hydrophilicity or hydrophobicity can be changed by application of radiation of light.

18. A method of forming an electroconductive pattern, comprising:

forming a polymerization initiation layer on a support, the polymerization initiation layer comprising a copolymer that comprises a copolymer component A having a functional group having the ability to initiate polymerization in an amount of 1-40% by mole and a copolymer component B having a cross-linking group in an amount of 20-70% by mole, wherein the copolymer is fixed by a cross-linking reaction to form the polymerization initiation layer;

pattern-wise forming a graft polymer layer on a surface of the polymerization initiation layer;

adding a metal ion or a metal salt to the graft polymer layer; and thereafter reducing the metal ion or a metal ion in the metal salt to form a metal particle dispersion region; and heating, to a temperature of 100° C. to 400° C., a patterned material that forms the metal particle dispersion region.

19. A method of forming an electroconductive pattern of claim 18, wherein the temperature of the heating is from 150° C. to 400° C.

20. A method of forming an electroconductive pattern of claim 18, wherein the heating is performed for 30 to 60 minutes.

21. A method of forming an electroconductive pattern of claim 18, wherein the graft polymer layer is formed by a process including bringing a polymerizable compound having a hydrophilic group into contact with the surface of the polymerization initiation layer and pattern-wise applying light or heat.

22. A method of forming an electroconductive pattern of claim 18, wherein the graft polymer layer is formed by a process including bringing a polymerizable compound having a metal salt structure into contact with the surface of the polymerization initiation layer and pattern-wise applying light or heat.

23. A method of forming an electroconductive pattern of claim 18, wherein the graft polymer layer is formed by a process including bringing a polymerizable compound having affinity for a metal salt into contact with the surface of the polymerization initiation layer and pattern-wise applying light or heat.

* * * * *